(12) United States Patent
Inabe et al.

(10) Patent No.: US 7,157,206 B2
(45) Date of Patent: *Jan. 2, 2007

(54) POSITIVE RESIST COMPOSITION

(75) Inventors: Haruki Inabe, Shizuoka (JP); Tomoya Sasaki, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/897,122

(22) Filed: Jul. 23, 2004

(65) Prior Publication Data
US 2005/0026074 A1 Feb. 3, 2005

(30) Foreign Application Priority Data
Jul. 25, 2003 (JP) .......................... P.2003-280237

(51) Int. Cl.
G03C 1/73 (2006.01)
G03F 7/039 (2006.01)

(52) U.S. Cl. ............... 430/270.1; 430/326; 430/907; 430/914; 430/910

(58) Field of Classification Search ............. 430/270.1, 430/907, 326
See application file for complete search history.

(56) References Cited

U.S. PATENT DOCUMENTS 6,939,662 B1 * 9/2005 Mizutani et al. ......... 430/270.1
2003/0232277 A1 * 12/2003 Sasaki et al. ............ 430/270.1

FOREIGN PATENT DOCUMENTS

EP 1 319 981 A2 * 6/2003
EP 1 367 440 A2 * 12/2003
WO WO 02/33489 A2 4/2002
WO WO 02/092651 A1 11/2002

OTHER PUBLICATIONS

R. R. Kunz et al., "Outlook for 157-nm resist desig", (1999) Proc. SPIE., vol. 3678, pp. 13-23.
Dirk Schmaljoham et al., "Design Strategies for 157 nm Single-Layer Photoresists: Lithographic Evaluation of a Poly(@-trifluoromethyl vinyl alcohol) Copolymer" (2000) Proc. SPIE., vol. 3999, pp. 330-335.
Michael K. Crawford et al., "New Materials for 157 nm Photoresists: Characterization and Properties" (2000), Proc. SPIE., vol. 3999, pp. 357-363.
Patterson et al., "Polymers for nm Photoresist Applications: A Progress Report" (2000), Proc. SPIE., vol. 3999, pp. 365-374.

* cited by examiner

Primary Examiner—Sin Lee
(74) Attorney, Agent, or Firm—Sughrue Mion, PLLC

(57) ABSTRACT

A positive resist composition comprising (A) a resin containing at least one group that is decomposed by the action of an acid to generate an alkali-soluble group and (B) at least two compounds selected from (B1) a compound that generates an aliphatic or aromatic sulfonic acid substituted with at least one fluorine atom, (B2) a compound that generates an aliphatic or aromatic sulfonic acid that does not contain a fluorine atom, (B3) a compound that generates an aliphatic or aromatic carboxylic acid substituted with at least one fluorine atom and (B4) a compound that generates an aliphatic or aromatic carboxylic acid that does not contain a fluorine atom, as (B) a compound that generates an acid upon irradiation of an actinic ray or radiation, wherein the group that is decomposed by the action of an acid contained in the resin (A) includes a group represented by formula (Y) defined in the specification.

11 Claims, No Drawings

POSITIVE RESIST COMPOSITION

FIELD OF THE INVENTION

The present invention relates to a positive resist composition suitably used in microlithography processes, for example, in the production of VLSI or high capacity microchips, or in other photofabrication processes. More specifically, the invention relates to a positive resist composition capable of forming a highly precise pattern using a vacuum ultraviolet ray of not longer than 200 nm as a light source for exposure.

BACKGROUND OF THE INVENTION

The degree of integration of integrated circuits has recently become much higher, and the processing of ultra-fine patterns having a line width of a quarter micron or below is required in the production of semiconductor substrate, for example, VSLI. In order to form fine patterns, means of reducing a wavelength of exposure light source for use in the production of resist patterns is known.

For instance, in the production of semiconductor device having the degree of integration up to 64 Mbits, an i-line (365 nm) of high pressure mercury lamp has been employed as the light source. As a positive resist corresponding to the light source, a large number of compositions containing a novolak resin and a naphthoquinone diazide compound as a photosensitive substance have been developed. These compositions have achieved full success in the processing of linewidth up to about 0.3 μm. Also, in the production of semiconductor device having the degree of integration of 256 Mbits or more, a KrF excimer laser beam (248 nm) is employed as the light source in place of the i-line.

In recent years, for the purpose of the production of semiconductor device having the degree of integration of 1 Gbit or more, as a light source having shorter wavelength, the use of an ArF excimer laser beam (193 nm) and further, the use of an $F_2$ excimer laser beam (157 nm) in order to form a pattern of not more than 0.1 μm have been investigated.

In response to such a trend of using light source having a shorter wavelength, constituent components of the resist materials and structure of compounds used for the constituent components have been greatly changed.

As the resist composition for exposure using a KrF excimer laser beam, a composition in which a resin including a basic skeleton of poly (hydroxystyrene) that has a small absorption in the region of around 248 nm and being protected by an acid-decomposable group is used as the main component and a compound that generates an acid upon irradiation of a far ultraviolet ray (a photo-acid generator) is used in combination, that is, a so-called chemical amplification resist has been developed.

Further, as the resist composition for exposure using a ArF excimer laser beam (193 nm), a chemical amplification resist using a resin having an alicyclic structure, which do not have an absorption at 193 nm, introduced into the main chain or side chain has been developed.

It has been found in case of using an $F_2$ excimer laser beam (157 nm), however, that since the above-described alicyclic group-containing resin still has a large absorption in the region of around 157 nm, it is insufficient for obtaining the desired pattern of not more than 0.1 μm. In the circumstances, it is reported that a resin having a fluorine atom (a perfluoro structure) introduced therein has sufficient transparency in the region of around 157 nm in Non-Patent Document 1 (Proc. SPIE., Vol. 3678, Page 13 (1999)). Also, the structures of effective fluorine resins are proposed, for example, in Non-Patent Document 2 (Proc. SPIE., Vol. 3999, page 330 (2000)), Non-Patent Document 3 (Proc. SPIE., Vol. 3999, page 357 (2000)), Non-Patent Document 4 (Proc. SPIE., Vol. 3999, page 365 (2000)), Patent Document 1 (WO 02/33489) and Patent Document 2 (WO 02/092651), and resist compositions including a fluorine-containing resin have been investigated.

However, in resist compositions for $F_2$ excimer laser beam including a hitherto known fluorine-containing resin, it is necessary to increase a fluorine content in the resin in order to increase transparency. However, as the increase in the fluorine content in the resin, the resist film formed becomes water-repellent and as a result, development defect and scum (development residue) tend to occur.

Further, with respect to conventional resist compositions for $F_2$ excimer laser beam, there is room for improvement in defocus latitude. Specifically, when the resolution of lithography comes close to the limit in accordance with the miniaturization of processing size of pattern, it is difficult to ensure sufficient defocus latitude. Thus, a resist having a broad defocus latitude has been desired. The term "resist having a broad defocus latitude" means a resist in which variation of linewidth based on the defocus is small.

Non-Patent Document 1: Proc. SPIE., Vol. 3678, Page 13 (1999)

Non-Patent Document 2: Proc. SPIE., Vol. 3999, page 330 (2000)

Non-Patent Document 3: Proc. SPIE., Vol. 3999, page 357 (2000)

Non-Patent Document 4: Proc. SPIE., Vol. 3999, page 365 (2000)

Patent Document 1: WO 02/33489

Patent Document 2: WO 02/92651

SUMMARY OF THE INVENTION

Therefore, an object of the present invention is to provide a positive resist composition suitable for using an exposure light source having a wavelength of not more than 200 nm, particularly an $F_2$ excimer laser beam (157 nm).

Another object of the invention is to provide a positive resist composition in which the problems of the occurrence of development defect and of the occurrence of scum are resolved.

A further object of the present invention is to provide a positive resist composition, which is excellent in the defocus latitude.

Other objects of the present invention will become apparent from the following description.

As a result of the intensive investigations on the above-described performances of positive resist composition, it has been found that the objects of the invention are accomplished by using the specific composition described below to complete the invention.

Specifically, the invention has the following configuration.

(1) A positive resist composition comprising (A) a resin containing at least one group that is decomposed by the action of an acid to generate an alkali-soluble group and (B) at least two compounds selected from (B1) a compound that generates an aliphatic or aromatic sulfonic acid substituted with at least one fluorine atom, (B2) a compound that generates an aliphatic or aromatic sulfonic acid that does not contain a fluorine atom, (B3) a compound that generates an aliphatic or aromatic carboxylic acid substituted with at least one fluorine atom and (B4) a compound that generates an aliphatic or aromatic carboxylic acid that does not contain a fluorine atom, as (B) a compound that generates an acid upon irradiation of an actinic ray or radiation, wherein the group that is decomposed by the action of an acid contained in the resin (A) includes a group represented by the following formula (Y):

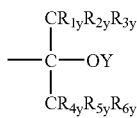

wherein $R_{1y}$ to $r_{6y}$ each independently represents a hydrogen atom, a fluorine atom, an alkyl group or a cycloalkyl group, provided that at least one of $R_{1y}$ to $r_{6y}$ represents a fluorine atom, an alkyl group substituted with a fluorine atom or a cycloalkyl group substituted with a fluorine atom; and Y represents a hydrogen atom or an organic group.

(2) The positive resist composition as described in (1) above, wherein the component of (B) contains at least one compound of (B1) and at least one compound selected from (B2) to (B4).

(3) The positive resist composition as described in (1) or (2) above, wherein the group that is decomposed by the action of an acid to generate an alkali-soluble group is a group represented by any one of groups represented by the following formulae (Z1) to (Z5):

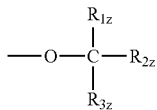

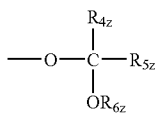

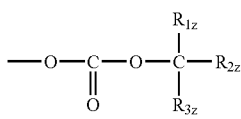

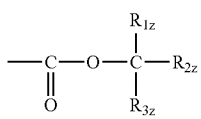

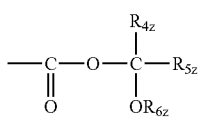

wherein $R_{1z}$ to $R_{3z}$ each independently represents an alkyl group, a cycloalkyl group, an alkenyl group, an aralkyl group or an aryl group; $R_{4z}$ and $r_{5z}$ each independently represents a hydrogen atom or an alkyl group; $R_{6z}$ represents an alkyl group, a cycloalkyl group, an alkenyl group, an aralkyl group or an aryl group; two of $R_{1z}$, $R_{2z}$ and $R_{3z}$ or two of $R_{4z}$, $R_{5z}$ and $R_{6z}$ may be combined with each other to form a cyclic structure; and at least one of $R_{1z}$, $R_{2z}$ and $R_{3z}$ or at least one of $R_{4z}$, $R_{5z}$ and $R_{6z}$ contains at least one of the groups represented by Y as a substituent.

(4) The positive resist composition as described in (3) above, wherein a carbon atom in the resin, to which the group represented by any one of formulae (Z1) to (Z5) is directly connected, is substituted with a fluorine atom, an alkyl group substituted with a fluorine atom or a cycloalkyl group substituted with a fluorine atom.

(5) The positive resist composition as described in (3) or (4) above, wherein at least one of $R_{1z}$, $R_{2z}$ and $R_{3z}$ in any one of formulae (Z1), (Z3) and (Z4) or at least one of $R_{4z}$, $R_{5z}$ and $R_{6z}$ in any one of formulae (Z2) and (Z5) is a cycloalkyl group.

(6) The positive resist composition as described in (3) or (4) above, wherein two of $R_{1z}$, $R_{2z}$ and $R_{3z}$ in any one of formulae (Z1), (Z3) and (Z4) or two of $R_{4z}$, $R_{5z}$ and $R_{6z}$ in any one of formulae (Z2) and (Z5) are combined with each other to form a cyclic structure.

The present invention also includes the following preferred embodiments.

(7) The positive resist composition as described in (5) or (6) above, wherein the cycloalkyl group represented by any one of $R_{1z}$ to $R_{6z}$, or the cyclic structure formed by connecting two of $R_{1z}$, $R_{2z}$ and $R_{3z}$ in any one of formulae (Z1), (Z3) and (Z4) or two of $R_{4z}$, $R_{5z}$ and $R_{6z}$ in any one of formulae (Z2) and (Z5) is a cyclohexane structure, a bicyclo[2.2.1]heptane structure or a bicyclo[2.2.2]octane structure.

(8) The positive resist composition as described in (3) above, wherein a repeating unit containing the group represented by any one of formulae (Z1) to (Z5) is a repeating unit represented by the following formula (Za), (Zb), (Zc), (Zd) or (Ze):

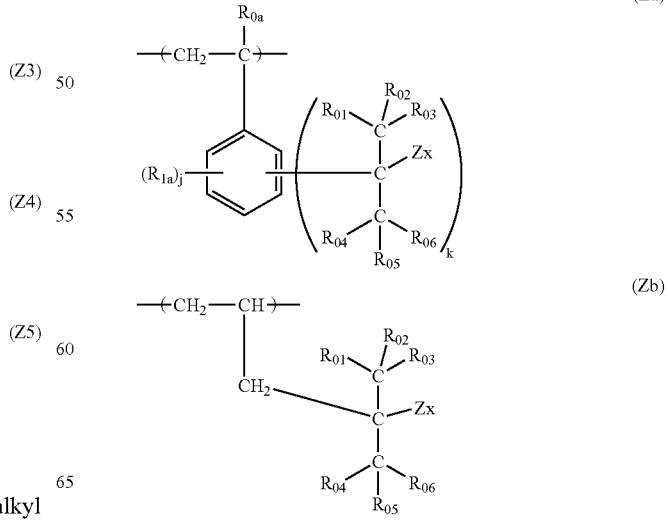

-continued

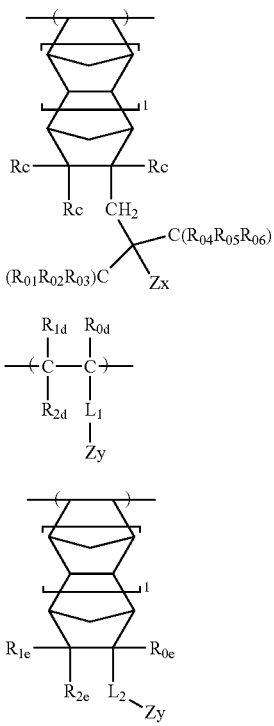

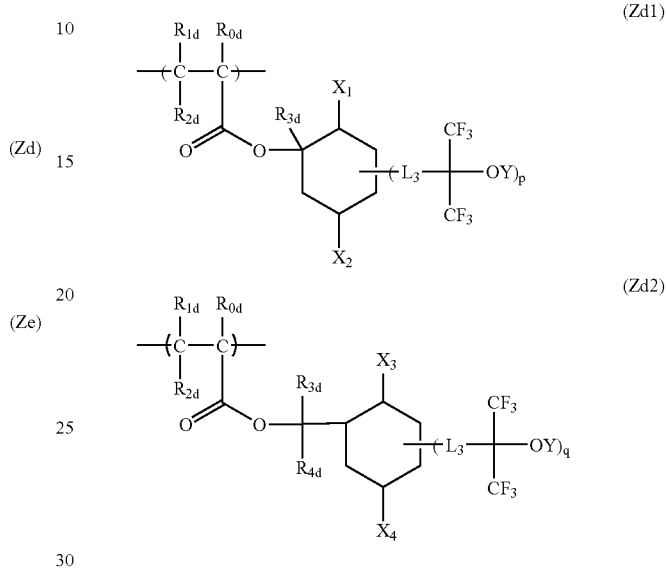

wherein Zx represents a group represented by any one of formulae (Z1) to (Z3); Zy represents a group represented by any one of formulae (Z4) to (Z5);

in formula (Za), $R_{0a}$ represents a hydrogen atom, a halogen atom, a cyano group, an alkyl group or a cycloalkyl group; $R_{01}$ to $R_{06}$ each independently represents a hydrogen atom, a fluorine atom, an alkyl group or a cycloalkyl group, provided that at least one of $R_{01}$ to $r_{06}$ represents a fluorine atom, an alkyl group substituted with a fluorine atom or a cycloalkyl group substituted with a fluorine atom; $R_{1a}$ represents a hydroxy group, a halogen atom, a cyano group, an alkoxy group, an acyl group, an alkyl group, a cycloalkyl group, an alkenyl group, an aralkyl group or an aryl group; j represents an integer of from 0 to 4; k represents an integer of from 1 to 5, provided that the sum total of j and k is 1 to 5;

in formula (Zb), $R_{01}$ to $R_{06}$ have the same meanings as $R_{01}$ to $R_{06}$ in formula (Za) respectively;

in formula (Zc), $R_{01}$ to $R_{06}$ have the same meanings as $R_{01}$ to $R_6$ in formula (Za) respectively; 1 represents 0 or 1; $R_c$s each independently represents a hydrogen atom, a halogen atom, a cyano group, an alkyl group or a cycloalkyl group;

in formula (Zd), $R_{0d}$ to $R_{2d}$ each independently represents a hydrogen atom, a fluorine atom, a chlorine atom, a cyano group, an alkyl group substituted with a fluorine atom or a cycloalkyl group substituted with a fluorine atom; $L_1$ represents a single bond or a divalent connecting group; and in formula (Ze), $R_{0e}$ to $R_{2e}$ each independently represents a hydrogen atom, a halogen atom, a cyano group, an alkyl group or a cycloalkyl group; $L_2$ represents a single bond or a divalent connecting group; and 1 represents 0 or 1.

(9) The positive resist composition as described in (3) above, wherein a repeating unit containing the group represented by formulae (Z4) or (Z5) is a repeating unit represented by the following formula (Zd1) or (Zd2):

wherein $R_{0d}$ to $R_{2d}$ each independently represents a hydrogen atom, a fluorine atom, a chlorine atom, a cyano group, an alkyl group substituted with a fluorine atom or a cycloalkyl group substituted with a fluorine atom; $R_{3d}$ and $R_{4d}$ each independently represents an alkyl group, a cycloalkyl group, an alkenyl group, an aralkyl group or an aryl group; Y represents a hydrogen atom or an organic group; $L_3$ represents a single bond or a divalent connecting group; $X_1$ and $X_2$ each independently represents a hydrogen atom, a halogen atom, a hydroxy group, an alkoxy group, a cyano group, an alkyl group or a cycloalkyl group; or $X_1$ and $X_2$ may be combined with each other to form —$CH_2$—, —$C_2H_4$— or —O—; $X_3$ and $X_4$ each independently represents a hydrogen atom, a halogen atom, a hydroxy group, an alkoxy group, a cyano group, an alkyl group or a cycloalkyl group; or $X_3$ and $X_4$ may be combined with each other to form —$CH_2$—, —$C_2H_4$— or —O—; and p and q each represents an integer of from 1 to 3.

(10) The positive resist composition as described in (9) above, wherein $X_1$ and $X_2$ in formula (Zd1) or $X_3$ and $X_4$ in formula (Zd2) are combined with each other to form —$CH_2$—.

(11) The positive resist composition as described in any one of (1) to (10) above, which further comprises (E) an organic basic compound.

DETAILED DESCRIPTION OF THE INVENTION

According to the present invention, a positive resist composition suitable for using an exposure light source having a wavelength of not more than 200 nm, particularly an $F_2$ excimer laser beam (157 nm) can be provided. More specifically, a positive resist composition, which is prevented from the occurrence of development defect and the occurrence of scum and is excellent in the defocus latitude, can be provided.

The positive resist composition of the invention will be described in detail below.

With respect to the description of a group (atomic group) in the specification, the term "group", which is not particularly referred to whether it is substituted or not, means and includes both unsubstituted and substituted groups. For instance, the description of an "alkyl group" means and includes an alkyl group hiving no substituent (unsubstituted alkyl group) and an alkyl group having a substituent (substituted alkyl group).

[1] (A) Acid-decomposable Resin

The resin (A) for use in the positive resist composition of the invention is a resin (acid-decomposable resin) containing at least one group that is decomposed by the action of an acid to generate an alkali-soluble group. The group decomposable by the action of an acid is characterized by containing a group represented by formula (Y) shown below, which is included in a group to be released, when the group decomposable by the action of an acid is decomposed.

wherein $R_{1y}$ to $r_{6y}$ each independently represents a hydrogen atom, a fluorine atom, an alkyl group or a cycloalkyl group, provided that at least one of $R_{1y}$ to $r_{6y}$ represents a fluorine atom, an alkyl group substituted with a fluorine atom or a cycloalkyl group substituted with a fluorine atom; and Y represents a hydrogen atom or an organic group.

The alkali-soluble group includes, for example, a hydroxy group, a carboxy group and a sulfonic acid group.

The group that is decomposed by the action of an acid to generate an alkali-soluble group is a group comprising a group that is decomposed to be released from the resin by the action of an acid generated from the component (B) described hereinafter and a part forming an alkali-soluble group. An example of the group is illustrated below, but the invention should not be construed as being limited thereto.

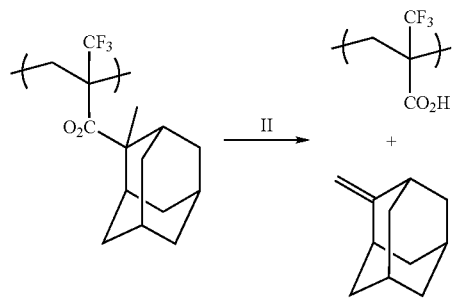

-continued

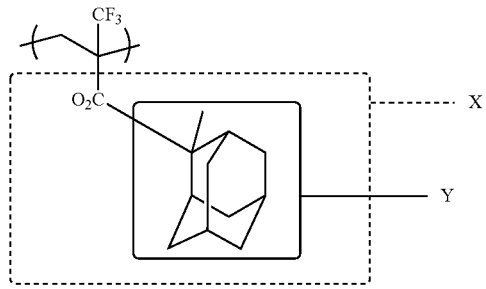

X: Group that is decomposed by the action of an acid to generate an alkali-soluble group
Y: Group that is decomposed to be released by the action of an acid In the example, the 2-methyl adamantane ester structure encircled with the dotted line is the group that is decomposed by the action of an acid to generate an alkali-soluble group, the 2-methyl adamantyl group encircled with the solid line is the group that is decomposed to be released by the action of an acid and —$CO_2H$ is the alkali-soluble group.

The alkyl group represented by any one of $R_{1y}$ to $r_{6y}$ is a straight chain or branched alkyl group, which may have a substituent, and preferably includes an alkyl group having from 1 to 8 carbon atoms, specifically, for example, methyl, ethyl propyl, n-butyl, sec-butyl, tert-butyl, hexyl, 2-ethylhexyl and octyl groups. Examples of the substituent include a hydroxy group, an alkoxy group, a halogen atom and a cyano group. The alkyl group is preferably an alkyl group having a fluorine atom as the substituent (hereinafter also referred to as an alkyl group substituted with a fluorine atom or a fluoroalkyl group).

The fluoroalkyl group represented by any one of $R_{1y}$ to $r_{6y}$ is an alkyl group in which at least one of the hydrogen atoms is substituted with a fluorine atom and includes a straight chain or branched alkyl group substituted with a fluorine atom in any position. The fluoroalkyl group may include —O— in the chain thereof.

The fluoroalkyl group may have a substituent and preferably includes 1 to 8 carbon atoms. Examples of the fluoroalkyl group include monofluoromethyl, difluoromethyl, trifluoromethyl, 2,2,2-trifluoroethyl, pentafluoroethyl, 2,2,3,3,3-pentafluoropropyl, heptafluoropropyl, 2,2,3,3,4,4,4-heptafluorobutyl, nonafluorobutyl, perfluorohexyl and 1H-1H-perfluoroheptyl groups. Examples of the substituent for the fluoroalkyl group include a hydroxy group, an alkoxy group, a halogen atom and a cyano group.

The cycloalkyl group represented by any one of $R_{1y}$ to $r_{6y}$ may have a substituent and may be nonocyclic or polycyclic. Examples of the substituent include a hydroxy group, an alkyl group, an alkoxy group, a halogen atom and a cyano group. The monocyclic cycloalkyl group preferably includes 3 to 8 carbon atoms, for example, cyclopropyl, cyclopentyl, cyclohexyl, cycloheptyl or cyclooctyl group. The polycyclic cycloalkyl group preferably includes 6 to 20 carbon atoms, for example, adamantyl, norbornyl, isobornyl, camphanyl, dicyclopentyl, α-pinenyl, tricyclodecanyl, tetracyclododecyl or androstanyl group. The carbon atoms in the monocyclic or polycyclic cycloalkyl group may be partially replaced with a hetero atom, for example, an oxygen atom. Of the substituents for the cycloalkyl group, a fluorine atom is preferred. Examples of the cycloalkyl group substituted with a fluorine atom (a cycloalkyl group in which at least one of the hydrogen atoms is substituted with a fluorine atom) include perfluorocyclopropyl, perfluorocyclopentyl, perfluorocyclohexyl, perfluorocycloheptyl and perfluorocyclooctyl groups.

The organic group represented by Y may be acid-decomposable or acid-undecomposable and preferably includes 1 to 30 carbon atoms.

The acid-decomposable organic group includes, for example, —C($R_{11a}$)($R_{12a}$)($R_{13a}$), —C($R_{14a}$)($R_{15a}$)(O$R_{16a}$) and —COO—C($R_{11a}$)($R_{12a}$)($R_{13a}$).

$R_{11a}$ to $R_{13a}$ and $R_{16a}$ each individually represent an alkyl group which may have a substituent, a cycloalkyl group which may have a substituent, an alkenyl group which may have a substituent, an aralkyl group which may have a substituent or an aryl group which may have a substituent.

$R_{14a}$ and $R_{15a}$ each individually represent a hydrogen atom or an alkyl group which may have a substituent.

Two of $R_{11a}$, $R_{12a}$ and $R_{13a}$ or two of $R_{14a}$, $R_{15a}$ and $R_{16a}$ may be connected with each other to form a ring.

The alkyl group represented by any one of $R_{11a}$, $R_{12a}$, $R_{13a}$, $R_{14a}$, $R_{15a}$ and $R_{16a}$ is preferably an alkyl group having from 1 to 8 carbon atoms, for example, methyl, ethyl, propyl, n-butyl, sec-butyl, hexyl, 2-ethylhexyl and octyl groups.

The cycloalkyl group represented by any one of $R_{11a}$ to $R_{13a}$ and $R_{16a}$ may be monocyclic or polycyclic. The monocyclic cycloalkyl group is preferably a cycloalkyl group having from 3 to 8 carbon atoms, for example, cyclopropyl, cyclopentyl, cyclohexyl, cycloheptyl and cyclooctyl groups. The polycyclic cycloalkyl group is preferably a cycloalkyl group having from 6 to 20 carbon atoms, for example, adamantyl, norbornyl, isobornyl, camphanyl, dicyclopentyl, α-pinenyl, tricyclodecanyl, tetracyclododecyl and androstanyl groups. The carbon atoms in the cycloalkyl group may be partially replaced with a hetero atom, for example, an oxygen atom.

The aryl group represented by any one of $R_{11a}$ to $R_{13a}$ and $R_{16a}$ is preferably an aryl group having from 6 to 10 carbon atoms, for example, phenyl, tolyl, dimethylphenyl, 2,4,6-trimethylphenyl, naphthyl, anthryl and 9,10-dimethoxyanthryl groups.

The aralkyl group represented by any one of $R_{11a}$ to $R_{13a}$ and $R_{16a}$ is preferably an aralkyl group having from 7 to 12 carbon atoms and includes, for example, benzyl, phenethyl and naphthylmethyl groups.

The alkenyl group represented by any one of $R_{11a}$ to $R_{13a}$ and $R_{16a}$ is preferably an alkenyl group having from 2 to 8 carbon atoms and includes, for example, vinyl, allyl, butenyl and cyclohexenyl groups.

The substituent for the groups represented by any one of $R_{11a}$, $R_{12a}$, $R_{13a}$, $R_{14a}$, $R_{15a}$ and $R_{16a}$ includes an alkyl group, a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group and a nitro group.

Specific preferred examples of the acid-decomposable group include a tertiary alkyl group, e.g., tert-butyl, tert-amyl, 1-alkyl-1-cyclohexyl, 2-alkyl-2-adamantyl, 2-adamantyl-2-propyl or 2-(4-methylcyclohexyl)-2-propyl group, an acetal group, e.g., 1-alkoxy-1-ethoxy, 1-alkoxy-1-methoxy or tetrahydropyranyl group, a tert-alkylcarbonyl group and a tert-alkylcarbonylmethyl group.

The acid-undecomposable organic group is an organic group that is not decomposed by the action of an acid and includes, for example, an alkyl group, an aryl group, an aralkyl group, an alkoxy group, an alkoxycarbonyl group, an amido group and a cyan group, each of which is not decomposed by the action of an acid. The alkyl group is preferably a straight chain, branched or cyclic alkyl group having from 1 to 10 carbon atoms, for example, methyl, ethyl, propyl, n-butyl, sec-butyl, hexyl, 2-ethylhexyl, octyl, cyclopropyl, cyclobutyl, cyclohexyl or adamantyl group. The aryl group is preferably an aryl group having from 6 to 14 carbon atoms, for example, phenyl, naphthyl or anthryl group. The aralkyl group is preferably an aralkyl group having front 7 to 12 carbon atoms and includes, for example, benzyl, phenethyl or cumyl group. The alkoxy group or the alkoxy group in the alkoxycarbonyl group is preferably an alkoxy group having from 1 to 5 carbon atoms, for example, methoxy, ethoxy, propoxy, n-butoxy or isobutoxy group.

The group that is decomposed by the action of an acid to generate an alkali-soluble group and includes the group represented by Y is preferably a group represented by any one of the following formulae (Z1) to (Z5):

(Z1)

(Z2)

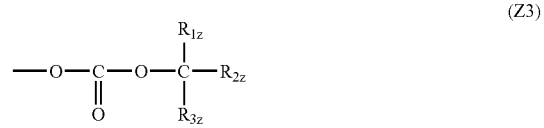

(Z3)

(Z4)

(Z5)

wherein, $R_{1z}$ to $R_{3z}$ each independently represents an alkyl group, a cycloalkyl group, an alkenyl group, an aralkyl group or an aryl group; $R_{4z}$ and $r_{5z}$ each independently represents a hydrogen atom or an alkyl group; $R_{6z}$ represents an alkyl group, a cycloalkyl group, an alkenyl group, an aralkyl group or an aryl group; two of $R_{1z}$, $R_{2z}$ and $R_{3z}$ or two of $R_{4z}$, $R_{5z}$ and $R_{6z}$ may be combined with each other to form a cyclic structure; and at least one of $R_{1z}$, $R_{2z}$ and $R_{3z}$ or at least one of $R_{4z}$, $R_{5z}$ and $R_{6z}$ contains at least one of the groups represented by Y as a substituent.

Specifically, in formula (Z1), (Z3) or (Z4), at least one of $R_{1z}$, $R_{2z}$ and $R_{3z}$ represents an alkyl group, cycloalkyl group, alkenyl group, aralkyl group or aryl group, which contains at least one of the groups represented by Y as a substituent, and in formula (Z2) or (Z5), at least one of $R_{4z}$ and $R_{5z}$ represents an alkyl group or cycloalkyl group, which contains at least one of the groups represented by Y as a substituent or $R_{6z}$ represents an alkyl group, cycloalkyl group, alkenyl group, aralkyl group or aryl group, which contains at least one of the groups represented by Y as a substituent.

The alkyl group represented by any one of $R_{1z}$ to $r_{6z}$ is a straight chain or branched alkyl group, which may have a substituent, and preferably includes an alkyl group having from 1 to 8 carbon atoms, specifically, for example, methyl, ethyl propyl, n-butyl, sec-butyl, tert-butyl, hexyl, 2-ethylhexyl and octyl groups. Examples of the substituent include a hydroxy group, an alkoxy group, a halogen atom and a cyano group. The alkyl group is preferably an alkyl group having a fluorine atom as the substituent (hereinafter also referred to as an alkyl group substituted with a fluorine atom or a fluoroalkyl group).

The fluoroalkyl group represented by any one of $R_{1z}$ to $r_{6z}$ is an alkyl group in which at least one of the hydrogen atoms is substituted with a fluorine atom and includes a straight chain or branched alkyl group substituted with a fluorine atom in any position. The fluoroalkyl group may include —O— in the chain thereof.

The fluoroalkyl group may have a substituent and preferably includes 1 to 8 carbon atoms. Examples of the fluoroalkyl group include monofluoromethyl, difluoromethyl, trifluoromethyl, 2,2,2-trifluoroethyl, pentafluoroethyl, 2,2,3,3,3-pentafluoropropyl, heptafluoropropyl, 2,2,3,3,4,4,4-heptafluorobutyl, nonafluorobutyl, perfluorohexyl and 1H-1H-perfluoroheptyl groups. Examples of the substituent for the fluoroalkyl group include a hydroxy group, an alkoxy group, a halogen atom and a cyano group.

The cycloalkyl group represented by any one of $R_{1z}$ to $R_{3z}$ and $R_{6z}$ may have a substituent and may be monocyclic or polycyclic. Examples of the substituent include a hydroxy group, an alkyl group, an alkoxy group, a halogen atom and a cyano group. The monocyclic cycloalkyl group preferably includes 3 to 8 carbon atoms, for example, cyclopropyl, cyclopentyl, cyclohexyl, cycloheptyl or cyclooctyl group. The polycyclic cycloalkyl group preferably includes 6 to 20 carbon atoms, for example, adamantyl, norbornyl, isobornyl, camphanyl, dicyclopentyl, α-pinenyl, tricyclodecanyl, tetracyclododecyl or androstanyl group. The carbon atoms in the monocyclic or polycyclic cycloalkyl group may be partially replaced with a hetero atom, for example, an oxygen atom. Of the substituents for the cycloalkyl group, a fluorine atom is preferred. Examples of the cycloalkyl group substituted with a fluorine atom (a cycloalkyl group in which at least one of the hydrogen atoms is substituted with a fluorine atom) include perfluorocyclopropyl, perfluorocyclopentyl, perfluorocyclohexyl, perfluorocycloheptyl and perfluorocyclooctyl groups.

The cyclic structure in the cycloalkyl group represented by any one of $R_{1z}$ to $R_{3z}$ and $R_{6z}$ or the cyclic structure formed by combining two of $R_{1z}$, $R_{2z}$ and $R_{3z}$ or two of $R_{4z}$, $R_{5z}$ and $R_{6z}$ includes, for example, the following structures. The number of carbon atoms of the cyclic structure is preferably not more than 9.

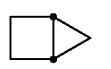

(1)

(2)

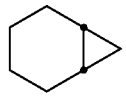

(3)

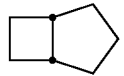

(4)

(5)

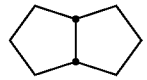

(6)

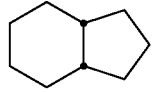

(7)

(8)

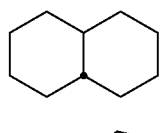

(9)

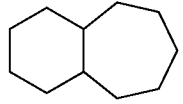

(10)

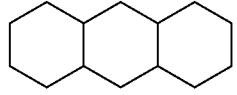

(11)

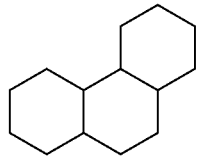

(12)

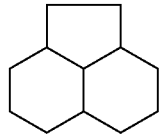

(13)

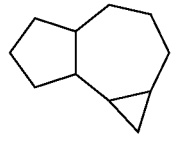

(14)

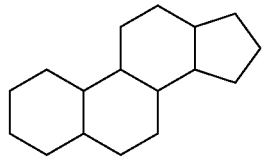

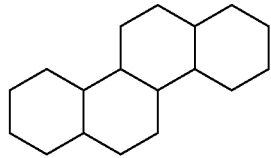

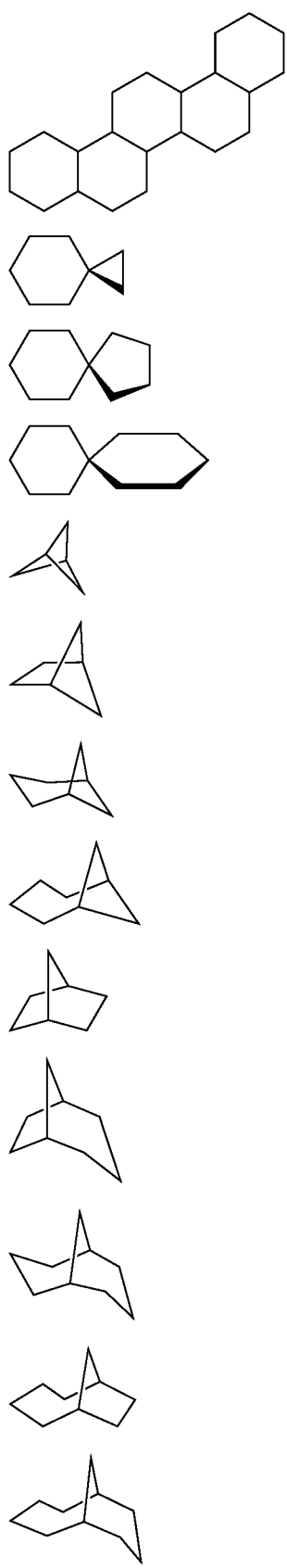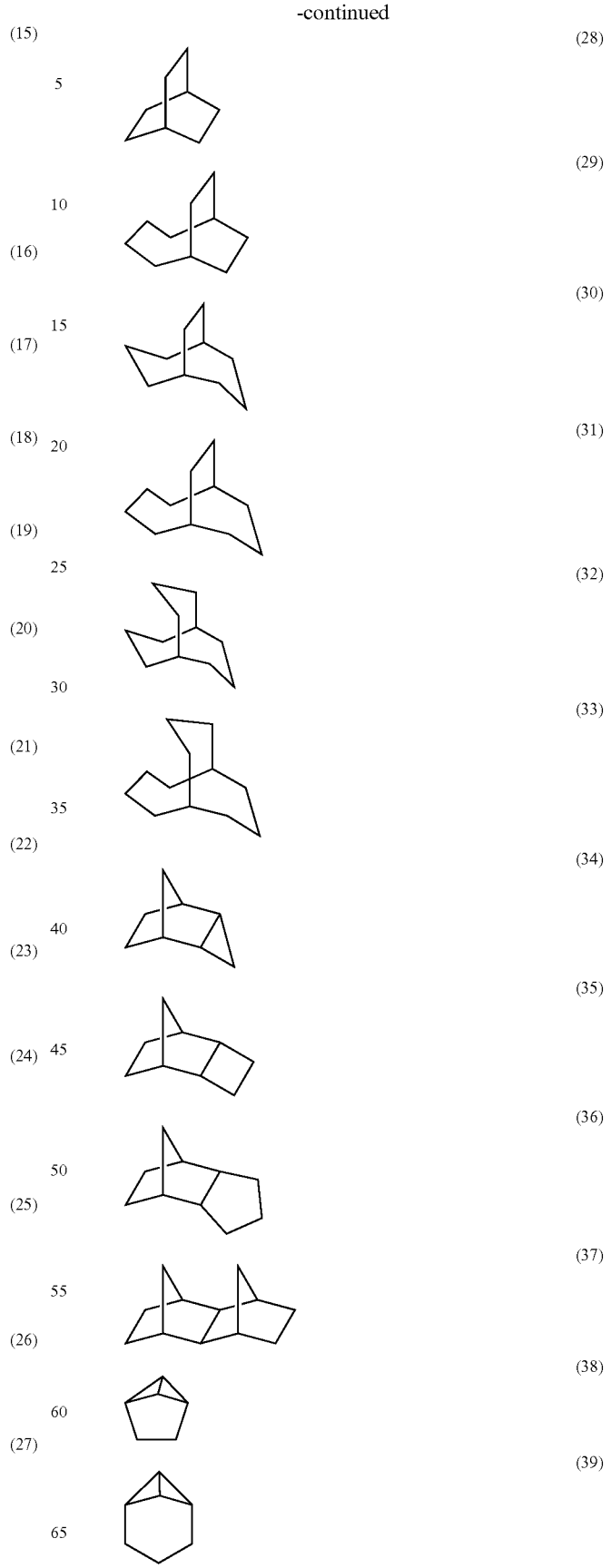

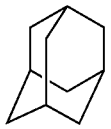
(40)

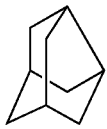
(41)

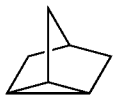
(42)

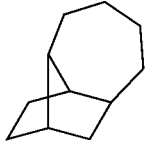
(43)

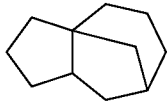
(44)

(45)

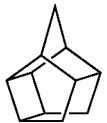
(46)

(47)

(48)

(49)

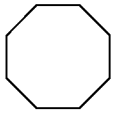
(50)

The alkenyl group represented by any one of $R_{1z}$ to $R_{3z}$ and $R_{6z}$ may have a substituent and preferably includes an alkenyl group having from 2 to 8 carbon atoms, specifically, for example, vinyl, allyl, butenyl or cyclohexenyl group.

The aralkyl group represented by any one of $R_{1z}$ to $R_{3z}$ and $R_{6z}$ may have a substituent and preferably includes an aralkyl group having from 7 to 12 carbon atoms, specifically, for example, benzyl, phenethyl or naphthylmethyl group.

The aryl group represented by any one of $R_{1z}$ to $R_{3z}$ and $R_{6z}$ may have a substituent and preferably includes an aryl group having from 6 to 15 carbon atoms, specifically, for example, phenyl, tolyl, dimethylphenyl, 2,4,6-trimethylphenyl, naphthyl, anthryl or 9,10-dimethoxyanthryl group.

The alkyl group, cycloalkyl group, alkenyl group, aralkyl group and cyclic structure may include —O—, —S—, —CO$_2$—, —CO—, —SO$_2$—, —SO— or a combination thereof in the alkylene chain thereof, respectively.

The substituent for the above-described groups includes, for example, a cycloalkyl group, an aryl group, an amino group, an amido group, a ureido group, a urethane group, a hydroxy group, a carboxy group, a halogen atom (e.g., fluorine, chlorine, bromine or iodine atom), an alkoxy group (e.g., methoxy, ethoxy, propoxy or butoxy group), a thioether group, an acyl group (e.g., acetyl, propanoyl or benzoyl group), an acyloxy group (e.g., acetoxy, propanoyloxy or benzoyloxy group), an alkoxycarbonyl group (e.g., methoxycarbonyl, ethoxycarbonyl or propoxycarbonyl group), a cyano group and a nitro group. Examples of the substituent for the cyclic structure, for example, aliphatic ring or aromatic ring included in the above-described groups also include an alkyl group.

The alkyl group, cycloalkyl group and aryl group include those described above respectively, and the alkyl group may further be substituted with a fluorine atom or a cycloalkyl group.

It is preferred that the carbon atom directly connected to the group represented by any one of formulae (Z1) to (Z5) is substituted with a fluorine atom, an alkyl group substituted with a fluorine atom or a cycloalkyl group substituted with a fluorine atom. The alkyl group substituted with a fluorine atom and cycloalkyl group substituted with a fluorine atom are same as the alkyl group substituted with a fluorine atom and cycloalkyl group substituted with a fluorine atom represented by any one of $R_{1z}$ to $R_{6z}$.

It is preferred that at least one of $R_{1z}$ to $R_{6z}$ in formulae (Z1) to (Z5) represents a cycloalkyl group, and more preferably a cycloalkyl including a cyclic structure having not more than 9 carbon atoms.

It is also preferred that two of $R_{1z}$, $R_{2z}$ and $R_{3z}$ in formulae (Z1), (Z3) and (Z4) or two of $R_{4z}$, $R_{5z}$ and $R_{6z}$ in formulae (Z2) and (Z5) are combined with each other to form a cyclic structure, and more preferably a cyclic structure having not more than 9 carbon atoms.

The cycloalkyl group or the cyclic structure is particularly preferably a cyclohexane structure, a bicyclo[2.2.1]heptane structure or a bicyclo[2.2.2]octane structure.

A repeating unit containing the group represented by any one of formulae (Z1) to (Z5) includes repeating units represented by the following formula (Za), (Zb), (Zc), (Zd) or (Ze):

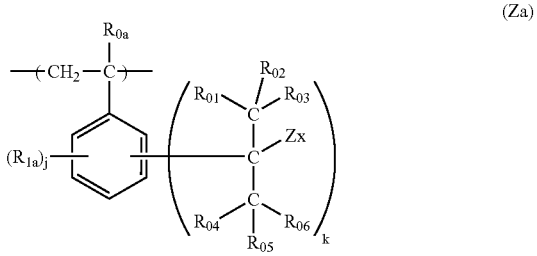
(Za)

-continued

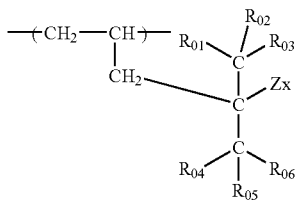
(Zb)

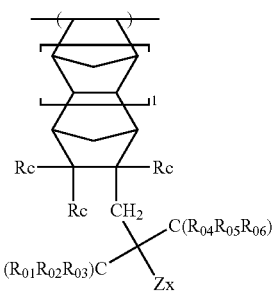
(Zc)

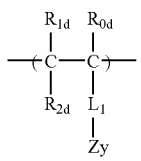
(Zd)

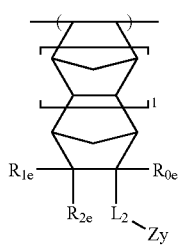
(Ze)

In the above formulae,

Zx represents a group represented by any one of formulae (Z1) to (Z3); and Zy represents a group represented by any one of formulae (Z4) to (Z5).

In formula (Za), $R_{0a}$ represents a hydrogen atom, a halogen atom, a cyano group, an alkyl group or a cycloalkyl group; $R_{01}$ to $R_{06}$ each independently represents a hydrogen atom, a fluorine atom, an alkyl group or a cycloalkyl group, provided that at least one of $R_{01}$ to $r_{06}$ represents a fluorine atom, an alkyl group substituted with a fluorine atom or a cycloalkyl group substituted with a fluorine atom; $R_{1a}$ represents a hydroxy group, a halogen atom, a cyano group, an alkoxy group, an acyl group, an alkyl group, a cycloalkyl group, an alkenyl group, an aralkyl group or an aryl group; j represents an integer of from 0 to 4; and k represents an integer of from 1 to 5; provided that the sum total of j and k is 1 to 5;

In formula (Zb), $R_{01}$ to $R_{06}$ have the same meanings as $R_{01}$ to $R_{06}$ in formula (Za) respectively;

In formula (Zc), $R_{01}$ to $R_{06}$ have the same meanings as $R_0$ to $R_{06}$ in formula (Za) respectively; 1 represents 0 or 1; and $R_c$s each independently represents a hydrogen atom, a halogen atom, a cyano group, an alkyl group or a cycloalkyl group;

In formula (Zd), $R_{0d}$ to $R_{2d}$ each independently represents a hydrogen atom, a fluorine atom, a chlorine atom, a cyano group, an alkyl group substituted with a fluorine atom or a cycloalkyl group substituted with a fluorine atom; and $L_1$ represents a single bond or a divalent connecting group.

At least one of $R_{0d}$ to $R_{2d}$ preferably represents a fluorine atom, an alkyl group substituted with a fluorine atom or a cycloalkyl group substituted with a fluorine atom, and more preferably a fluorine atom or a trifluoromethyl group. It is most preferred that $R_{0d}$ is a fluorine atom or a trifluoromethyl group.

In formula (Ze), $R_{0e}$ to $R_{2e}$ each independently represents a hydrogen atom, a halogen atom, a cyano group, an alkyl group or a cycloalkyl group; $L_2$ represents a single bond or a divalent connecting group; and 1 represents 0 or 1.

At least one of $R_{0e}$ to $R_{2c}$ preferably represents a fluorine atom, an alkyl group substituted with a fluorine atom or a cycloalkyl group substituted with a fluorine atom, and more preferably a fluorine atom or a trifluoromethyl group. It is most preferred that $R_{0e}$ is a fluorine atom or a trifluoromethyl group.

A repeating unit represented by formula (Zd) containing the group represented by formulae (Z4) or (Z5) is preferably a repeating unit represented by the following formula (Zd1) or (Zd2):

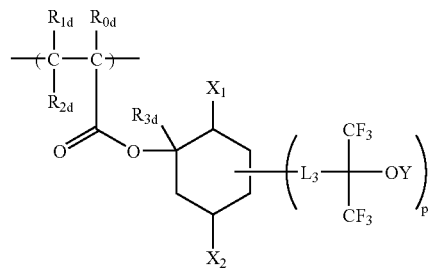
(Zd1)

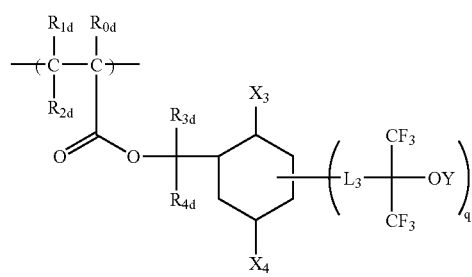
(Zd2)

In the above formulae, $R_{0d}$ to $R_{2d}$ each independently represents a hydrogen atom, a fluorine atom, a chlorine atom, a cyano group, an alkyl group substituted with a fluorine atom or a cycloalkyl group substituted with a fluorine atom; $R_{3d}$ and $R_{4d}$ each independently represents an alkyl group, a cycloalkyl group, an alkenyl group, an aralkyl group or an aryl group; Y represents a hydrogen atom or an organic group; $L_3$ represents a single bond or a divalent connecting group; $X_1$ and $X_2$ each independently represents a hydrogen atom, a halogen atom, a hydroxy group, an alkoxy group, a cyano group, an alkyl group or a cycloalkyl group; $X_1$ and $X_2$ may be combined with each other to form —$CH_2$—, —$C_2H_4$— or —O—; $X_3$ and $X_4$ each independently represents a hydrogen atom, a halogen atom, a hydroxy group, an alkoxy group, a cyano group, an alkyl group or a cycloalkyl group; $X_3$ and $X_4$ may be combined with each other to form —$CH_2$—, —$C_2H_4$— or —O—; and p and q each represents an integer of from 1 to 3.

At least one of $R_{0d}$ to $R_{2d}$ preferably represents a fluorine atom, an alkyl group substituted with a fluorine atom or a cycloalkyl group substituted with a fluorine atom, and more preferably a fluorine atom or a trifluoromethyl group. It is most preferred that $R_{0d}$ is a fluorine atom or a trifluoromethyl group.

The groups in the repeating units represented by formula (Za) to (Ze), (Zd1) and (Zd2) will be described in detail below.

The alkyl group and cycloalkyl group are same as the alkyl group and cycloalkyl group represented by any one of $R_{1z}$ to $R_{6z}$ described above.

The alkoxy group may have a substituent and preferably includes an alkoxy group having from 1 to 8 carbon atoms, specifically, for example, methoxy, ethoxy, n-propoxy, iso-propoxy, butoxy, pentoxy, allyloxy or octoxy group.

The acyl group may have a substituent and preferably includes an acyl group having from 1 to 10 carbon atoms, specifically, for example, formyl, acetyl, propanoyl, butanoyl, pivaloyl, octanoyl or benzoyl group.

The alkenyl group may have a substituent and preferably includes an alkenyl group having from 2 to 8 carbon atoms, specifically, for example, vinyl, allyl, butenyl or cyclohexenyl group.

The aralkyl group may have a substituent and preferably includes an aralkyl group having from 7 to 12 carbon atoms, specifically, for example, benzyl, phenethyl or naphthylmethyl group.

The aryl group may have a substituent and preferably includes an aryl group having from 6 to 15 carbon atoms, specifically, for example, phenyl, tolyl, dimethylphenyl, 2,4,6-trimethylphenyl, naphthyl, anthryl or 9,10-dimethoxyanthryl group.

The divalent connecting group includes, for example, an alkylene group, a cycloalkylene group, an arylene group, an ether group, a thioether group, a carbonyl group, an ester group, an amido group, a sulfonamido group, a urethane group, a urea, group and a combination thereof. The alkylene group preferably includes an alkylene group having from 1 to 8 carbon atoms, for example, methylene ethylene, propylene, butylene, hexylene or octylene group. The cycloalkylene group preferably includes a cycloalkylene group having from 5 to 15 carbon atoms, for example, cyclopentylene, cyclohexylene, norbornane residue, adamantane residue, tricyclodecane residue or tetracyclododecane residue. The arylene group preferably includes an arylene group having from 6 to 15 carbon atoms, for example, phenylene, tolylene or naphthylene group. The alkylene group, cycloalkylene group and arylene group may each have a substituent, for example, a fluorine atom.

The substituent for the above-described groups includes, for example, a cycloalkyl group, an aryl group, a group having an active hydrogen, e.g., an amino group, an amido group, a ureido group, a urethane group, a hydroxy group or a carboxy group, a halogen atom (e.g., fluorine, chlorine, bromine or iodine atom), an alkoxy group (e.g., methoxy, ethoxy, propoxy or butoxy group), a thioether group, an acyl group (e.g., acetyl, propanoyl or benzoyl group), an acyloxy group (e.g., acetoxy, propanoyloxy or benzoyloxy group), an alkoxycarbonyl group (e.g., methoxycarbonyl, ethoxycarbonyl or propoxycarbonyl group), a cyano group and a nitro group. Examples of the substituent for the cyclic structure, for example, cyclo ring or aromatic ring included in the above-described groups also include an alkyl group.

The alkyl group, cycloalkyl group and aryl group include those described above respectively, and the alkyl group may further be substituted with a fluorine atom or a cycloalkyl group.

Of the repeating units containing the group represented by any one of formulae (Z1) to (Z5), the repeating units represented by formula (Za) to (Ze) are preferred, and the repeating unit represented by formula (Zd) is more preferred. Of the repeating units represented by formula (Zd), the repeating units represented by formula (Zd1) and (Zd2) are preferred.

Specific examples of the repeating unit represented by formula (Za) are set forth below, but the invention should not be construed as being limited thereto.

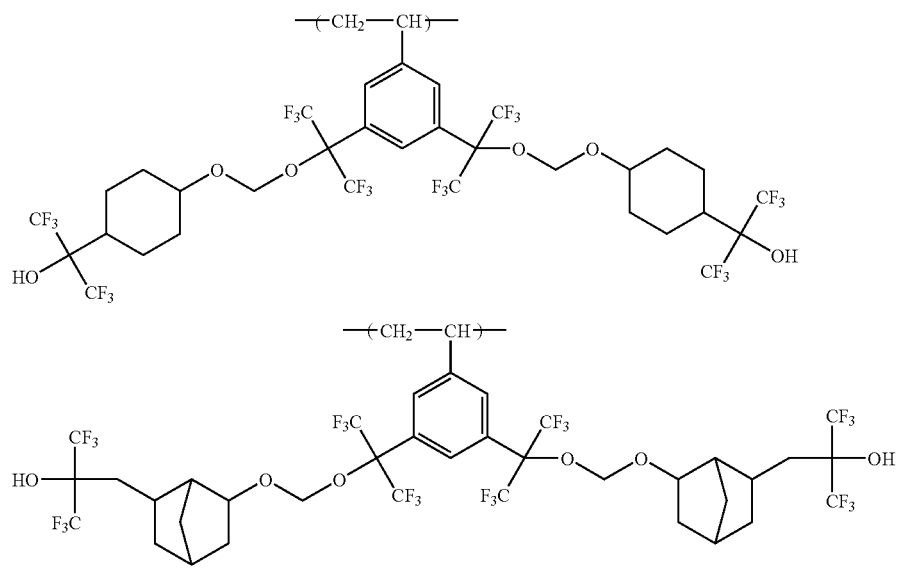

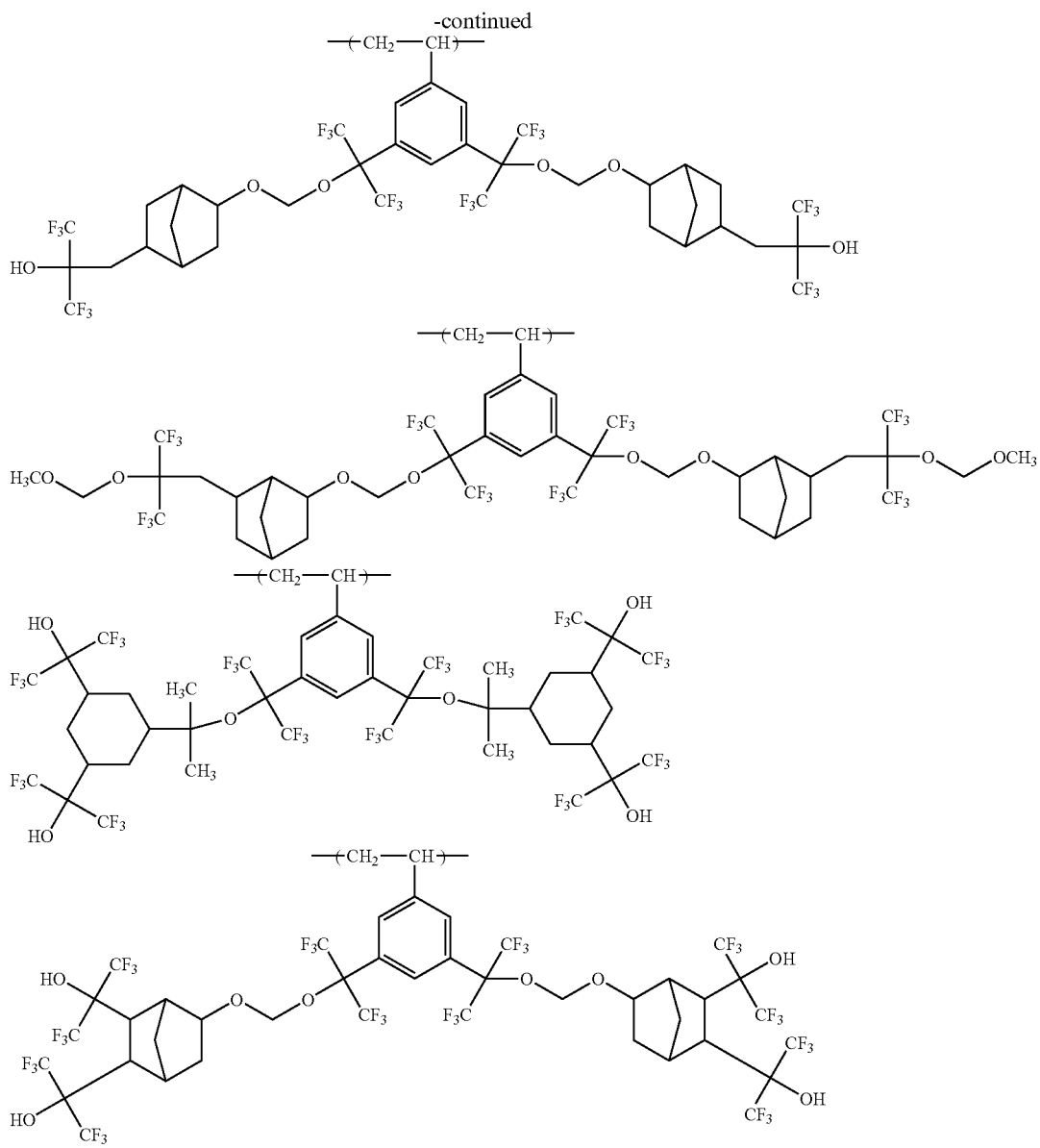
Specific examples of the repeating unit represented by formula (Zb) are set forth below, but the invention should not be construed as being limited thereto.
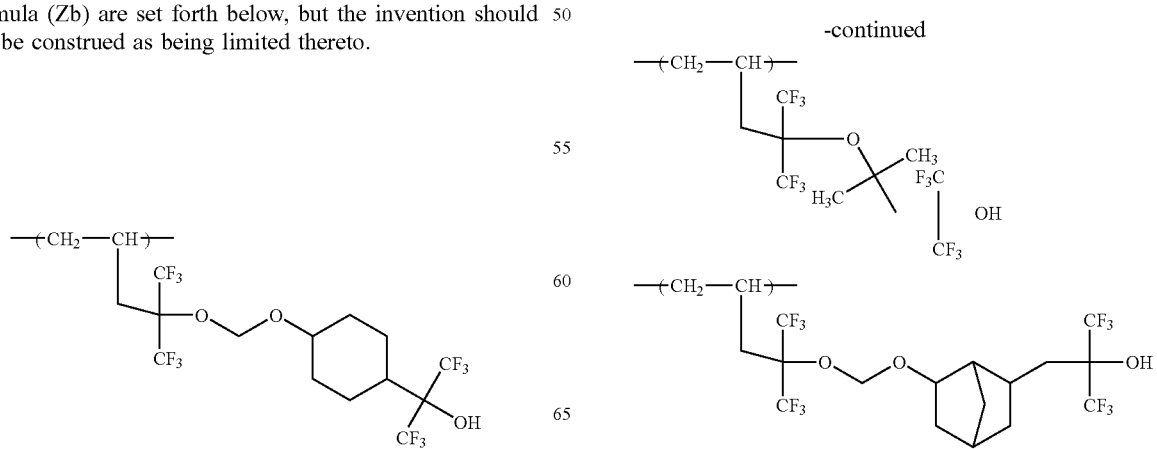

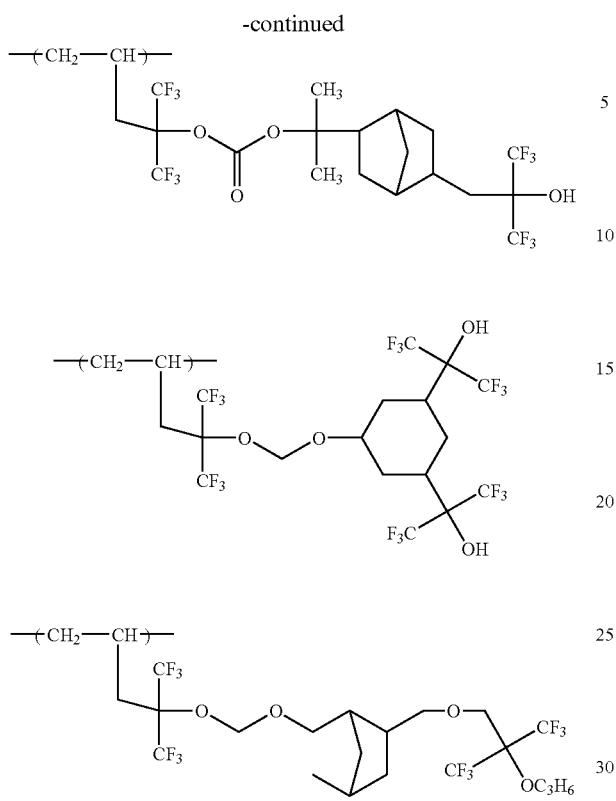
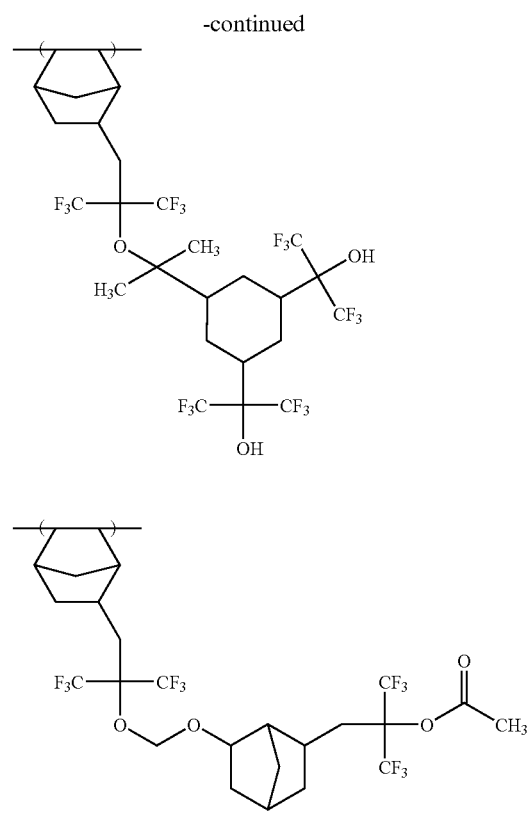
Specific examples of the repeating unit represented by formula (Zc) are set forth below, but the invention should not be construed as being limited thereto.
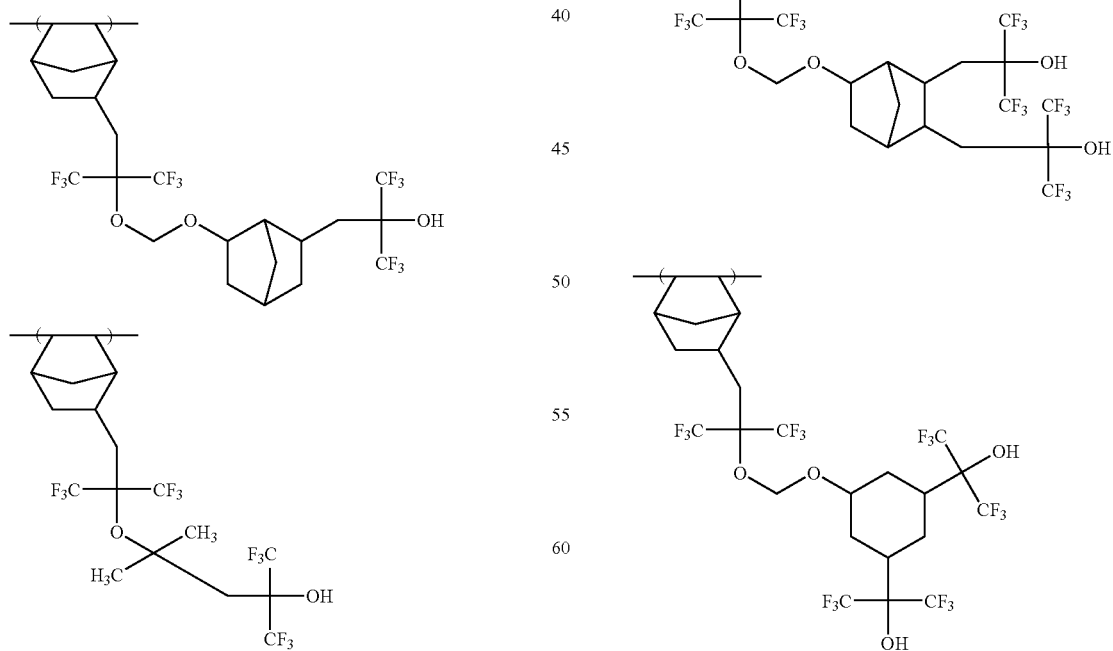

-continued
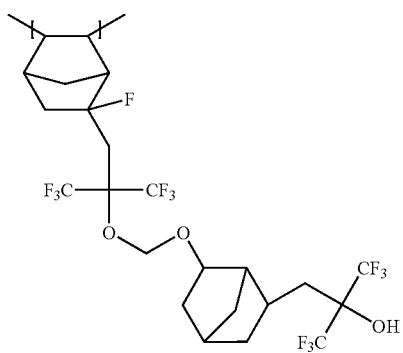
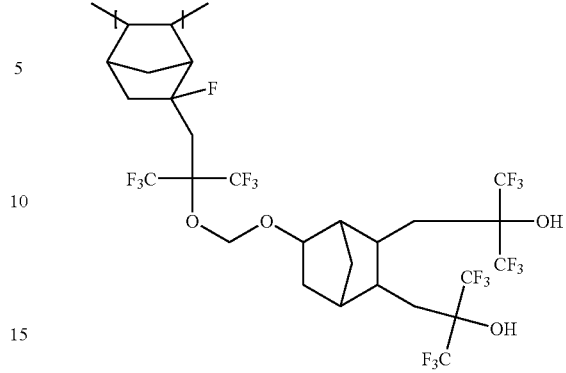
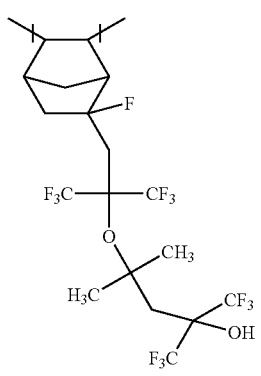
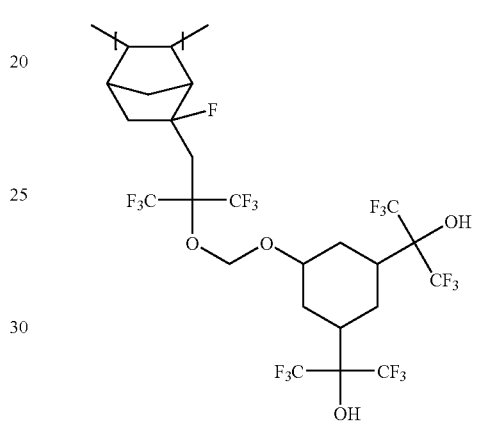
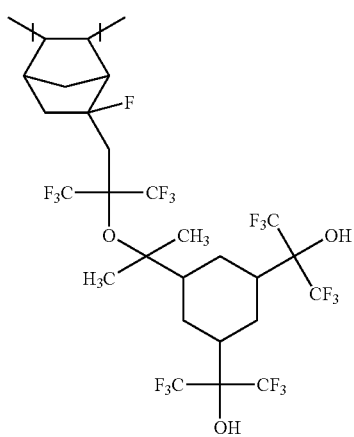
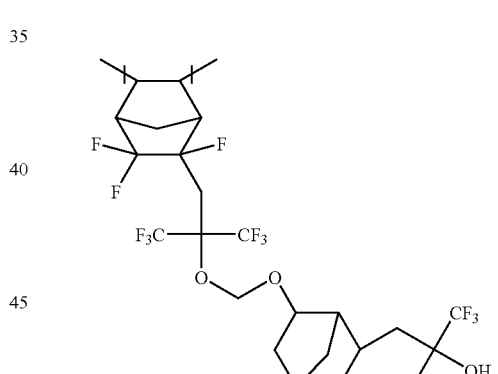
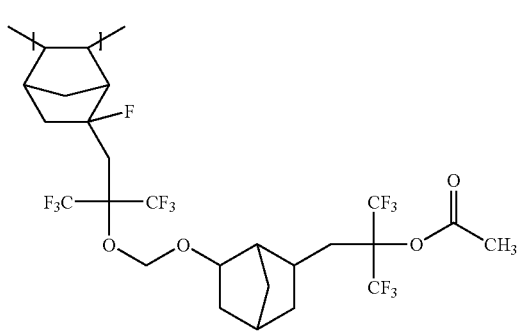
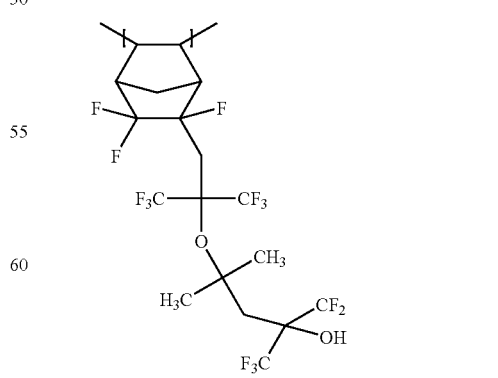

-continued
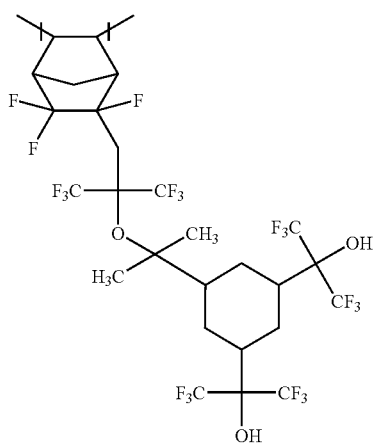
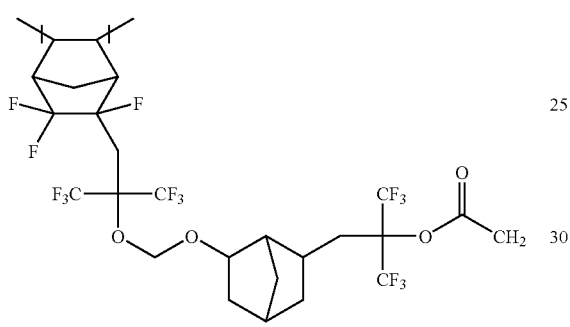
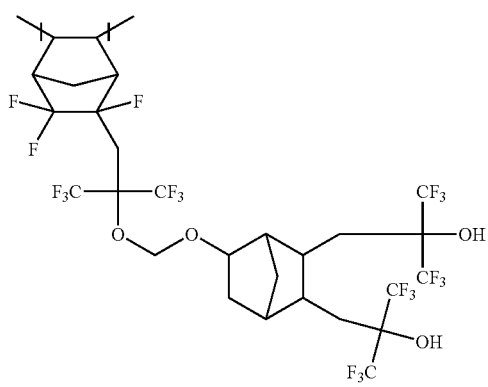
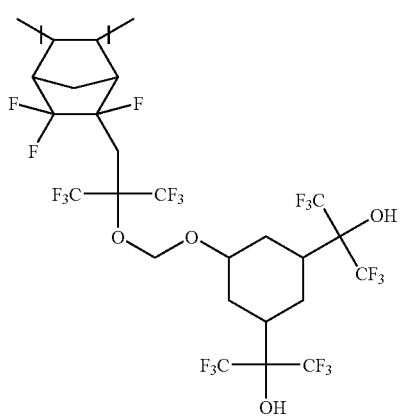
Specific examples of the repeating unit represented by formula (Zd) are set forth below, but the invention should not be construed as being limited thereto.
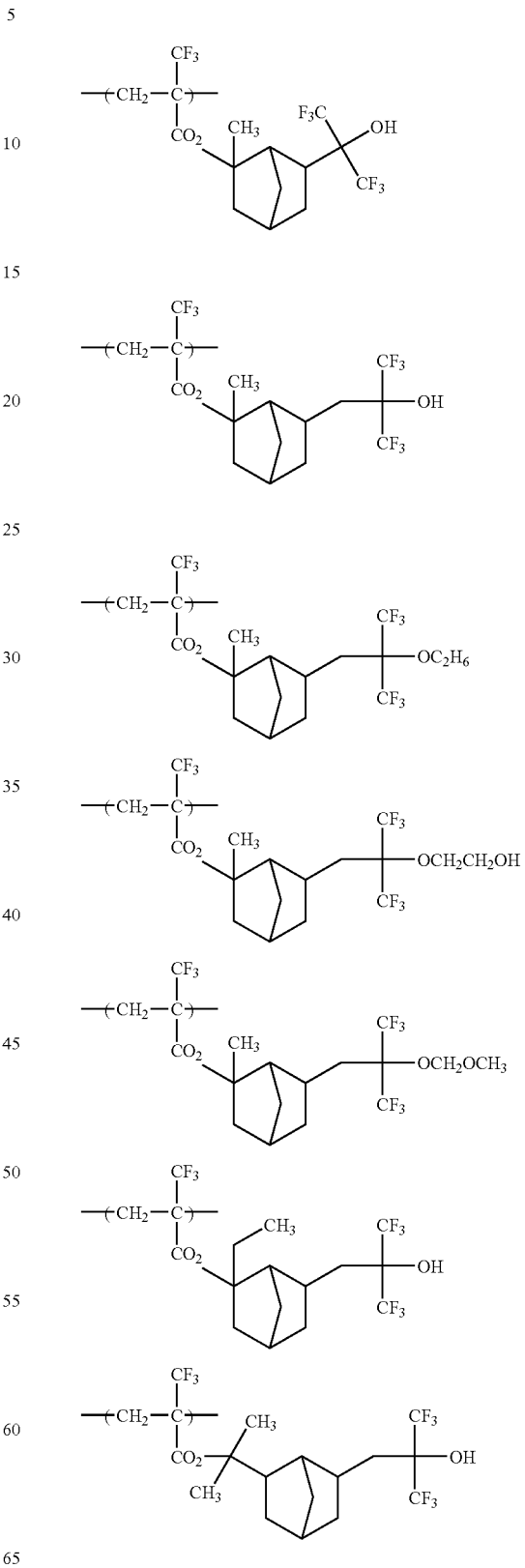

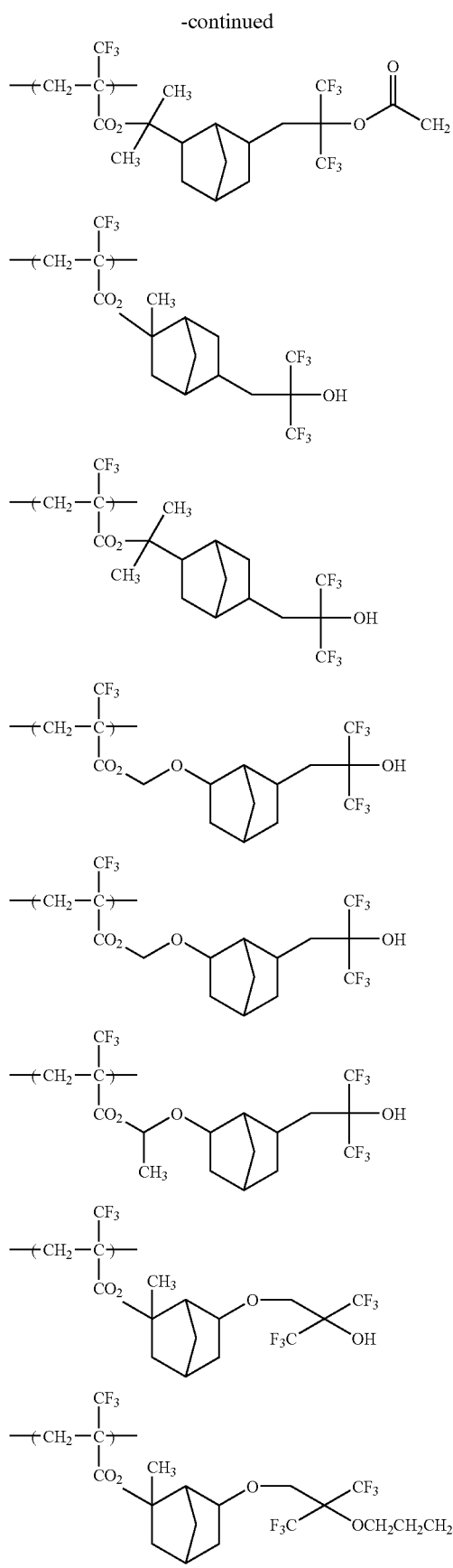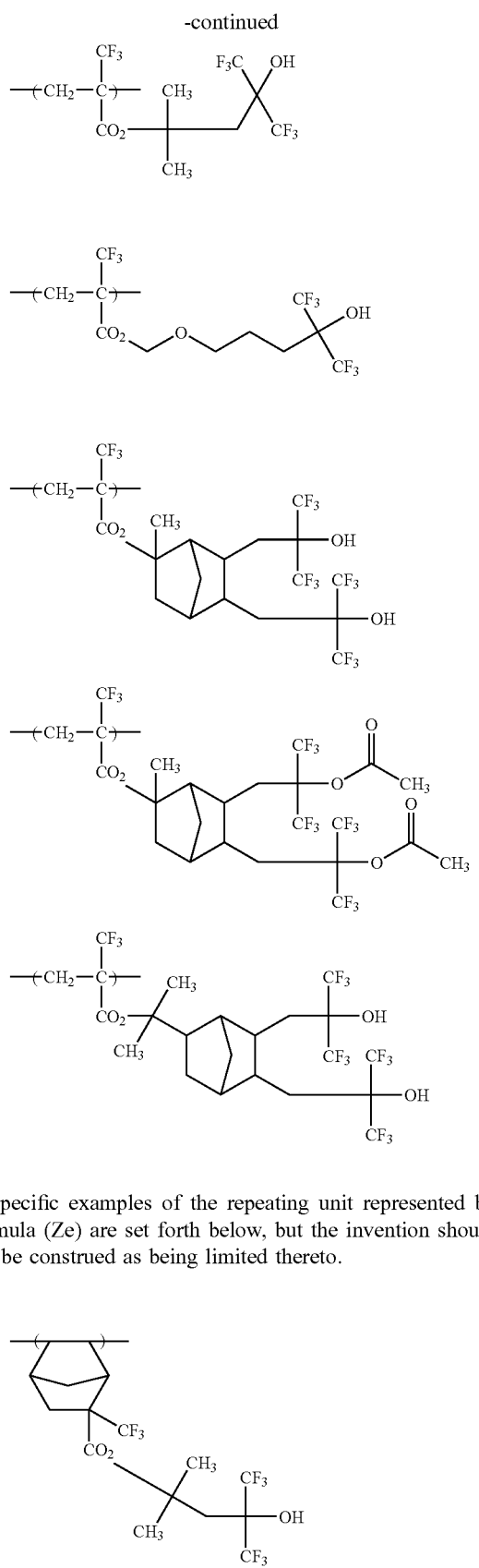
Specific examples of the repeating unit represented by formula (Ze) are set forth below, but the invention should not be construed as being limited thereto.
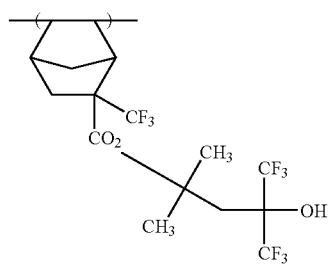

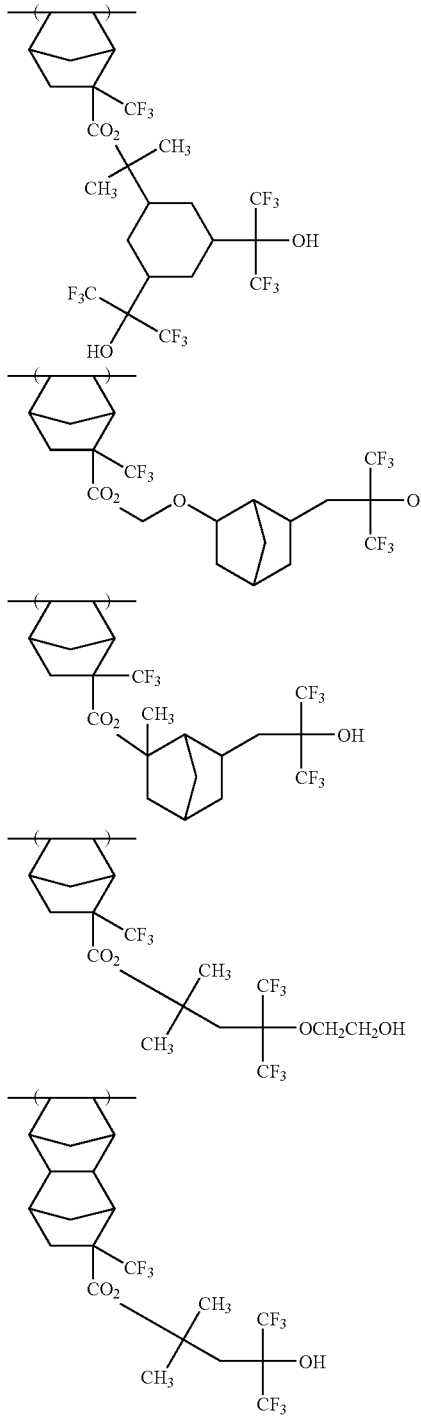

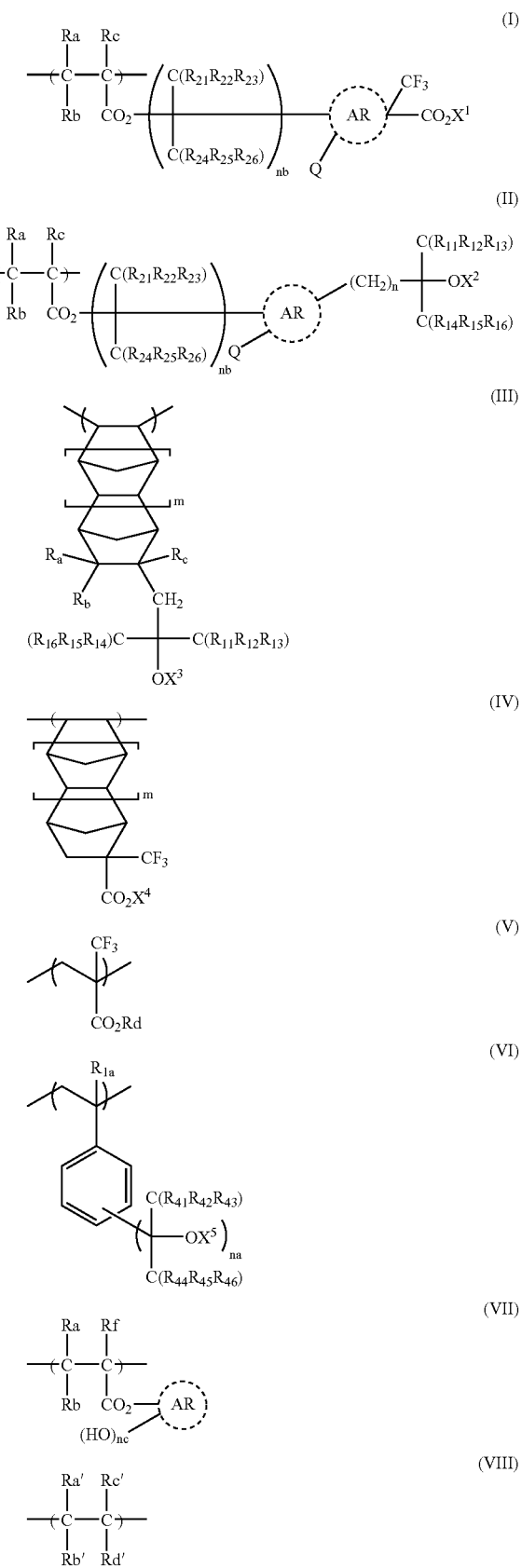

Synthesis of monomer corresponding to the repeating unit represented by any one of formulae (Za) to (Ze) can be conducted by reacting a known monomer having an alkali-soluble group with a compound having at least one of the groups represented by formula (Y) in a conventional manner.

The resin (A) more preferably contains at least one repeating unit selected from repeating units represented by formulae (I) to (VIII) shown below.

In formula (I), $X^1$ represents a hydrogen atom or a group having a group that is decomposed by the action of an acid to become soluble in an alkali developing solution. $R_a$, $R_b$ and $R_c$ each independently represent a hydrogen atom, a fluorine atom or a fluoroalkyl group. AR represents an alicyclic hydrocarbon structure. Q represents a hydrogen atom or a hydroxy group. $R_{21}$ to $R_{26}$ each independently represent a hydrogen atom, a fluorine atom or a fluoroalkyl group, provided that at least one of $R_{21}$ to $R_{26}$ is not a hydrogen atom. nb represents 0 or 1.

The group having a group that is decomposed by the action of an acid to become soluble in an alkali developing solution (hereinafter also referred to as an acid-decomposable group) represented by $X^1$ includes, for example, —C($R_{36}$)($R_{37}$)($R_{38}$), —C($R_{36}$)($R_{37}$)(O$R_{39}$), —COO—C($R_{36}$)($R_{37}$)($R_{38}$), —C($R_{01}$)($R_{02}$)(O$R_{39}$) and —C($R_{01}$)($R_{02}$)COO—C($R_{36}$)($R_{37}$)($R_{38}$).

$R_{36}$ to $R_{39}$ each independently represent an alkyl group, which may have a substituent, a cycloalkyl group, which may have a substituent, an alkenyl group, which may have a substituent, an aralkyl group, which may have a substituent or an aryl group, which may have a substituent. $R_{36}$ and $R_{39}$ may be combined with each other to from a ring.

$R_{01}$ and $R_{02}$ each independently represent a hydrogen atom, an alkyl group, which may have a substituent, a cycloalkyl group, which may have a substituent, an alkenyl group, which may have a substituent, an aralkyl group, which may have a substituent or an aryl group, which may have a substituent.

The alkyl group represented by any one of $R_{36}$ to $R_{39}$, $R_{01}$ and $R_{02}$ preferably includes an alkyl group having from 1 to 8 carbon atoms, for example, methyl, ethyl, propyl, n-butyl, sec-butyl, hexyl, 2-ethylhexyl or octyl group.

The cycloalkyl group represented by any One of $R_{36}$ to $R_{39}$, $R_{01}$ and $R_{02}$ may be monocyclic or polycyclic. The monocyclic cycloalkyl group preferably includes a cycloalkyl group having from 3 to 8 carbon atoms, for example, cyclopropyl, cyclopentyl, cyclohexyl, cycloheptyl or cyclooctyl group. The polycyclic cycloalkyl group preferably includes a cycloalkyl group having from 6 to 20 carbon atoms, for example, adamantyl, norbornyl, isobornyl, camphanyl, dicyclopentyl, α-pinenyl, tricyclodecanyl, tetracyclododecyl or androstanyl group. The carbon atoms in the monocyclic or polycyclic cycloalkyl group may be partially replaced with a hetero atom, for example, an oxygen atom.

The aryl group represented by any one of $R_{36}$ to $R_{39}$, $R_{01}$ and $R_{02}$ preferably includes an aryl group having from 6 to 10 carbon atoms, for example, phenyl, tolyl, dimethylphenyl, 2,4,6-trimethylphenyl, naphthyl, anthryl or 9,10-dimethoxyanthryl group.

The aralkyl group represented by any one of $R_{36}$ to $R_{39}$, $R_{01}$ and $R_{02}$ preferably includes an aralkyl group having from 7 to 12 carbon atoms, for example, benzyl, phenethyl or naphthylmethyl group.

The alkenyl group represented by any one of $R_{36}$ to $R_{39}$, $R_{01}$ and $R_{02}$ preferably includes an alkenyl group having from 2 to 8 carbon atoms, for example, vinyl, allyl, butenyl or cyclohexenyl group.

The substituent for the groups represented by $R_{36}$ to $R_{39}$, $R_{01}$ and $R_{02}$ includes, for example, an alkyl group, a cycloalkyl group, an aryl group, an amino group, an amido group, a ureido group, a urethane group, a hydroxy group, a carboxy group, a halogen atom, an alkoxy group, a thioether group, an acyl group, an acyloxy group, an alkoxycarbonyl group, a cyano group and a nitro group.

Specific preferred examples of the acid-decomposable group include an acetal group, e.g., 1-alkoxy-1-ethoxy, 1-alkoxy-1-methoxy or tetrahydropyranyl group, a tert-alkyloxycarbonyl group, an ethoxymethyl group, a methoxyethoxymethyl group and a tert-alkylcarbonylmethyl group.

The fluoroalkyl group represented by any one of $R_a$, $R_b$, $R_c$, and $R_{21}$ to $R_{26}$ is an alkyl group in which at least one of the hydrogen atoms is substituted with a fluorine atom and includes preferably a fluoroalkyl group having from 1 to 6 carbon atoms, more preferably a fluoroalkyl group having from 1 to 3 carbon atoms. Examples of the fluoroalkyl group include trifluoromethyl, difluoromethyl, monofluoromethyl, pentafluoroethyl, 2,2,2-trifluoroethyl, 2-fluoroethyl, 3,3,3-trifluoropropyl and 3-fluoropropyl groups. A trifluoromethyl group is particularly preferred.

The fluoroalkyl group represented by any one of $R_a$, $R_b$, $R_c$, and $R_{21}$ to $R_{26}$ may have a substituent. Examples of the substituent for the fluoroalkyl group include a chlorine atom, a bromine atom and an iodine atom.

$R_c$ is preferably a fluorine atom or a trifluromethyl group.

The alicyclic hydrocarbon structure represented by AR may be monocyclic or polycyclic. Specifically, the alicyclic hydrocarbon structure includes those having not less than 5 carbon atoms, for example, a monocyclo, bicyclo, tricyclo or tetracyclo structure. The number of carbon atoms included is preferably from 6 to 30, and particularly preferably from 7 to 25.

Preferred examples of the alicyclic hydrocarbon structure represented by AR include adamantane, noradamantane, decalin, tricyclodecane, tetracyclododecane, norbornane, cyclohexane, cycloheptane, cyclooctane, cyclodecane and cyclododecane structures. Of these structures, adamantane, norbornane and cyclohexane structures are more preferred, The alicyclic hydrocarbon structure represented by AR may further have a substituent, for example, an alkyl group or an alkoxy group.

Specific examples of the repeating unit represented by formula (I) are set forth below, but the invention should not be construed as being limited thereto.

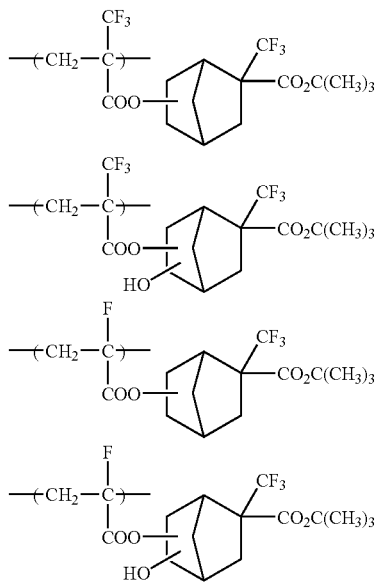

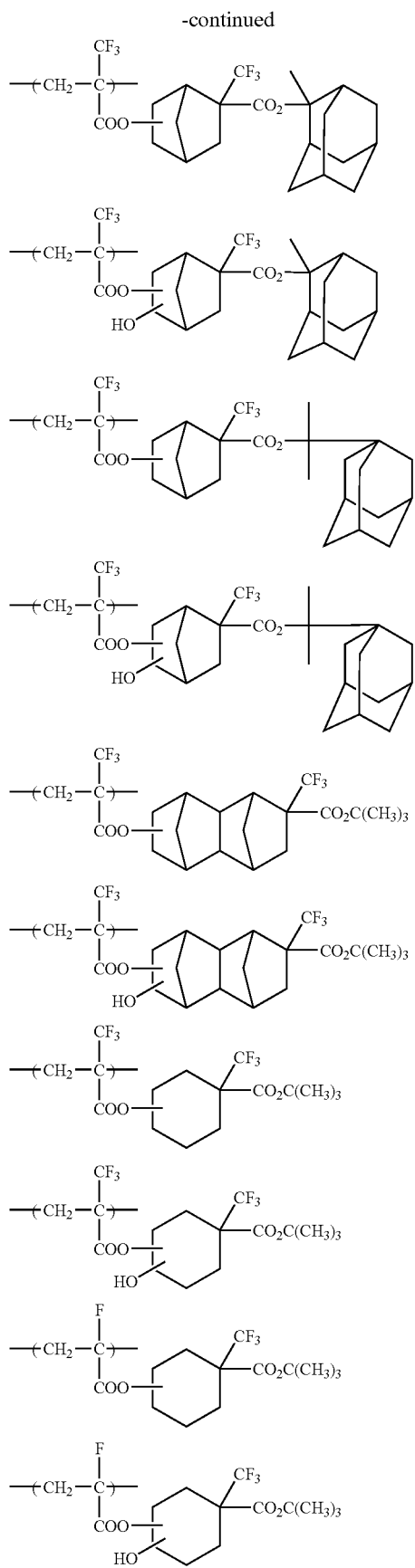
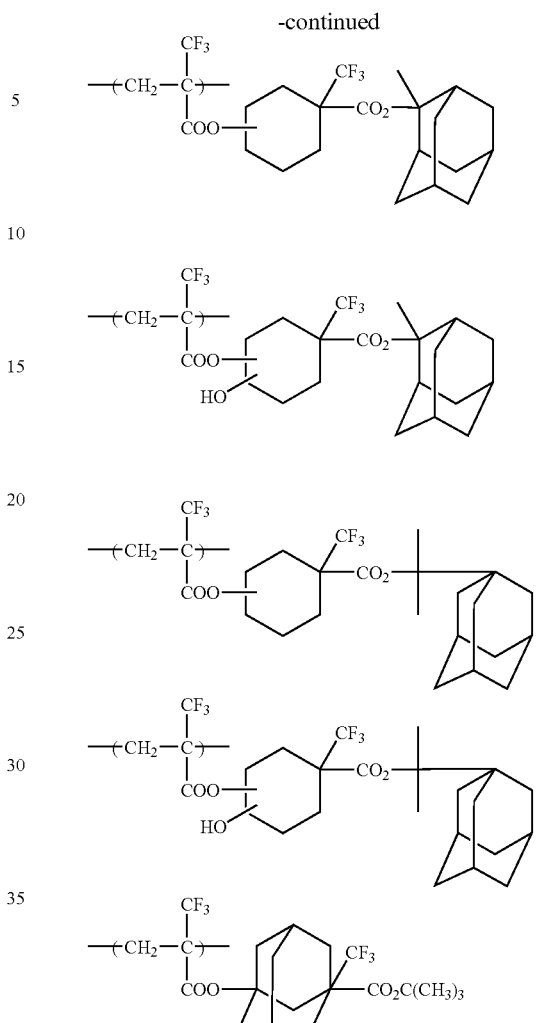

In formula (II), $R_a$, $R_b$ and $R_c$ each independently represent a hydrogen atom, a fluorine atom or a fluoroalkyl group. $R_{11}$ to $R_{16}$ each independently represent a hydrogen atom, a fluorine atom or a fluoroalkyl group, provided that at least one of $R_{11}$ to $R_{16}$ is not a hydrogen atom. $R_{21}$ to $R_{26}$ each independently represent a hydrogen atom, a fluorine atom or a fluoroalkyl group, provided that at least one of $R_{21}$ to $R_{26}$ is not a hydrogen atom. $X^2$ represents a hydrogen atom or a group having a group that is decomposed by the action of an acid to become soluble in an alkali developing solution. Q represents a hydrogen atom or a hydroxy group. AR represents an alicyclic hydrocarbon structure. n represents 0 or 1. nb represents 0 or 1.

$R_a$, $R_b$ and $R_c$ have the same meanings as $R_a$, $R_b$ and $R_c$ in formula (I), respectively.

AR has the same meaning as AR in formula (I).

$X^2$ has the same meaning as $X^1$ in formula (I).

$R_{11}$ to $R_{16}$ and $R_{21}$ to $R_{26}$ have the same meanings as $R_{21}$ to $R_{22}$ in formula (I), respectively.

Specific examples of the repeating unit represented by formula (II) are set forth below, but the invention should not be construed as being limited thereto.

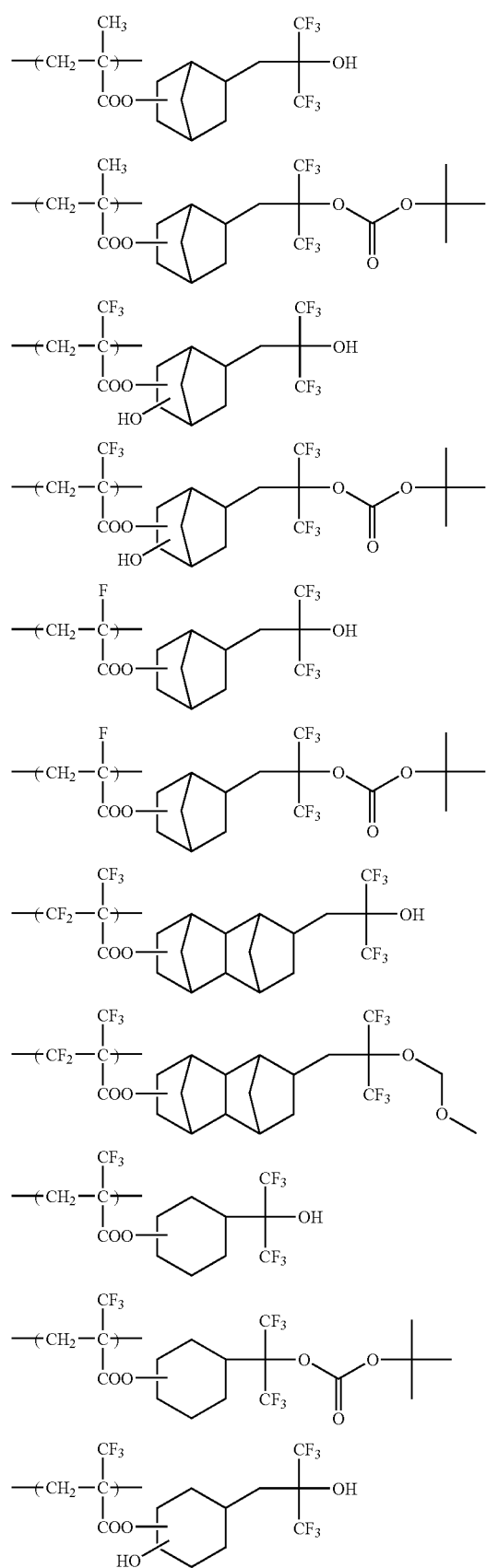

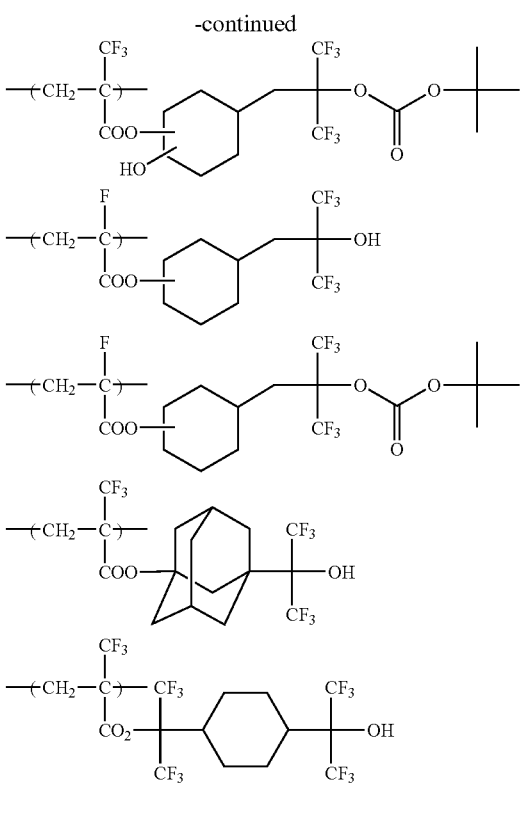

In formula (III), $R_{11}$ to $R_{16}$, $R_a$, $R_b$ and $R_c$ each independently represent a hydrogen atom, a fluorine atom or a fluoroalkyl group, provided that at least one of $R_{11}$ to $R_{16}$ is not a hydrogen atom. $X^3$ represents a hydrogen atom or a group having a group that is decomposed by the action of an acid to become soluble in an alkali developing solution. m represents 0 or 1.

$R_{11}$ to $R_{16}$ have the same meanings as $R_{21}$ to $R_{22}$ in formula (I), respectively. $R_a$, $R_b$ and $R_c$ have the same meanings as $R_a$, $R_b$ and $R_c$ in formula (I), respectively.

The group having a group that is decomposed by the action of an acid to become soluble in an alkali developing solution represented by $X^3$ has the same meaning as the group having a group that is decomposed by the action of an acid to become soluble in an alkali developing solution represented by $X^1$ in formula (I).

Specific examples of the repeating unit represented by formula (III) are set forth below, but the invention should not be construed as being limited thereto.

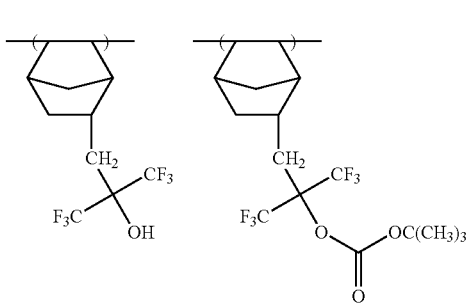

-continued
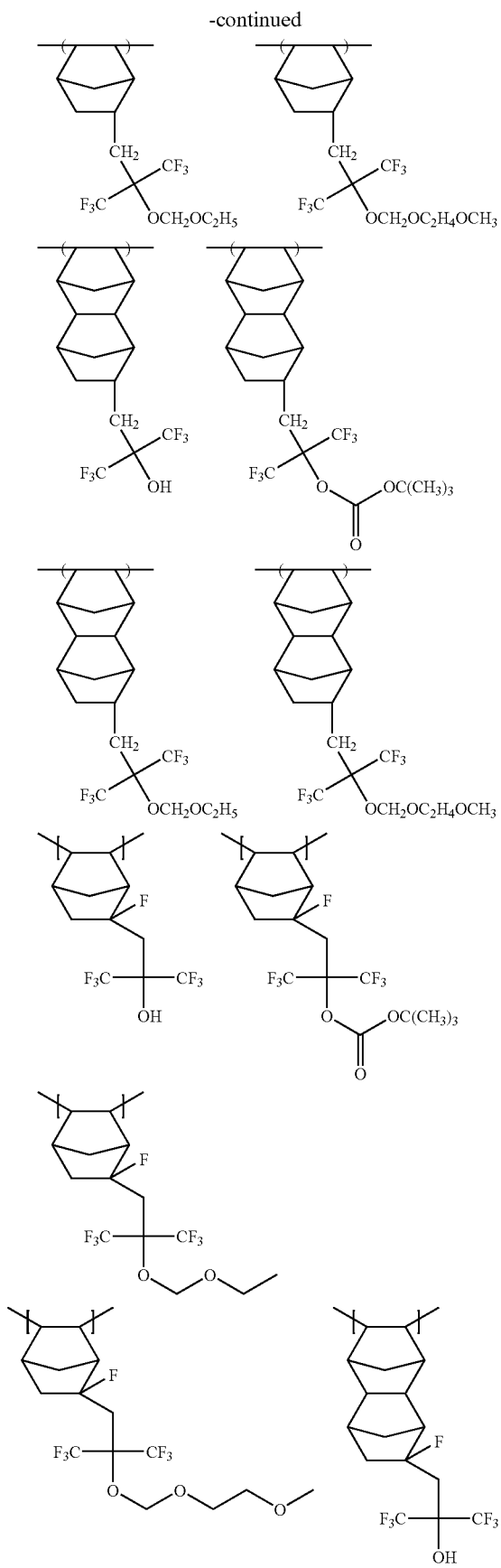
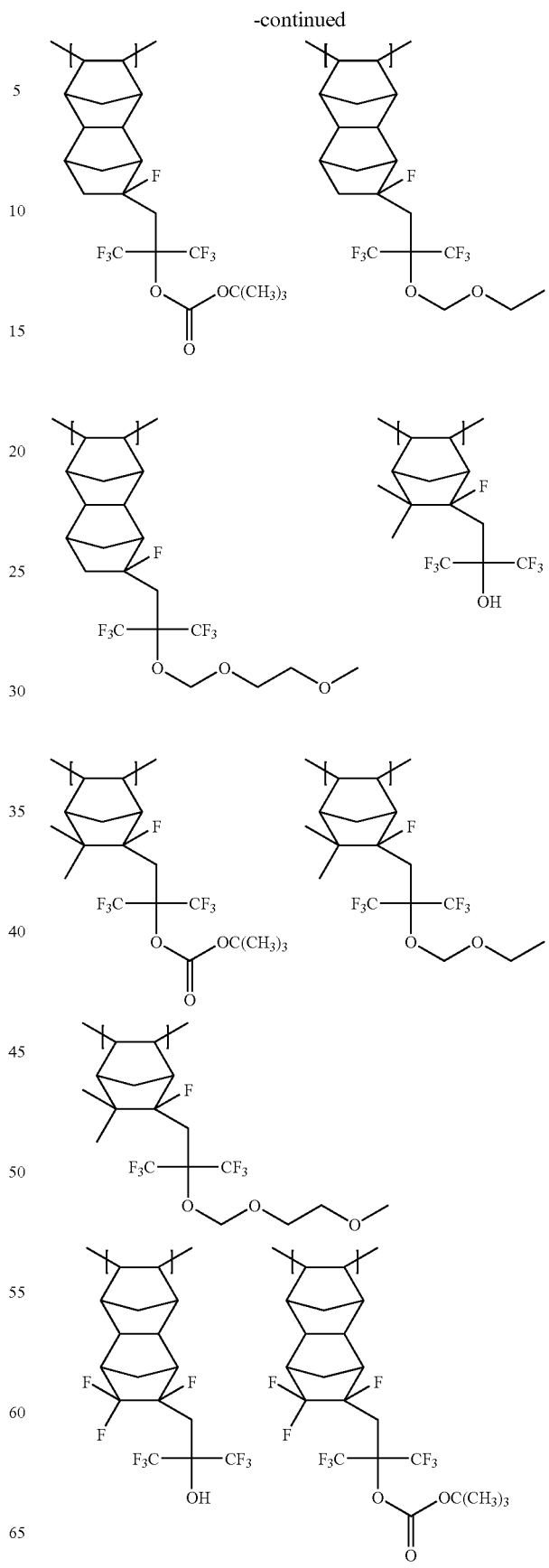

-continued

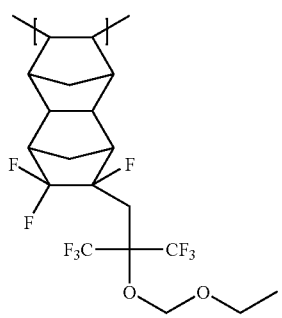

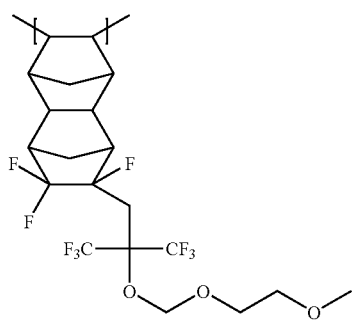

In formula (IV), $X^4$ represents a hydrogen atom or a group having a group that is decomposed by the action of an acid to become soluble in an alkali developing solution. m represents 0 or 1.

The group having a group that is decomposed by the action of an acid to become soluble in an alkali developing solution represented by $X^4$ has the same meaning as the group having a group that is decomposed by the action of an acid to become soluble in an alkali developing solution represented by $X^1$ in formula (I).

Specific examples of the repeating unit represented by formula (IV) are set forth below, but the invention should not be construed as being limited thereto.

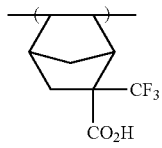 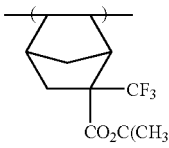

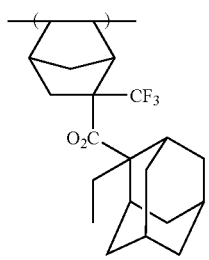 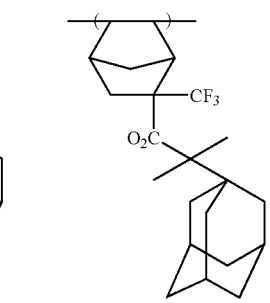

-continued

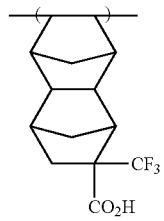 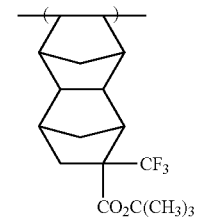

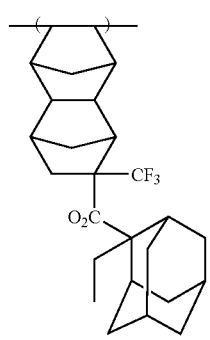 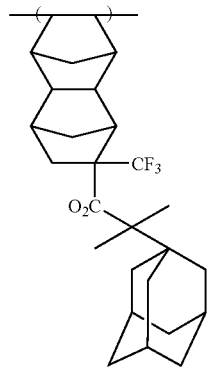

In formula (V), $R_d$ represents a hydrogen atom or a group having a group that is decomposed by the action of an acid to become soluble in an alkali developing solution.

The group having a group that is decomposed by the action of an acid to become soluble in an alkali developing solution represented by $R_d$ has the same meaning as the group having a group that is decomposed by the action of an acid to become soluble in an alkali developing solution represented by $X^1$ in formula (I).

Specific examples of the repeating unit represented by formula (V) are set forth below, but the invention should not be construed as being limited thereto.

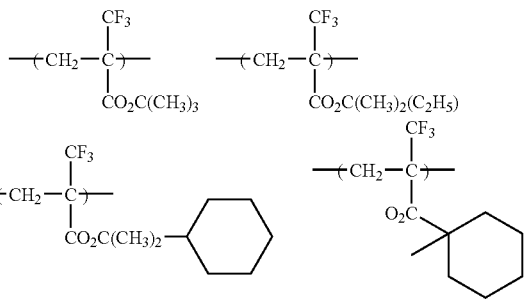

-continued

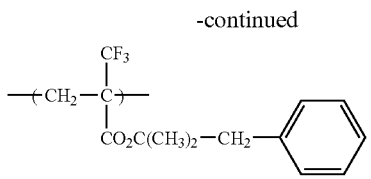

In formula (VI), $R_{1a}$ represents a hydrogen atom, a fluorine atom, a chlorine atom, a bromine atom, a cyano group or a trifluoromethyl group. $R_{41}$ to $R_{46}$ each independently represent a hydrogen atom, a fluorine atom or a fluoroalkyl group, provided that at least one of $R_{11}$ to $R_{16}$ is not a hydrogen atom. $X^5$ represents a hydrogen atom or a group having a group that is decomposed by the action of an acid to become soluble in an alkali developing solution. na represents an integer of from 1 to 5. When na is two or more, two or more $R_{41}$ to $R_{46}$ and $X^5$ may be the same or different.

$R_{41}$ to $R_{46}$ have the same meanings as $R_{21}$ to $R_{22}$ in formula (I), respectively.

The group having a group that is decomposed by the action of an acid to become soluble in an alkali developing solution represented by $X^5$ has the same meaning as the group having a group that is decomposed by the action of an acid to become soluble in an alkali developing solution represented by $X^1$ in formula (I).

Specific examples of the repeating unit represented by formula (VI) are set forth below, but the invention should not be construed as being limited thereto.

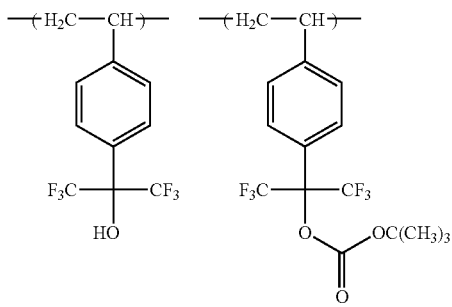

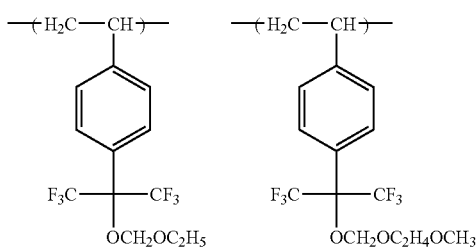

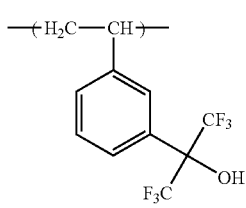

-continued

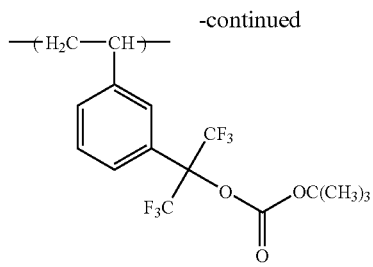

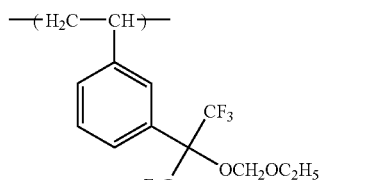

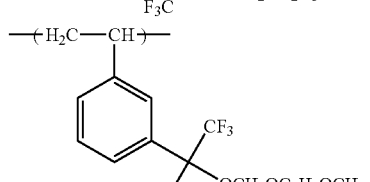

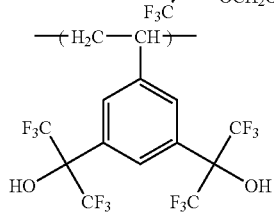

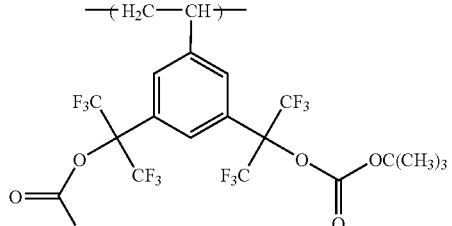

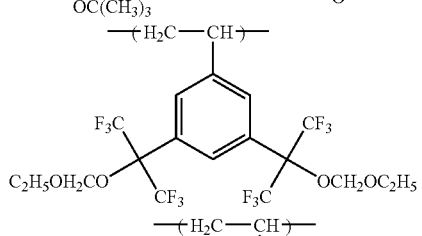

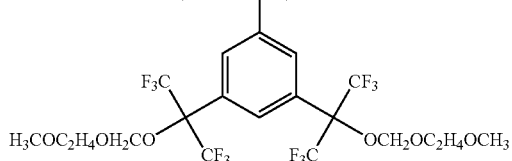

In formula (VII), $R_a$ and $R_b$ each independently represent a hydrogen atom, a fluorine atom or a fluoroalkyl group. $R_f$ represents a fluorine atom or a trifluoromethyl group. AR represents an alicyclic hydrocarbon structure. nc represents an integer of from 1 to 5.

$R_a$ and $R_b$ have the same meanings as $R_a$ and $R_b$ in formula (I), respectively.

AR has the same meaning as AR in formula (I).

Specific examples of the repeating unit represented by formula (VII) are set forth below, but the invention should not be construed as being limited thereto.

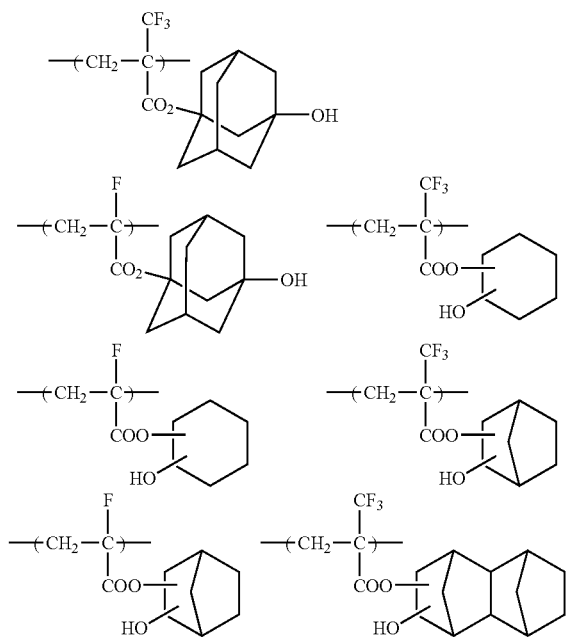

In formula (VIII), $R_a'$, $R_b'$, $R_c'$ and $R_d'$ each independently represent a hydrogen atom, a fluorine atom or a fluoroalkyl group, provided that at least one of $R_a'$, $R_b'$, $R_c'$ and $R_d'$ is not a hydrogen atom.

The fluoroalkyl group represented by any one of $R_a'$, $R_b'$, $R_c'$ and $R_d'$ has the same meaning as the fluoroalkyl group represented by any one of $R_{21}$ to $R_{26}$ in formula (I).

$R_a'$, $R_b'$, $R_c'$ and $R_d'$ is preferably a fluorine atom or a fluoroalkyl group, and more preferably a fluorine atom or a trifluoromethyl group.

Specific examples of the repeating unit represented by formula (VIII) are set forth below, but the invention should not be construed as being limited thereto.

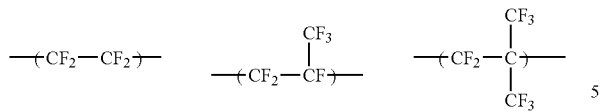

The resin (A) according to the invention may contain at least one repeating unit formed from a vinyl ether compound. Preferred examples of the repeating unit formed from a vinyl ether compound include a repeating unit represented by the following formula (VE-1).

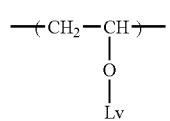

(VE-1)

In formula (VE-1), Lv represents a straight chain, branched or cyclic alkyl group, which may have a substituent, or a group formed by combining these groups through a connecting group, for example, an ether group, an ester group or a carbonate group. The substituent includes a hydroxy group, a halogen atom, a halogenated alkyl group, a cyano group and a nitro groups and preferably a hydroxy group, a fluorine atom or a trifluoromethyl group.

The vinyl ether compound is not particularly restricted and includes preferably a vinyl ether compound having an alkyl group or a cyclic carbon structure, each of which may have a substituent (for example, preferably, a hydroxy group, a halogen atom or a carboxy group). Also, a vinyl ether compound having a structure including a group that is decomposed by the action of an acid to generate a hydroxy group or a carboxy group is also preferred.

The alkyl group is preferably a straight chain or branched alkyl group having from 1 to 8 carbon atoms, for example, methyl, ethyl propyl, n-butyl, sec-butyl, hexyl, 2-ethylhexyl or octyl group.

The cyclic carbon structure preferably includes an alicyclic structure having from 3 to 30 carbon atoms and an aromatic cyclic structure. Specific examples of the cyclic carbon structure include an adamantane ring, a noradamantane ring, a decalin residue, a tricyclodecane ring, a norbornane ring, a cedrol ring, a cyclopropane ring, a cyclopentane ring, a cyclohexane ring, a cycloheptane ring, a cyclooctane ring, a cyclodecane ring, a cyclododecane ring, a benzene ring and a naphthalene ring, and preferably an adamantane ring, a norbornane ring and a cyclohexane ring. By defining Lv to an alkyl group or a cyclic carbon structure, the alkyl group or cyclic carbon structure is introduced to the repeating unit represented by formula (VB-1).

The group that is decomposed by the action of an acid to generate a hydroxy group or a carboxy group includes, for example, a $-OX^2$ group (wherein $X^2$ represents a group that is decomposed by the action of an acid) in formula (II) and a $-CO_2X^4$ group (wherein $X^4$ represents a group that is decomposed by the action of an acid) in formula (IV). In the repeating unit represented by formula (VE-I), the group that is decomposed by the action of an acid to generate a hydroxy group or a carboxy group can be a substituent on Lv.

Specific examples of the vinyl ether compound are set forth below, but the invention should not be construed as being limited thereto.

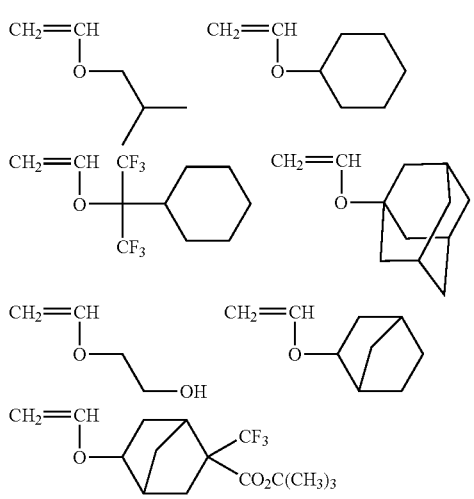

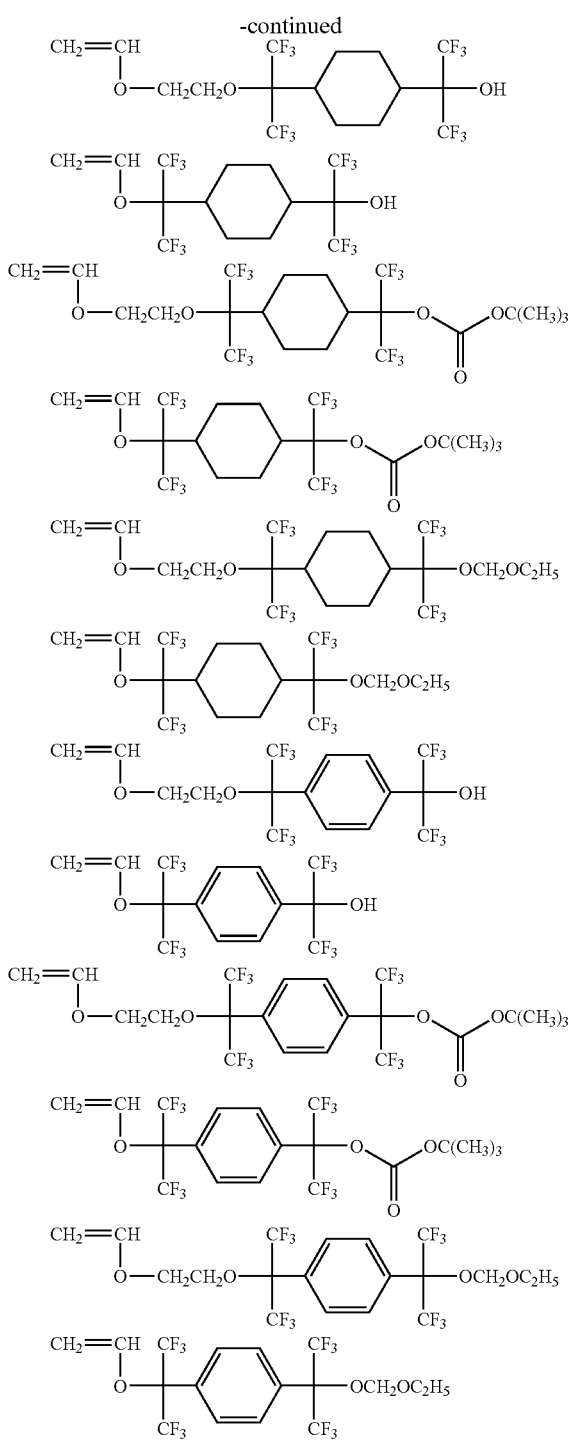

The resin (A) according to the invention may further contain a repeating unit formed from other copolymerizable monomer in addition to the repeating units represented by formula (I) to (VIII) and (VE-1).

Examples of the copolymerizable monomer include an acrylate, an acrylamide, a methacrylate, a methacrylamide, an allyl compound, a vinyl ester, a styrene, a crotonate, a dialkyl maleate or fumarate, a norbornene, maleic anhydride, a maleimide, acrylonitrile, methacrylonitrile, maleonitrile and $C(R_{101a})(R_{102a})\!=\!C(R_{103a})(R_{104a})$ (wherein $R_{101a}$ to $R_{104a}$, which may be the same or different, each represent a hydrogen atom, a halogen atom or an alkyl group (preferably having from 1 to 10 carbon atoms), which may be substituted with a halogen atom). Acrylonitrile, methacrylonitrile, a norbornene, maleic anhydride, a maleimide, N-hydroxymaleimide, N-(tert-butoxycarbonyloxy)maleimide and $C(R_{101a})(R_{102a})\!=\!C(R_{103a})(R_{104a})$ are particularly preferred. In addition, any addition polymerizable unsaturated compound copolymerizable with monomers corresponding to the repeating units described above may be ordinarily employed.

The amount of the resin (A) used is ordinarily from 50 to 99.5% by weight, preferably from 60 to 98% by weight, and more preferably from 65 to 95% by weight, based on the total solid content of the resist composition.

In the resin (A), the content of the repeating unit represented by formula (Y) including, for example, the repeating unit containing an acid-decomposable group represented by any one of formulae (Z1) to (Z5) and the repeating unit containing an acid-decomposable group represented by any one of formulae (Za) to (Ze), (Zd1) and (Zd2) is ordinarily from 3 to 95% by mole, preferably from 5 to 80% by mole, and more preferably from 7 to 70% by mole, based on the total repeating units constituting the resin.

In the resin (A), the content of the repeating unit represented by any one of formulae (I) to (VIII) is preferably from 0 to 90% by mole, and more preferably from 0 to 50% by mole, based on the total repeating units constituting the resin.

In the resin (A), the content of the repeating unit, formed from a vinyl ether compound, represented by formula (VE-1) is preferably from 0 to 60% by mole, and more preferably from 0 to 40% by mole, based on the total repeating units constituting the resin.

The acid-decomposable resin for use in the invention can be synthesized according to conventional methods, for example, radical polymerization. For instance, in an ordinary synthesis method, monomers are put into a reaction vessel at once or separately during the reaction, dissolved in a reaction solvent, for example, an ether, e.g., tetrahydrofuran, 1,4-dioxane or diisopropyl ether, a ketone, e.g., methyl ethyl ketone or methyl isobutyl ketone, an ester, e.g., ethyl acetate, or a solvent capable of dissolving various monomers, e.g., propylene glycol monomethyl ether acetate as described hereinafter, if desired, to form a uniform solution, and under inert gas atmosphere, for example, nitrogen or argon, with heating, if desired, polymerization is initiated using a commercially available radical initiator (e.g., an azo initiator or a peroxide). The initiator is further added or separately added, if desired. After the completion of the reaction, the reaction mixture is poured into a solvent to correct the resulting powder or solid, thereby obtaining the polymer. The concentration of reaction is ordinarily not less than 20% by weight, preferably not less than 30% by weight, and more preferably not less than 40% by weight. The reaction temperature is ordinarily from 10 to 150° C., preferably from 30 to 120° C., and more preferably from 50 to 100° C. Depending on the monomer used, the resin can be preferably synthesized by utilizing an anion polymerization. The polymerization methods are described in The Chemical Society of Japan ed., Jikken Kagaku Koza (Courses in Experimental Chemistry) No. 28, Kobunshi Gosei (Polymer Synthesis), Maruzen Co. Ltd., and The Chemical Society of Japan ed., Jikken Kagaku Koza (Courses in Experimental chemistry) No. 19, Kobunshi Kagaku (Polymer Chemistry), Maruzen Co. Ltd.

[2] Compound that Generates Acid upon Irradiation of Actinic Ray or Radiation (Component (B))

The positive resist composition of the invention is characterized by containing at least two compounds (B) that generate an acid upon irradiation of an actinic ray or radiation, particularly an $F_2$ excimer laser beam.

More specifically, the resist composition of the invention includes, as the compound that generates an acid upon irradiation, of an actinic ray or radiation, at least two compounds selected from (B1) a compound that generates an aliphatic or aromatic sulfonic acid substituted with at least one fluorine atom, (B2) a compound that generates an aliphatic or aromatic sulfonic acid that does not contain a fluorine atom, (B3) a compound that generates an aliphatic or aromatic carboxylic acid substituted with at least one fluorine atom and (B4) a compound that generates an aliphatic or aromatic sulfonic acid that does not contain a fluorine atom.

Of the combinations of the compounds, a combination of at last one of the compounds of Component (B1) with at last one compound selected from the compounds of Components (B2) to (B4) is preferred as the component (B) in view of decrease in development defect and scum. A weight ratio of the compound of Component (B1) to the compound of Components (B2) to (B4) is preferably from 1/1 to 1/50, more preferably from 1/1 to 1/10, and particularly preferably from 2/1 to 5/1.

Two or more compounds may be used in combination in each component.

The compounds of Components (B1) to (B4) can be selected from compounds ordinarily used as compounds (photo-acid generators) that are decomposed by irradiation of an actinic ray or radiation to generate an acid.

Specifically, the compounds can be appropriately selected from photoinitiators for photo-cationic polymerization, photoinitiators for photo-radical polymerization, photo-achromatic agents for dyes, photo-discoloring agents, compounds capable of generating an acid with known light used for microresists (for example, an ultraviolet ray having a wavelength of from 400 to 200 nm or a far ultraviolet ray, particularly preferably g-line, h-line, i-line or a KrF excimer laser beam), an ArF excimer laser beam, an $F_2$ excimer laser beam, an electron beam, an X ray, a molecular beam or an ion beam.

The acid that is generated upon the irradiation of an actinic ray or radiation from the compounds of Components (B1) to (B4) is a sulfonic acid or a carboxylic acid, and the compounds of Components (B1) to (B4) are preferably onium salts.

The compounds of Components (B1) to (B4) are described in more detail below.

The compound (B1) capable of generating a sulfonic acid containing a fluorine atom upon irradiation of an actinic ray or radiation includes, for example, an iodonium salt represented by formula (PAG-B1-1) shown below, and a sulfonium salt represented by formula (PAG-B1-2) or (PAG-B1-3) shown below.

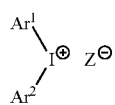
(PAG-B1-1)

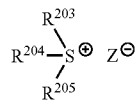
(PAG-B1-2)

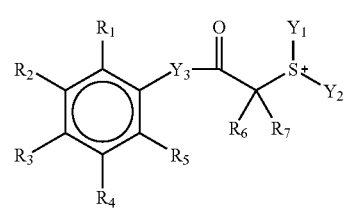
(PAG-B1-3)

In formulae (PAG-B1-1) and (PAG-B1-2), $Ar^1$ and $Ar^2$ each independently represent a substituted or unsubstituted aryl group. $R^{203}$, $R^{204}$ and $R^{205}$ each independently represent a substituted or unsubstituted alkyl group or a substituted or unsubstituted aryl group.

$Z^-$ represents a sulfonic acid anion having at least one fluorine atom.

Alternatively, two of $R^{203}$, $R^{204}$ and $R^{205}$, or $Ar^1$ and $Ar^2$ may be combined with each other through a single bond or a substituent.

In formulae (PAG-B1-3), $R_1$ to $R_5$ each represent a hydrogen atom, a hydroxy group, an alkyl group, an alkoxy group, a nitro group, a halogen atom, an alkoxycarbonyl group or an aryl group, or at least two of $R_1$ to $R_5$ may be combined with each other to form a ring structure.

$R_6$ and $R_7$ each represent a hydrogen atom, an alkyl group, a cyano group or an aryl group.

$Y_1$ and $Y_2$ each represent an alkyl group, an aryl group, an aralkyl group or an aromatic group containing a hetero atom, or $Y_1$ and $Y_2$ may be combined with each other to form a ring.

$Y_3$ represents a single bond or a divalent connecting group.

$X^-$ has the same meaning as $Z^-$ defined in formula (PAG-B1-1) or (PAG-B1-2).

At least one of $R_1$ to $R_5$ and at least one of $Y_1$ and $Y_2$ may be combined with each other to form a ring or at least one of $R_1$ to $R_5$ and at least one of $R_6$ and $R_7$ may be combined with each other to form a ring.

Any of $R_1$ to $R_7$ and $Y_1$ to $Y_2$ is bonded through a connecting group to form a compound having two or more structures represented by formula (PAG-B1-3).

The aryl group represented by $Ar^1$, $Ar^2$, $R^{203}$, $R^{204}$ or $R^{205}$ is preferably an aryl group having from 6 to 14 carbon atoms. The alkyl group represented by $Ar^1$, $Ar^2$, $R^{203}$, $R^{204}$ or $R^{205}$ is preferably an alkyl group having 1 to 8 carbon atoms.

Preferred examples of the substituent for the aryl group include an alkoxy group having from 1 to 8 carbon atoms, an alkyl group having from 1 to 8 carbon atoms, an alkoxycarbonyl group having from 2 to 9 carbon atoms, an alkylcarbonylamino group having from 2 to 9 carbon atoms, a nitro group, a carboxy group, a hydroxy group, a halogen atom and a phenylthio group, Preferred examples of the substituent for the alkyl group include an alkoxy group having from 1 to 8 carbon atoms, an aryl group having from 6 to 14 carbon atoms, an arylcarbonyl group having from 7 to 15 carbon atoms, a carboxy group and a halogen atom.

The sulfonic acid anion represented by $Z^-$ or $X^-$ includes preferably a sulfonic acid anion of an aliphatic hydrocarbon group having from 1 to 20 carbon atoms and containing at least one fluorine atom or a sulfonic acid anion of an aromatic hydrocarbon group having from 6 to 20 carbon atoms and containing at least one fluorine atom. The aliphatic or aromatic hydrocarbon group may have a substituent. Examples of the substituent include an alkoxy group having from 1 to 10 carbon atoms, which may be substituted with a fluorine atom, an alkoxycarbonyl group having from 2 to 11 carbon atoms, which may be substituted with a fluorine atom, a phenylamino group, a phenylcarbonyl group, a halogen atom and a hydroxy group. Examples of the substituent for the aromatic hydrocarbon group also includes an alkyl group having from 1 to 15 carbon atoms.

Of the aliphatic sulfonic acid anions, an anion having a fluorine atom on the α-carbon atom of the aliphatic sulfonic acid has a high acid strength. The perfluoro aliphatic sulfonic acid anion has a higher acid strength.

The alkyl group represented by any one of $R_1$ to $R_7$ includes a substituted or unsubstituted alkyl group, and preferably an alkyl group having from 1 to 5 carbon atoms. Examples of the unsubstituted alkyl group include methyl, ethyl, propyl, n-butyl, sec-butyl and tert-butyl groups.

The alkoxy group represented by any one of $R_1$ to $R_5$ or the alkoxy group in the alkoxycarbonyl group represented by any one of $R_1$ to $R_5$ includes a substituted or unsubstituted alkoxy group, and preferably an alkoxy group having from 1 to 5 carbon atoms. Examples of the unsubstituted alkoxy group include methoxy, ethoxy, propoxy and butoxy groups.

The aryl group represented by any one of $R_1$ to $R_7$, $Y_1$ and $Y_2$ includes a substituted or unsubstituted aryl group, and preferably an aryl group having from 6 to 14 carbon atoms, for example, phenyl, tolyl or naphthyl group.

The halogen atom represented by any one of $R_1$ to $R_5$ includes, for example, fluorine, chlorine, bromine and iodine atoms.

The alkyl group represented by $Y_1$ or $Y_2$ includes a substituted or unsubstituted alkyl group, and preferably an alkyl group having from 1 to 30 carbon atoms. Examples of the unsubstituted alkyl group include a straight chain or branched alkyl group, e.g., methyl, ethyl, propyl, n-butyl, sec-butyl or tert-butyl group and a cyclic alkyl group, e.g., cyclopropyl, cyclopentyl, cyclohexyl, adamantyl, norbornyl or bornyl group.

The aralkyl group represented by $Y_1$ or $Y_2$ includes a substituted or unsubstituted aralkyl group, and preferably an aralkyl group having from 7 to 12 carbon atoms. Examples of the unsubstituted aralkyl group include benzyl, phenethyl and cumyl groups.

The aromatic group containing a hetero atom means an aromatic group, for example, an aryl group having from 6 to 14 carbon atoms, which contains a hetero atom, for example, nitrogen, oxygen or sulfur atom.

The aromatic group containing a hetero atom represented by $Y_1$ or $Y_2$ includes a substituted or unsubstituted aromatic group containing a hetero atom. Examples of the unsubstituted aromatic group containing a hetero atom include a heterocyclic aromatic hydrocarbon group, e.g., furyl, thiophenyl, pyrolyl, pyridyl or indolyl group.

$Y_1$ and $Y_2$ may be combined with each other to form a ring together with $S^+$ in formula (PAG-B1-3).

In such a case, the group formed by combining $Y_1$ with $Y_2$ includes, for example, an alkylene group having from 4 to 10 carbon atoms, preferably butylene, pentylene or hexylene group, and particularly preferably butylene or pentylene group.

The ring formed by combining $Y_1$ with $Y_2$ together with $S^+$ in formula (PAG-B1-3) may contain a hetero atom.

The above-described alkyl group, alkoxy group, alkoxycarbonyl group, aryl group and aralkyl group may be substituted, for example, with a nitro group, a halogen atom, a carboxy group, a hydroxy group, an amino group, a cyano group or an alkoxy group (preferably an alkoxy group having from 1 to 5 carbon atoms), respectively. The aryl group and aralkyl group may further be substituted with an alkyl group (preferably an alkyl group having from 1 to 5 carbon atoms), respectively.

The substituent for the alkyl group is preferably a halogen atom.

$Y_3$ represents a single bond or a divalent connecting group. The divalent connecting group includes preferably an alkylene group, which may be substituted, an alkenylene group, which may be substituted, —O—, —S—, —CO—, —CONR— (wherein R represents a hydrogen atom, an alkyl group or an acyl group) and a connecting group formed by combination of two or more of these groups.

Specific examples of the compound of Component (B1) are set forth below, but the invention should not be construed as being limited thereto.

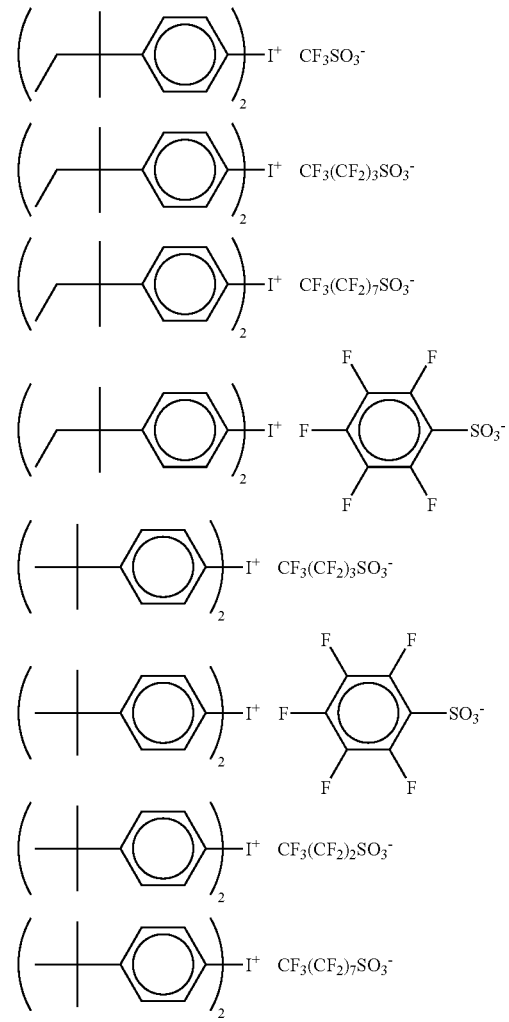

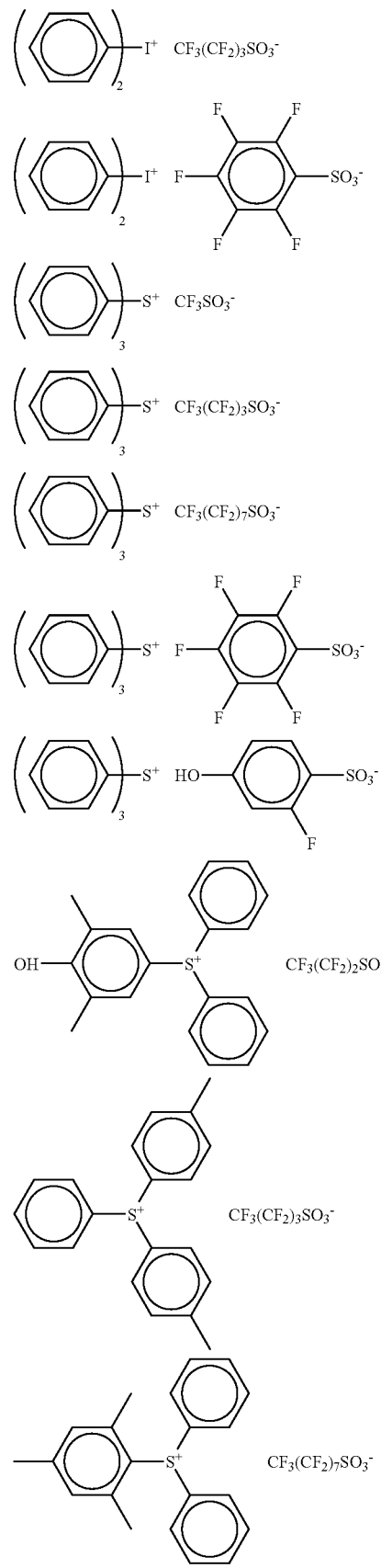
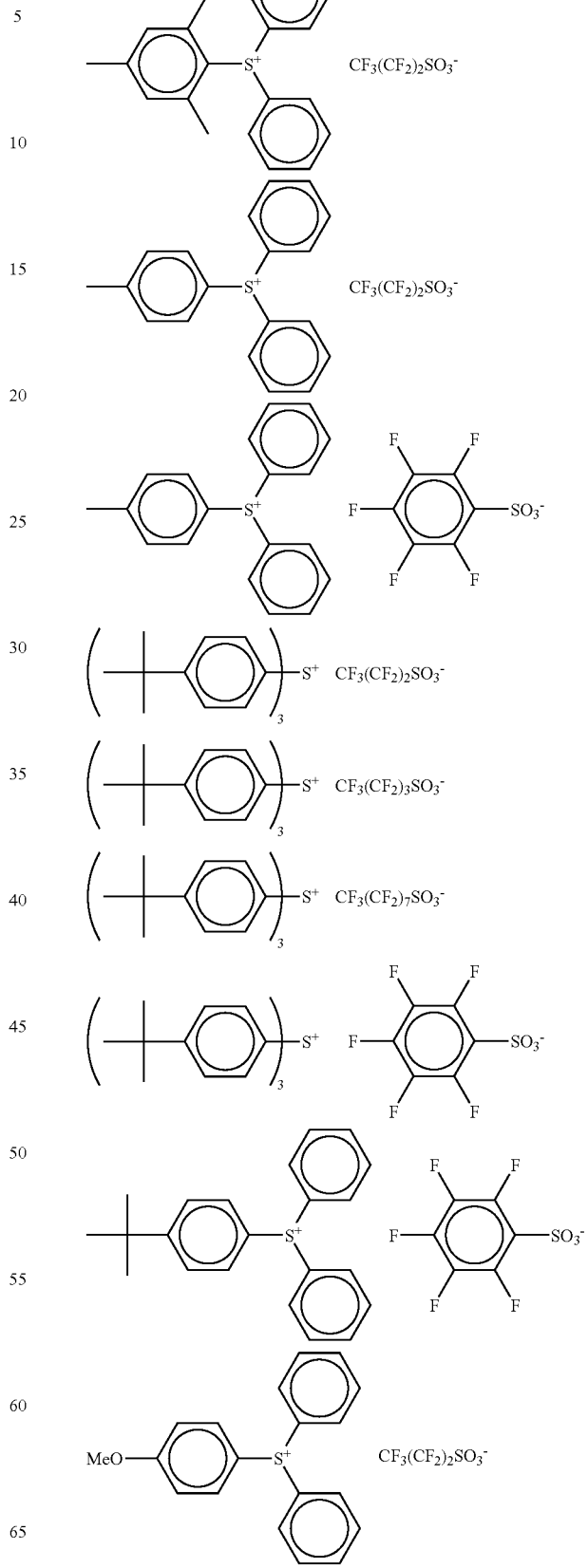

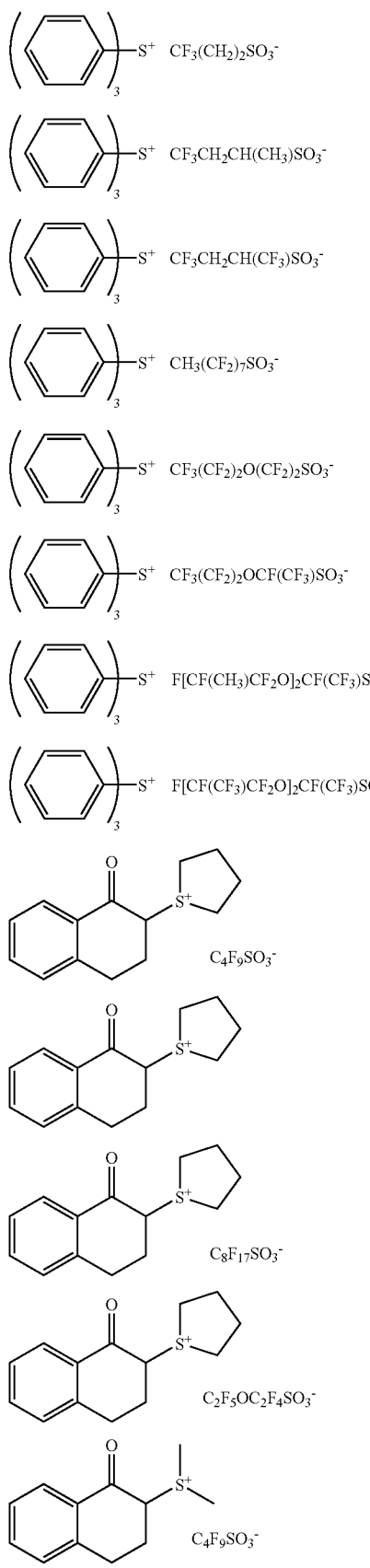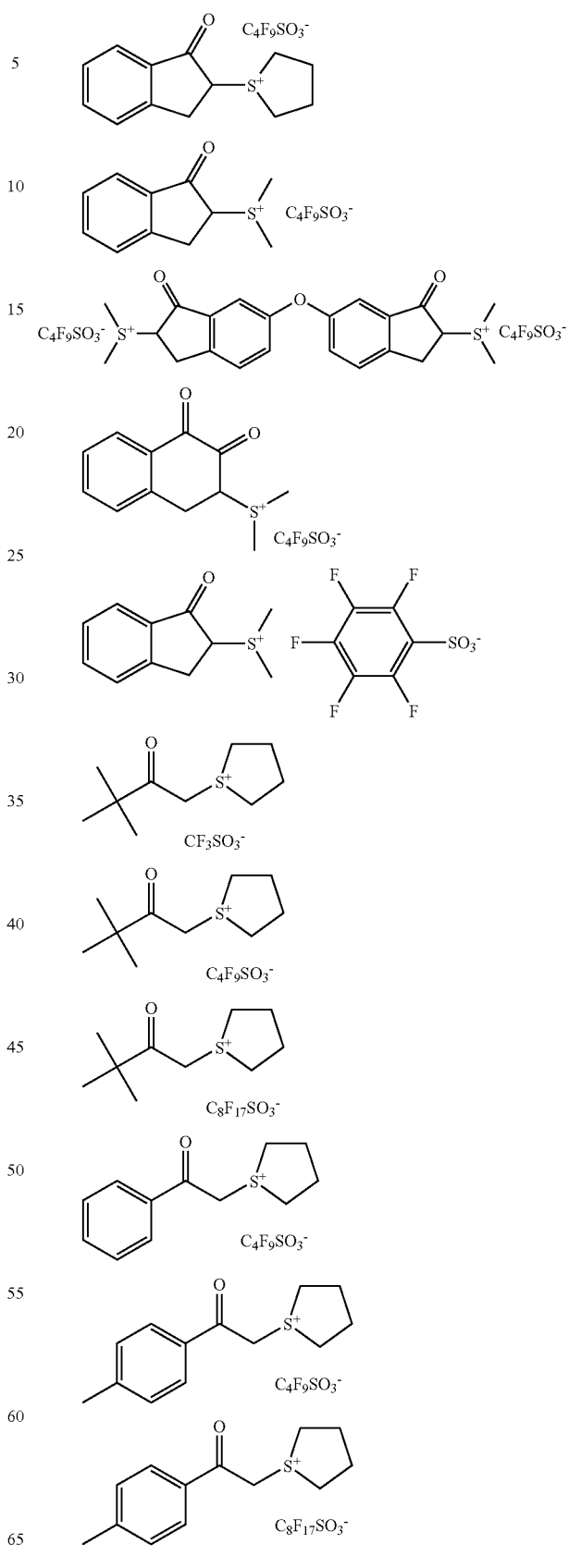

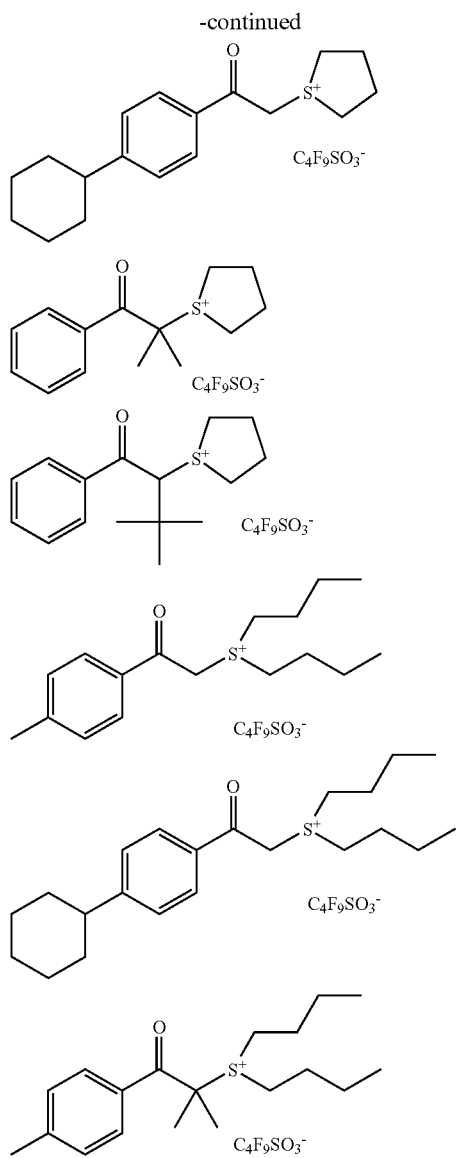

The compound (B2) capable of generating a sulfonic acid containing no fluorine atom upon irradiation of an actinic ray or radiation includes, for example, an iodonium salt represented by formula (PAG-B1-1) and a sulfonium salt represented by formula (PAG-B1-2) or (PAG-B1-3), wherein Z⁻ or X⁻ represents a sulfonic acid anion that does not contain a fluorine atom.

Specific examples of the compound of Component (B2) are set forth below, but the invention should not be construed as being limited thereto.

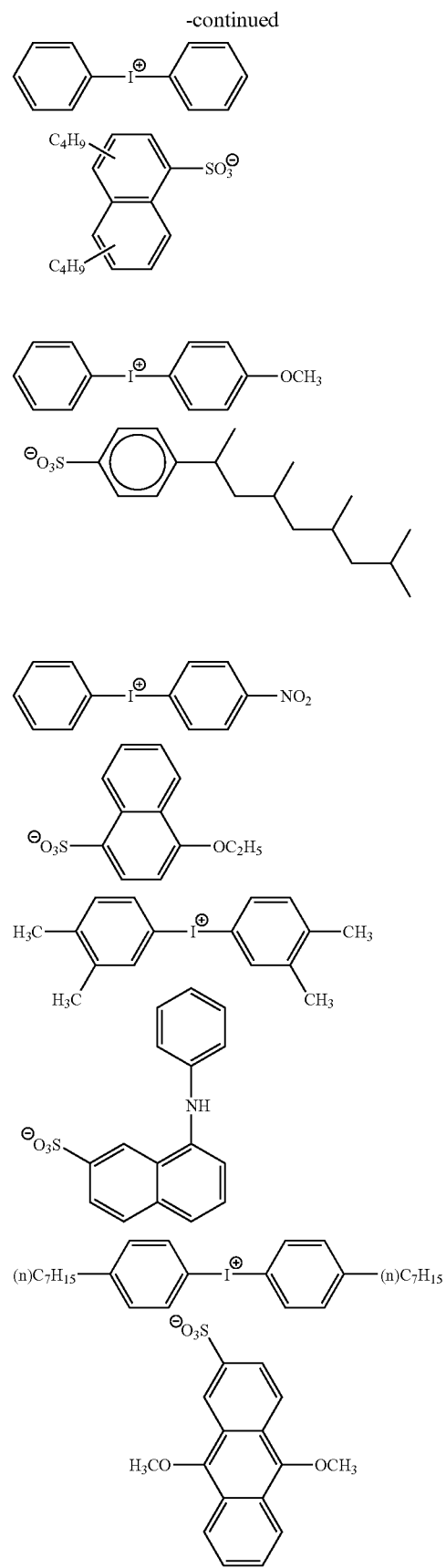

-continued
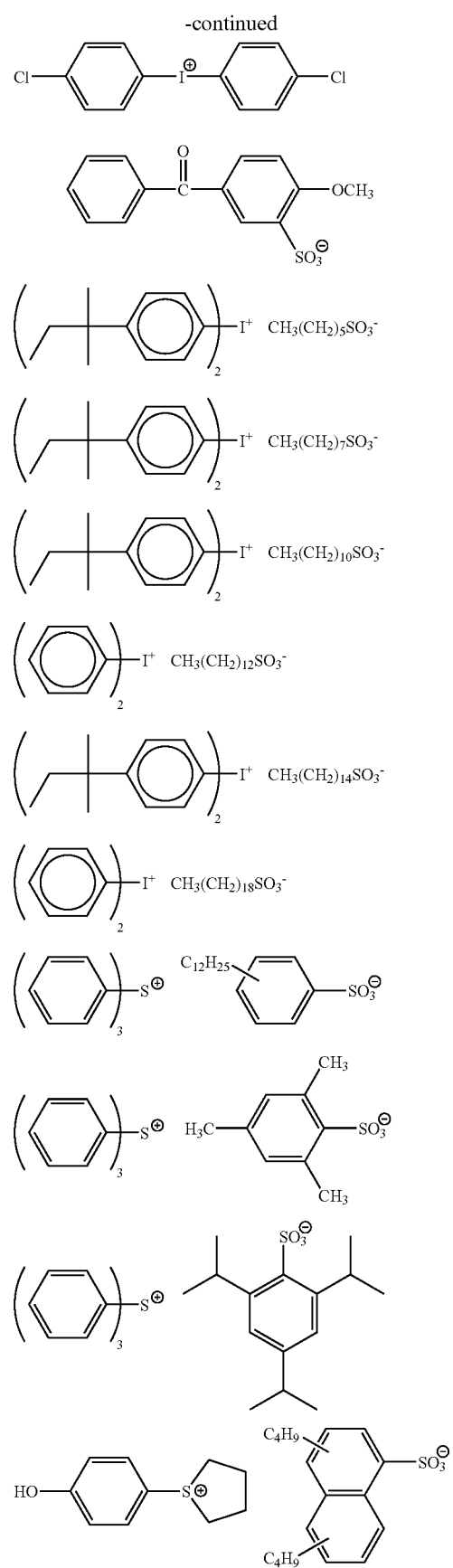
-continued
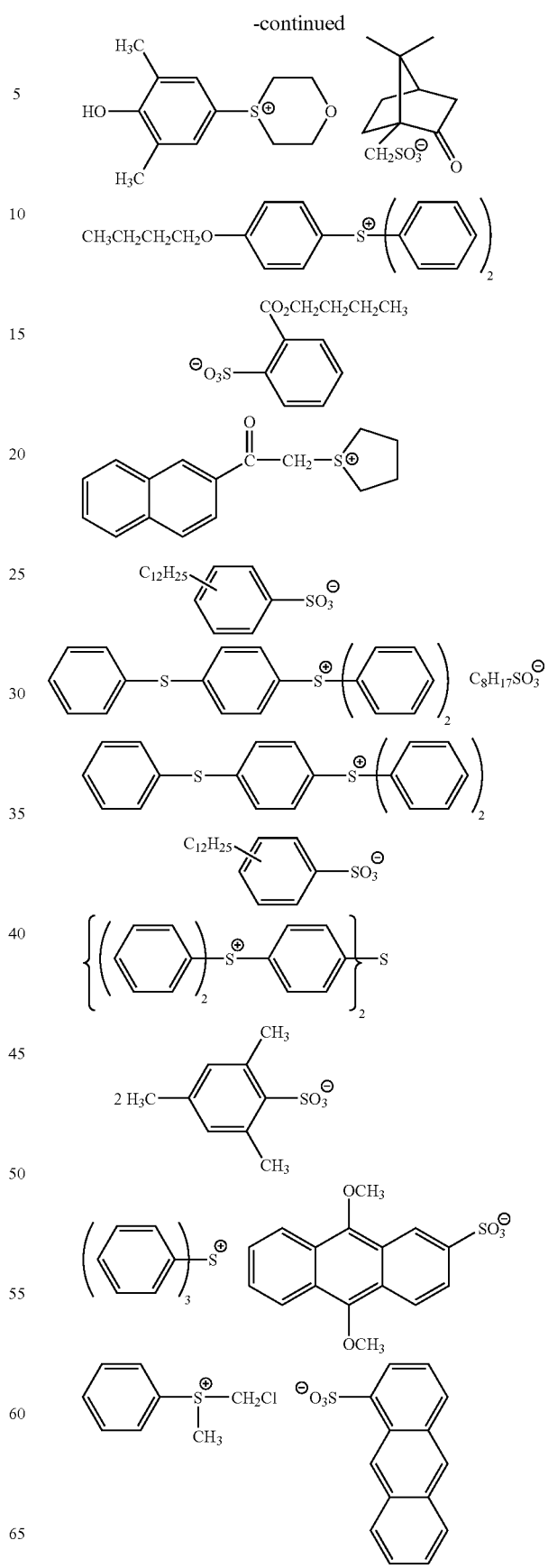

-continued

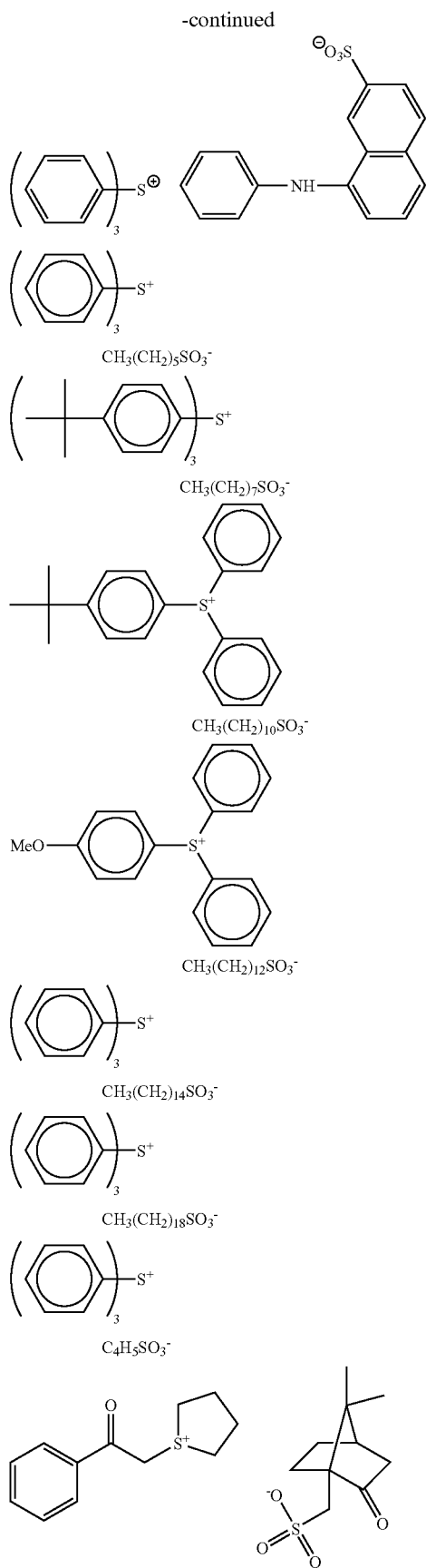

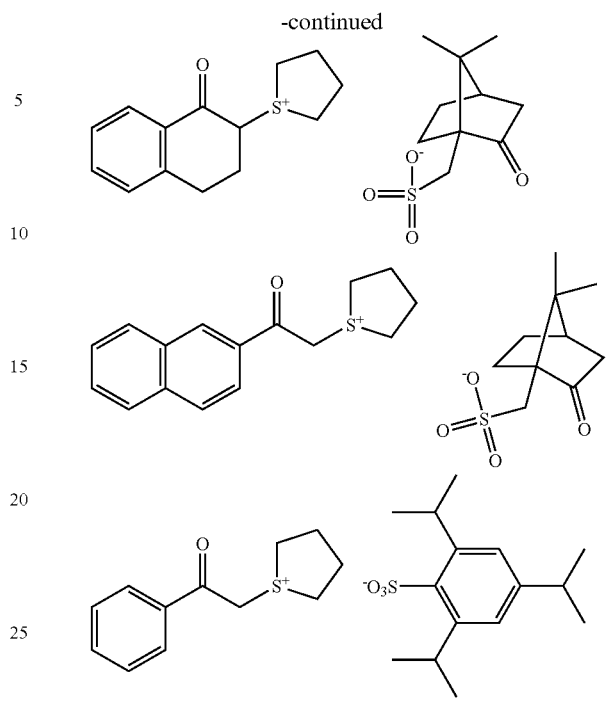

The compounds of Components (B1) and (B2) can be synthesized by reacting an aromatic compound with a periodate and subjecting the resulting iodonium salt to salt exchange with a corresponding sulfonic acid.

The compound can also be synthesized, for example, by a method comprising reacting an aryl Grignard reagent, e.g., an aryl magnesium bromide, with a substituted or unsubstituted phenylsulfoxide and then subjecting the resulting triaryl sulfonium halide to salt exchange with a corresponding sulfonic acid, a method comprising condensing a substituted or unsubstituted phenyl sulfoxide with a corresponding aromatic compound in the presence of an acid catalyst, e.g., methanesulfonic acid/diphosphorus pentaoxide or aluminum chloride, and then subjecting the resulting condensate to salt exchange, or a method comprising condensing a diaryl iodonium salt with a diaryl sulfide in the presence of a catalyst, e.g., copper acetate, and then subjecting the resulting condensate to salt exchange.

The salt exchange can be conducted by introducing once into a halide, followed by converting to a sulfonate using a silver reagent, e.g., silver oxide, or by using an ion exchange resin. For the salt exchange, a sulfonic acid or sulfonate commercially available or obtained by hydrolysis of a commercially available sulfonic acid halide can be employed.

The compound (B3) capable of generating a carboxylic acid containing a fluorine atom upon irradiation of an actinic ray or radiation is described below.

The fluorine-substituted aliphatic carboxylic acid includes a fluorine-substituted compound of an aliphatic carboxylic acid, for example, acetic acid, propionic acid, n-butyric acid, isobutyric acid, valeric acid, trimethylacetic acid, caproic acid, heptanoic acid, caprylic acid, pelargonic acid, capric acid, lauric acid, myristic acid, palmitic acid, stearic acid, undecanoic acid or tridecanoic acid. The aliphatic carboxylic acid may have a hydroxy group, an alkoxy group or a halogen atom other than a fluorine atom as a substituent. The aliphatic carboxylic acid may contain in its alicyclic chain a connecting group, for example, an oxygen atom, a sulfur atom, a carbonyl group, a carboxy group or a sulfonyl group.

Preferred examples of the fluorine-substituted aliphatic carboxylic acid include those represented by the following formula:

L-$(CH_2)_p(CF_2)_q(CH_2)_r$—COOH

In the formula, L represents a hydrogen atom or a fluorine atom, p and r each independently represent an integer of from 0 to 15, and q represents an integer of from 1 to 15. The hydrogen atom or fluorine atom included in the alkyl chain in the formula may be substituted with an alkyl group (preferably having from 1 to 5 carbon atoms), which may be substituted with a fluorine atom, an alkoxy group (preferably having from 1 to 5 carbon atoms), which may be substituted with a fluorine atom, or a hydroxy group.

As the fluorine-substituted aliphatic carboxylic acid, a fluorine-substituted compound of a saturated aliphatic carboxylic acid having from 2 to 20 carbon atoms is preferred, and a fluorine-substituted compound of a saturated aliphatic carboxylic acid having from 4 to 20 carbon atoms is more preferred. By controlling the number of carbon atoms in the aliphatic carboxylic acid to 4 or more, diffusibility of the acid generated decreases, and fluctuation of line width with the lapse of time from exposure to post heating can be more restrained. Among them, a fluorine-substituted compound of a straight chain or branched saturated aliphatic carboxylic acid having from 4 to 18 carbon atoms is preferably used.

As the fluorine-substituted aromatic carboxylic acid, a fluorine-substituted compound of an aromatic carboxylic acid having from 7 to 20 carbon atoms is preferred, a fluorine-substituted compound of an aromatic carboxylic acid having from 7 to 15 carbon atoms is more preferred, and an aromatic carboxylic acid having from 7 to 11 carbon atoms is still more preferred. Specific examples of the fluorine-substituted aromatic carboxylic acid include a fluorine-substituted compound of an aromatic carboxylic acid, for example, benzoic acid, a substituted benzoic acid, naphthoic acid, a substituted naphthoic acid, anthracenecarboxylic acid or a substituted anthracenecarboxylic acid (wherein the substituent includes an alkyl group, an alkoxy group, a hydroxy group, a halogen atom, an aryl group, an acyl group, an acyloxy group, a nitro group, an alkylthio group and an arylthio group). Among them, a fluorine-substituted compound of benzoic acid or substituted benzoic acid is preferably used.

The aliphatic or aromatic carboxylic acid substituted with a fluorine atom includes an aliphatic or aromatic carboxylic acid in which at least one of the hydrogen atoms present in the skeleton other than the carboxy group is substituted with a fluorine atom. Particularly, an aliphatic or aromatic carboxylic acid in which all of the hydrogen atoms present in the skeleton other than the carboxy group are substituted with fluorine atoms (a perfluoro saturated aliphatic carboxylic acid or a perfluoro aromatic carboxylic acid) is preferred. By using such a perfluoro aliphatic or aromatic carboxylic acid, the sensitivity is more improved.

Of the compounds of (B3), an onium salt compound (e.g., a sulfonium salt, an iodonium salt or a phenacylsulfonium salt) having as a counter anion, the anion of aliphatic or aromatic carboxylic acid substituted with a fluorine atom described above, an imidocarboxylate compound and a nitrobenzyl ester compound each hating a carboxylic acid ester group are preferred.

More preferred examples of the compound of (B3) include compounds represented by formulae (PAG-B3-1) to (PAG-B3-3) shown below. By using such a compound, the sensitivity, resolution and exposure margin are more improved. When the compound is irradiated with an actinic ray or radiation, it generates a saturated aliphatic or aromatic carboxylic acid substituted with at least one fluorine atom, which corresponds to an anion represented by $X^-$ in any one of formulae (PAG-B3-1) to (PAG-B3-3), whereby it functions as a photo-acid generator.

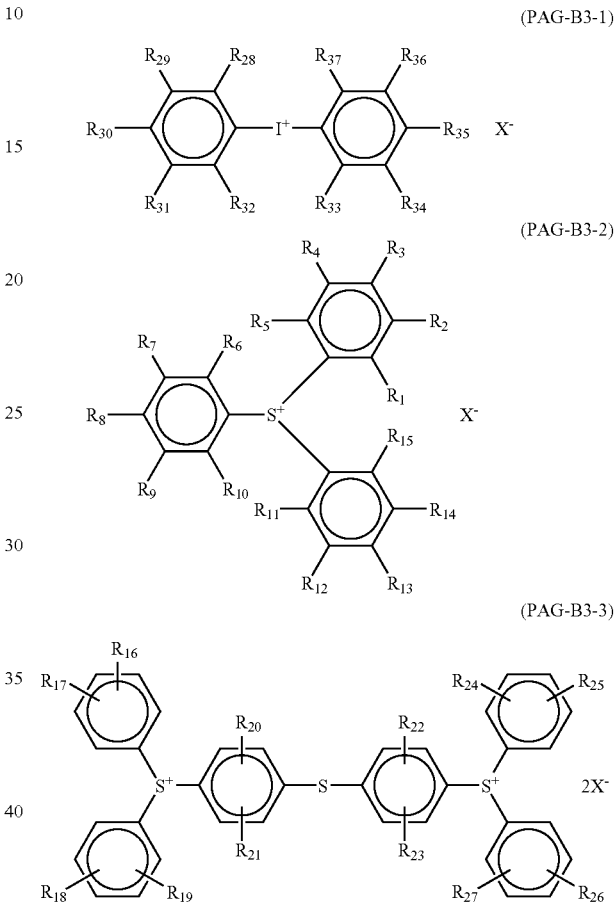

In formulae (PAG-B3-1) to (PAG-B3-3), $R_1$ to $R_{37}$ each independently represent a hydrogen atom, a straight chain, branched or cyclic alkyl group, a straight chain, branched or cyclic alkoxy group, a hydroxy group, a halogen atom or a group of —S—$R_{38}$. $R_{38}$ represents a straight chain, branched or cyclic alkyl group or an aryl group. $X^-$ represents an anion of an aliphatic or aromatic carboxylic acid substituted with at least one fluorine atom.

In any one of formulae (PAG-B3-1) to (PAG-B3-3), $X^-$ represents preferably an anion of a perfluoro aliphatic carboxylic acid or a perfluoro aromatic carboxylic acid, and more preferably an anion of a fluorine-substituted alkylcarboxylic acid having not less than 4 carbon atoms.

The straight chain or branched alkyl group represented by any one of $R_1$ to $R_{38}$ includes that having from 1 to 4 carbon atoms, which may have a substituent, for example, methyl, ethyl, propyl, n-butyl, sec-butyl or tert-butyl group. The cyclic alkyl group represented by any one of $R_1$ to $R_{38}$ includes that having from 3 to 8 carbon atoms, which may have a substituent, for example, cyclopropyl, cyclopentyl or cyclohexyl group.

The alkoxy group represented by any one of $R_1$ to $R_{37}$ includes that having from 1 to 4 carbon atoms, which may have a substituent, for example, methoxy, ethoxy, hydroxyethoxy, propoxy, n-butoxy, isobutoxy, sec-butoxy or tert-butoxy group.

The halogen atom represented by any one of $R_1$ to $R_{37}$ includes, for example, fluorine, chlorine, bromine and iodine atoms.

The aryl group represented by $R_{38}$ includes that having from 6 to 14 carbon atoms, which may have a substituent, for example, phenyl, tolyl, methoxyphenyl or naphthyl group.

The substituents for the above groups preferably include, for example, an alkoxy group having from 1 to 4 carbon atoms, a halogen atom (e.g., fluorine, chlorine or iodine atom), an aryl group having from 6 to 10 carbon atoms, an alkenyl group having from 2 to 6 carbon atoms, a cyano group, a hydroxy group, a carboxy group, an alkoxycarbonyl group and a nitro group.

The iodonium compound or sulfonium compound represented by any one of formulae (PAG-B3-1) to (PAG-B3-3) for use in the invention has as the counter anion represented by $X^-$, the anion of a saturated aliphatic or aromatic carboxylic acid substituted with at least one fluorine atom The anion is an anion (—COO$^-$) formed by releasing the hydrogen atom of the saturated aliphatic or aromatic carboxylic acid (—COOH).

Specific examples of the compound of Component (B3) are set forth below, but the invention should not be construed as being limited thereto.

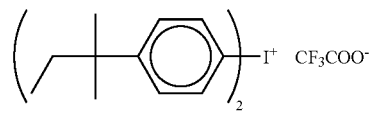

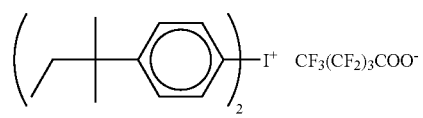

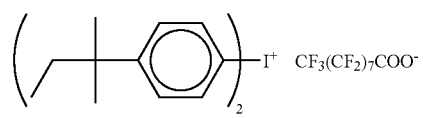

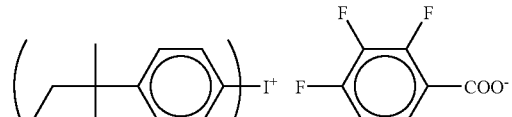

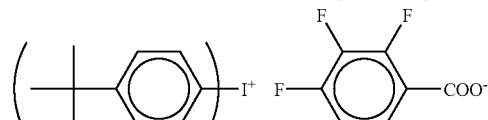

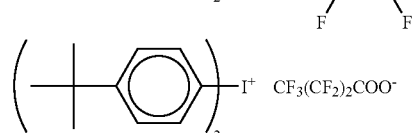

-continued

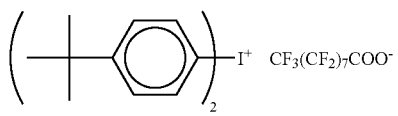

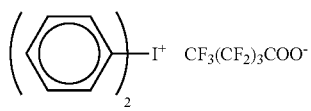

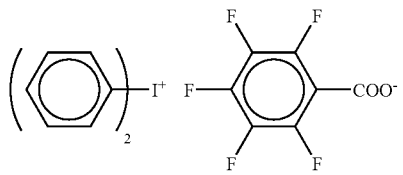

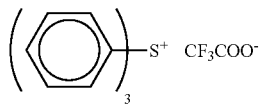

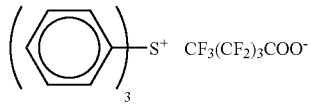

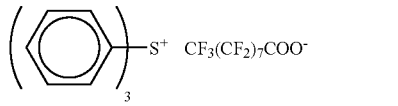

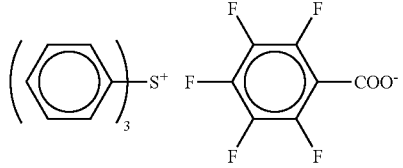

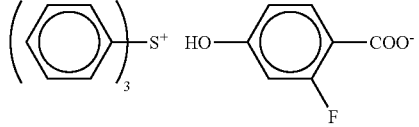

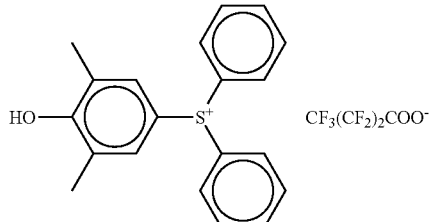

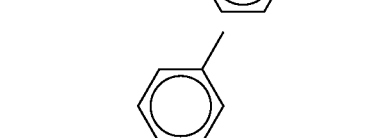

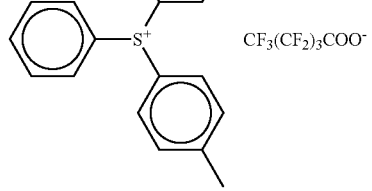

-continued
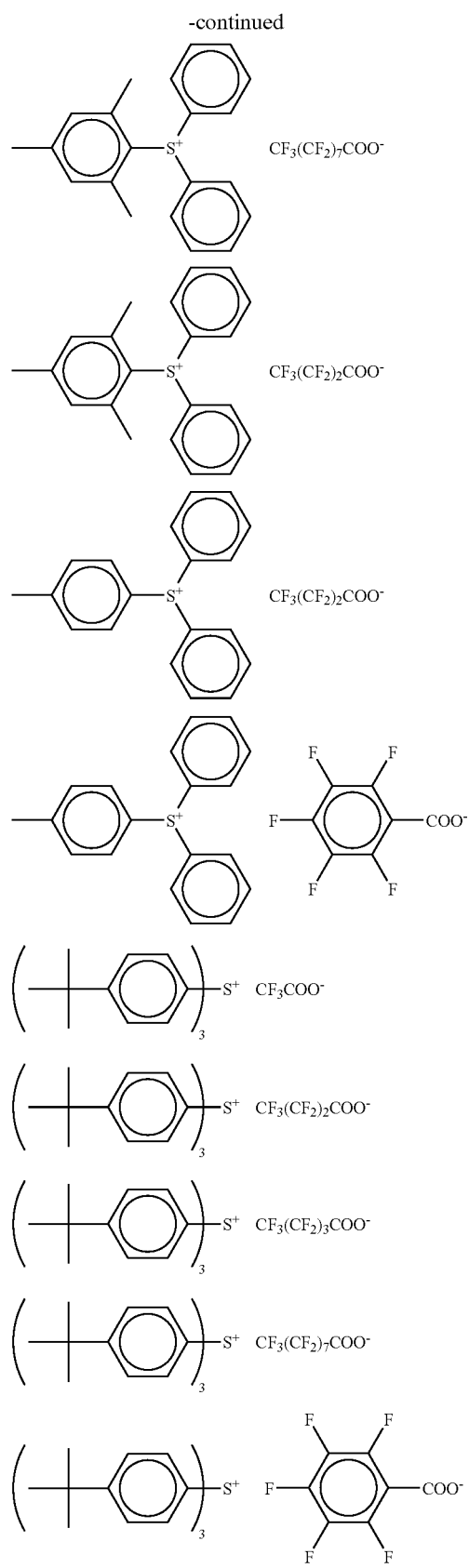
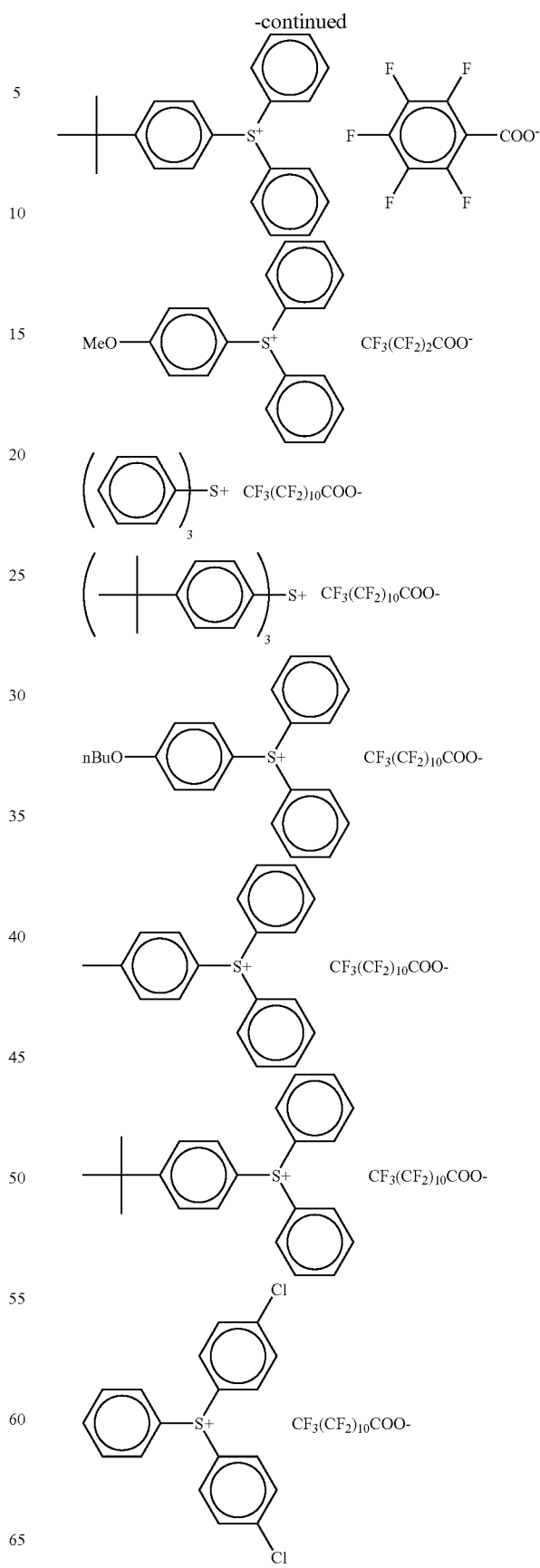

-continued
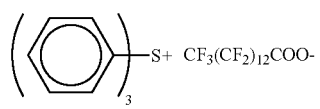
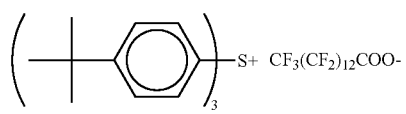
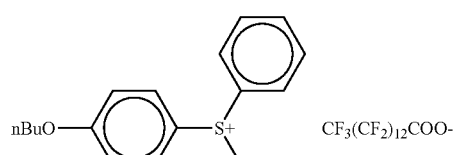
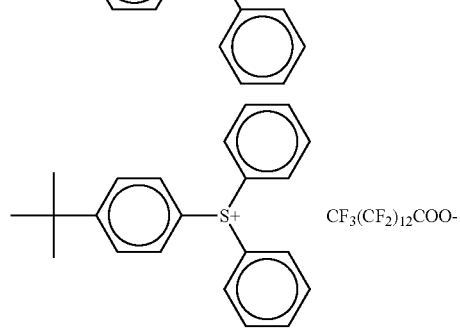
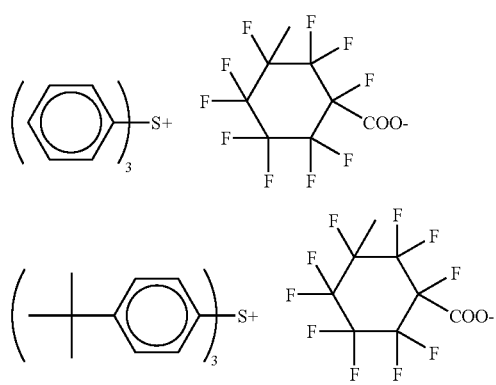
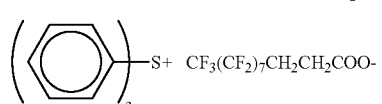
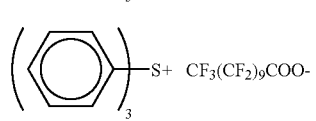
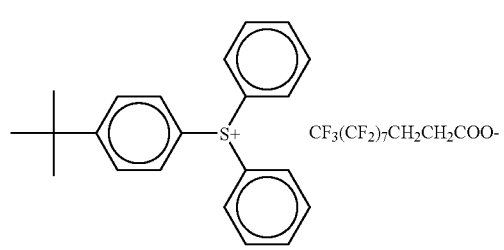
-continued
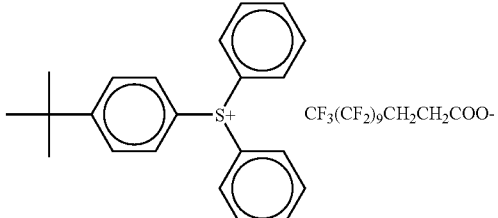
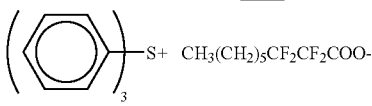
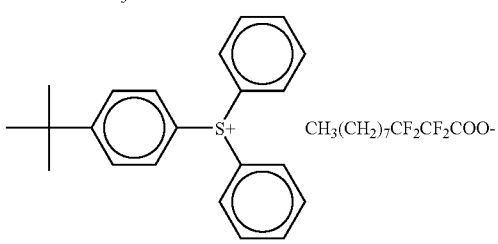
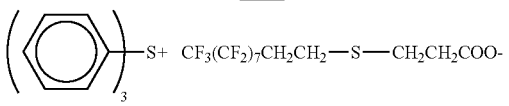
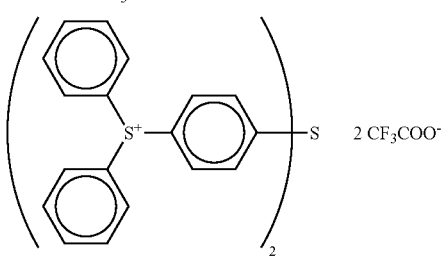
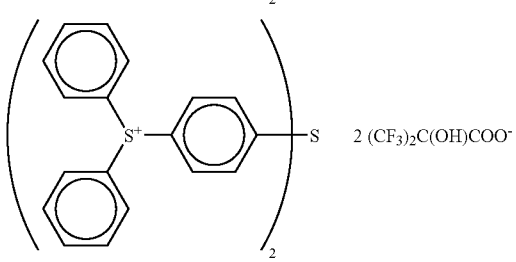
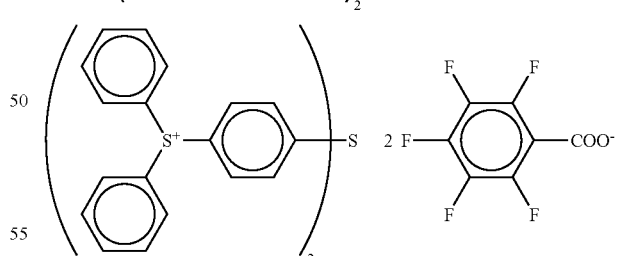
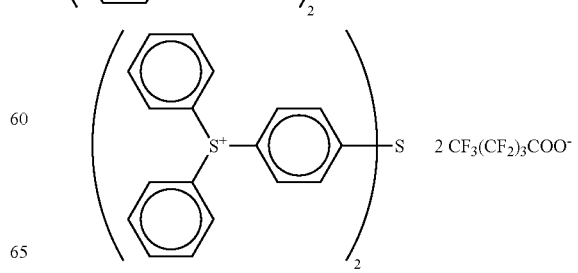

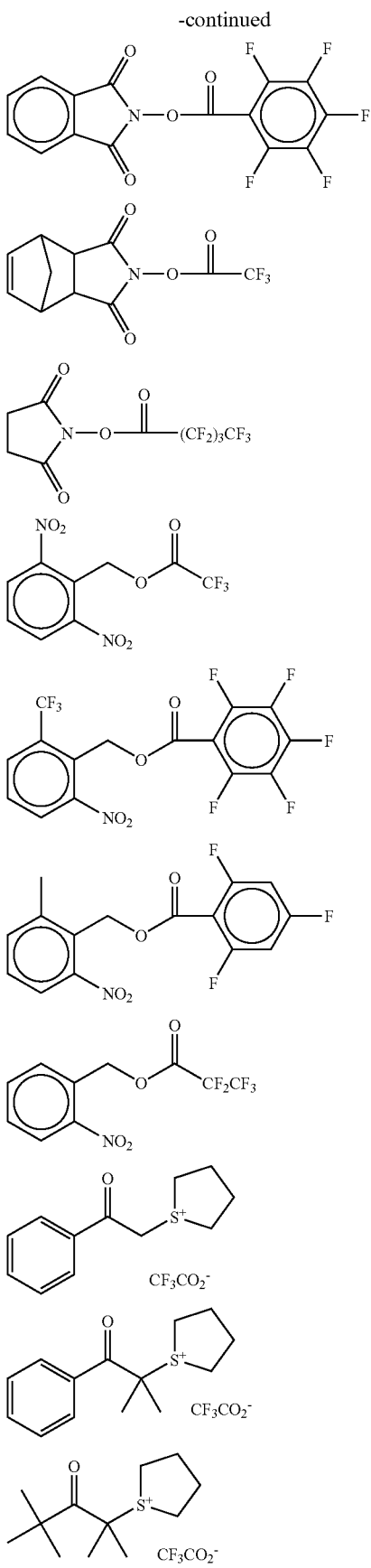
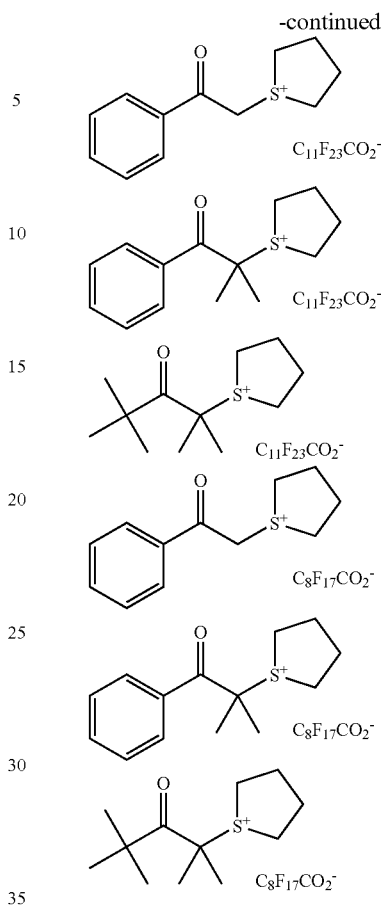

The compound represented by formula (PAG-B3-1) can be synthesized by reacting an aromatic compound with a periodate and subjecting the resulting iodonium salt to salt exchange with a corresponding carboxylic acid.

The compound represented by any one of formulae (PAG-B3-2) and (PAG-B3-3) can be synthesized, for example, by a method comprising reacting an aryl Grignard reagent, e.g., an aryl magnesium bromide with a substituted or unsubstituted phenylsulfoxide and then subjecting the resulting triaryl sulfonium halide to salt exchange with a corresponding carboxylic acid, a method comprising condensing a substituted or unsubstituted phenyl sulfoxide with a corresponding aromatic compound in the presence of an acid catalyst, e.g., methanesulfonic acid/diphosphorus pentaoxide or aluminum chloride and then subjecting the resulting condensate to salt exchange, or a method comprising condensing a diaryl iodonium salt with a diaryl sulfide in the presence of a catalyst, e.g., copper acetate and then subjecting the resulting condensate to salt exchange.

The salt exchange can be conducted by introducing once into a halide, followed by converting to a carboxylate using a silver reagent, e.g., silver oxide, or by using an ion exchange resin. For the salt exchange, a carboxylic acid or carboxylate commercially available or obtained by hydrolysis of a commercially available carboxylic acid halide can be employed.

The fluorine-substituted carboxylic acid as the anion portion is preferably that derived from a fluoro-aliphatic compound produced by a telomerization method (also referred to as a telomer method) or an origomerization method (also referred to as an origomer method). Methods for the production of fluoro-aliphatic compound are described, for example, in Nobuo Ishikawa ed., *Fusso-Kagobutsu no Gosei to Kino* (*Synthesis and Function of Fluorine Compounds*), pages 117 to 118, CMC Publishing Co., Ltd. (1987) and Milos Hudlicky and Attila E. Pavlath ed., *Chemistry of Organic Fluorine Compounds II*, Monograph 187, pages 747 to 752, American Chemical Society (1995). The telomerization method comprises a radical polymerization of a fluorine-containing vinyl compound, e.g., tetrafluoroethylene using an alkyl halide having a large chain transfer constant, e.g., an iodide, as a telogen to synthesize a telomer. In the synthesis according to the telomer method, a mixture of plural compounds having a carbon chain length different from each other are obtained, and the mixture may be used as it is or after purification.

The compound (B4) capable of generating a carboxylic acid containing no fluorine atom upon irradiation of an actinic ray or radiation includes, for example, compounds represented by the following formulae (PAG-B4-1) to (PAG-B4-5):

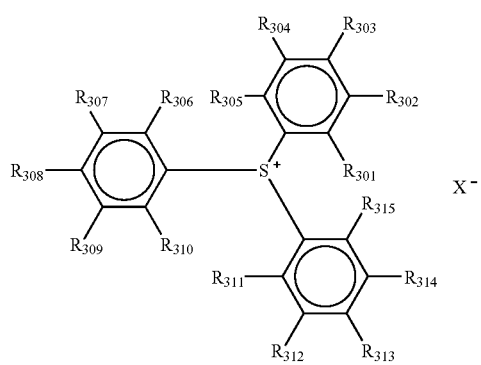
(PAG-B4-1)

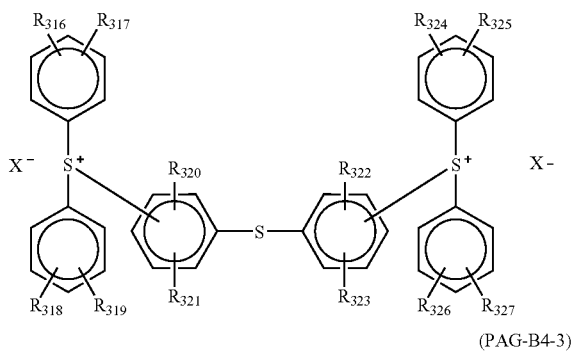
(PAG-B4-2)

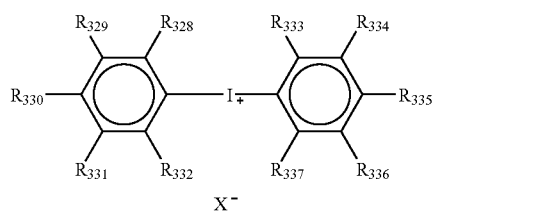
(PAG-B4-3)

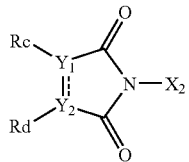
(PAG-B4-4)

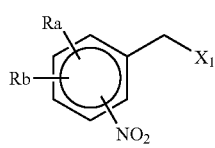
(PAG-B4-5)

In the above formulae, $R_{301}$ to $R_{337}$ each independently represent a hydrogen atom, a straight chain, branched or cyclic alkyl group, a straight chain, branched or cyclic alkoxy group, a hydroxy group, a halogen atom or a group of —S—$R_0$. $R_0$ represents a straight chain, branched or cyclic alkyl group or an aryl group.

$R_a$ and $R_b$ each independently represent a hydrogen atom, a nitro group, a halogen atom, an alkyl group, which may have a substituent or an alkoxy group, which may have a substituent. $R_c$ and $R_d$ each independently represent a halogen atom, an alkyl group, which may have a substituent or an aryl group, which may have a substituent. Alternatively, $R_c$ and $R_d$ may be combined with each other to form an aromatic ring or a monocyclic or polycyclic hydrocarbon ring (the ring may contain an oxygen atom or a nitrogen atom). $Y_1$ and $Y_2$ each represent, a carbon atom, and the $Y_1$—$Y_2$ bond may be a single bond or a double bond. $X^-$ represents an anion of at least one of carboxylic acid compounds represented by formulae shown below. $X_1$ and $X_2$ each independently represent an ester group formed at the carboxy group of at least one of the carboxylic acid compounds represented by formulae shown below.

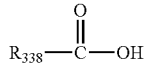
(C1)

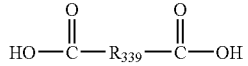
(C2)

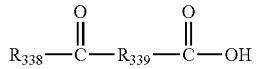
(C3)

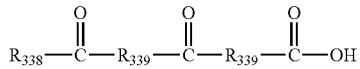
(C4)

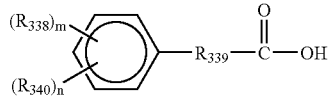
(C5)

-continued

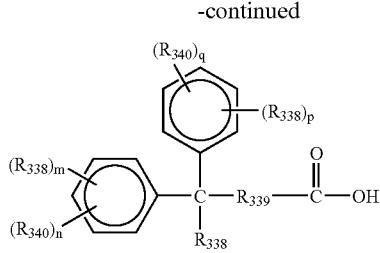
(C6)

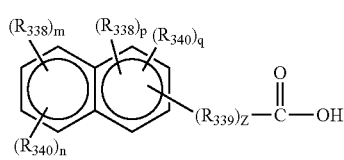
(C7)

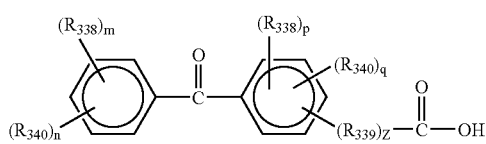
(C8)

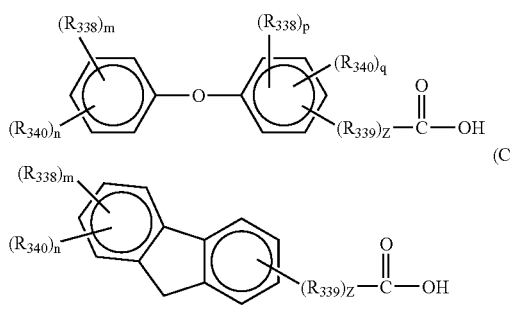
(C9)

(C10)
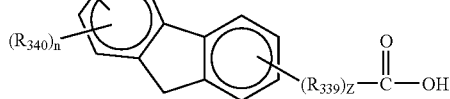

In the above formulae, $R_{338}$ represents a straight chain, branched or cyclic alkyl group having from 1 to 30 carbon atoms (wherein the alkyl group may contain an oxygen atom or a nitrogen atom in the chain thereof), a straight chain, branched or cyclic alkenyl group having from 2 to 20 carbon atoms, a straight chain, branched or cyclic alkynyl group having from 2 to 20 carbon atoms, a straight chain, branched or cyclic alkoxy group having from 1 to 20 carbon atoms, the above alkyl group in which at least a part of the hydrogen atoms is substituted with a halogen atom and/or a hydroxy group, the above alkenyl group in which at least a part of the hydrogen atoms is substituted with a halogen atom and/or a hydroxy group or a substituted or unsubstituted aryl group having from 6 to 20 carbon atoms. Examples of the substituent for the aryl group include an alkyl group, a nitro group, a hydroxy group, an alkoxy group, an acyl group, an alkoxycarbonyl group and a halogen atom.

$R_{339}$ represents a single bond, a straight chain, branched or cyclic alkylene group having from 1 to 20 carbon atoms (wherein the alkylene group may contain an oxygen atom or a nitrogen atom in the chain thereof), a straight chain, branched or cyclic alkenylene group having from 2 to 20 carbon atoms, the above alkylene group in which at least a part of the hydrogen atoms is substituted with a halogen atom and/or a hydroxy group, the above alkenylene group in which at least a part of the hydrogen atoms is substituted with a halogen atom and/or a hydroxy group or an alkoxy-alkylene group having from 2 to 20 carbon atoms. The plural $R_{338}$s and $R_{339}$s may be the same or different from each other.

$R_{340}$ represents a hydroxy group or a halogen atom. The plural $R_{340}$s may be the same or different from each other. m, n, p and q each independently represent an integer of from 0 to 3, provided that m+n≦5 and p+q≦5. z represents 0 or 1.

In formulae (PAG-B4-1) to (PAG-B4-5), the straight chain or branched alkyl group represented by any one of $R_{301}$ to $R_{337}$, $R_a$, $R_b$, $R_c$, $R_d$ and $R_0$ includes that having from 1 to 4 carbon atoms, which may have a substituent, for example, methyl, ethyl, propyl, n-butyl, sec-butyl or tert-butyl group. The cyclic alkyl group includes that having from 3 to 8 carbon atoms, which may have a substituent, for example, cyclopropyl, cyclopentyl or cyclohexyl group.

The alkoxy group represented by any one of $R_{301}$ to $R_{337}$, $R_a$ and $R_b$ includes that having from 1 to 4 carbon atoms, which may have a substituent, for example, methoxy, ethoxy, hydroxyethoxy, propoxy, n-butoxy, isobutoxy, sec-butoxy or tert-butoxy group.

The halogen atom represented by any one of $R_{301}$ to $R_{337}$, $R_a$, $R_b$, $R_e$ and $R_d$ includes, for example, fluorine, chlorine, bromine and iodine atoms.

The aryl group represented by any one of $R_0$, $R_c$ and $R_d$ includes that having from 6 to 14 carbon atoms, which may have a substituent, for example, phenyl, tolyl, methoxyphenyl or naphthyl group.

Examples of the substituents for the above groups preferably include an alkoxy group having from 1 to 4 carbon atoms, a halogen atom (e.g., fluorine, chlorine or iodine atom), an aryl group having from 6 to 10 carbon atoms, an alkenyl group having from 2 to 6 carbon atoms, a cyano group, a hydroxy group, a carboxy group, an alkoxycarbonyl group and a nitro group.

The aromatic ring, or monocyclic or polycyclic hydrocarbon ring (the ring may contain an oxygen atom or a nitrogen atom) formed by combining $R_c$ and $R_d$ includes, for example, benzene, naphthalene, cyclohexane, norbornene and oxabicyclo structures.

The sulfonium or iodonium compound represented by any one of formulae (PAG-B4-1) to (PAG-B4-3) for use in the invention includes as the counter anion represented by X⁻, an anion (—COO⁻) of the carboxy group (—COOH) of at least one of the carboxylic compounds represented by any one of formulae (C1) to (C10) described above.

The compound represented by any one of formulae (PAG-B4-4) to (PAG-B4-5) for use in the invention includes as the substituent $X_1$ or $X_2$, an ester group (—COO—) formed from the carboxy group (—COOH) of at least one of the carboxylic compounds represented by any one of formulae (C1) to (C10) described above.

The straight chain, branched or cyclic alkyl group having from 1 to 30 carbon atoms (wherein the alkyl group may contain an oxygen atom or a nitrogen atom in the chain thereof) represented by $R_{338}$ includes, for example, methyl, ethyl, propyl, butyl, pentyl, hexyl, cyclohexyl, dodecyl, 1-ethoxyethyl and adamantyl groups.

The straight chain, branched or cyclic alkenyl group having from 2 to 20 carbon atoms includes, for example, ethenyl, propenyl, isopropenyl and cyclohexenyl groups.

The straight chain, branched or cyclic alkynyl group having from 2 to 20 carbon atoms includes, for example, ethynyl and propynyl groups.

The straight chain, branched or cyclic alkoxy group having from 1 to 20 carbon atoms includes, for example, methoxy, ethoxy, propyloxy, butoxy, cyclohexyloxy, isobutoxy and dodecyloxy groups.

The substituted or unsubstituted aryl group having from 6 to 20 carbon atoms includes, for example, phenyl, naphthyl and anthryl groups.

The substituent for the aryl group includes, for example, an alkyl group, a nitro group, a hydroxy group, an alkoxy group, an acyl group, an alkoxycarbonyl group and a halogen atom.

The straight chain, branched or cyclic alkylene group having from 1 to 20 carbon atoms (wherein the alkylene group may contain an oxygen atom or a nitrogen atom in the chain thereof) represented by $R_{339}$ includes, for example, methylene, ethylene, propylene, butylene, isobutylene, ethoxyethylene and cyclohexylene groups.

The straight chain, branched or cyclic alkenylene group having from 2 to 20 carbon atoms includes, for example, vinylene and allylene groups.

Specific examples of the compound of Component (B4) are set forth below, but the invention should not be construed as being limited thereto.

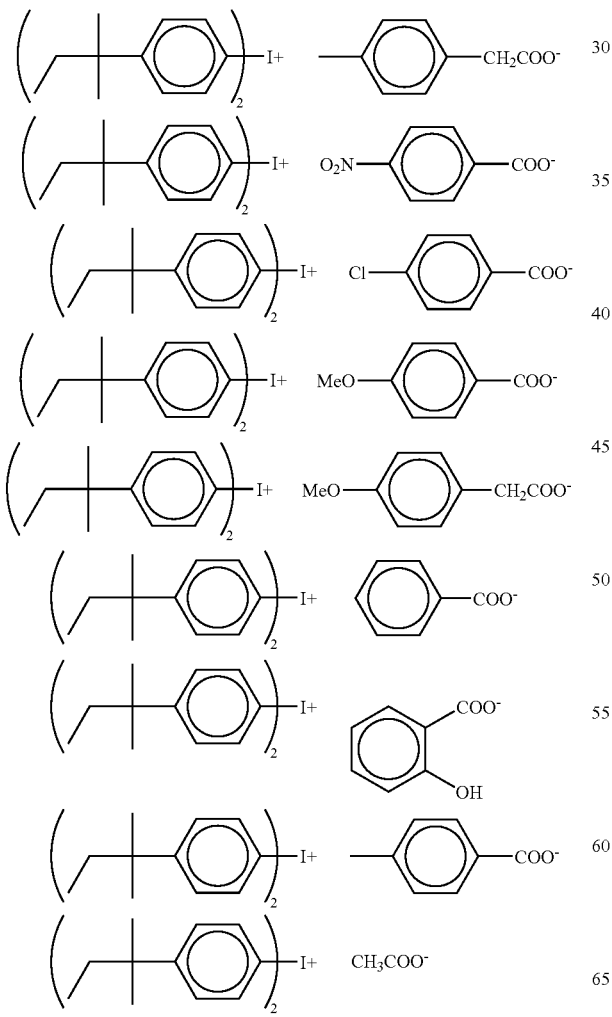

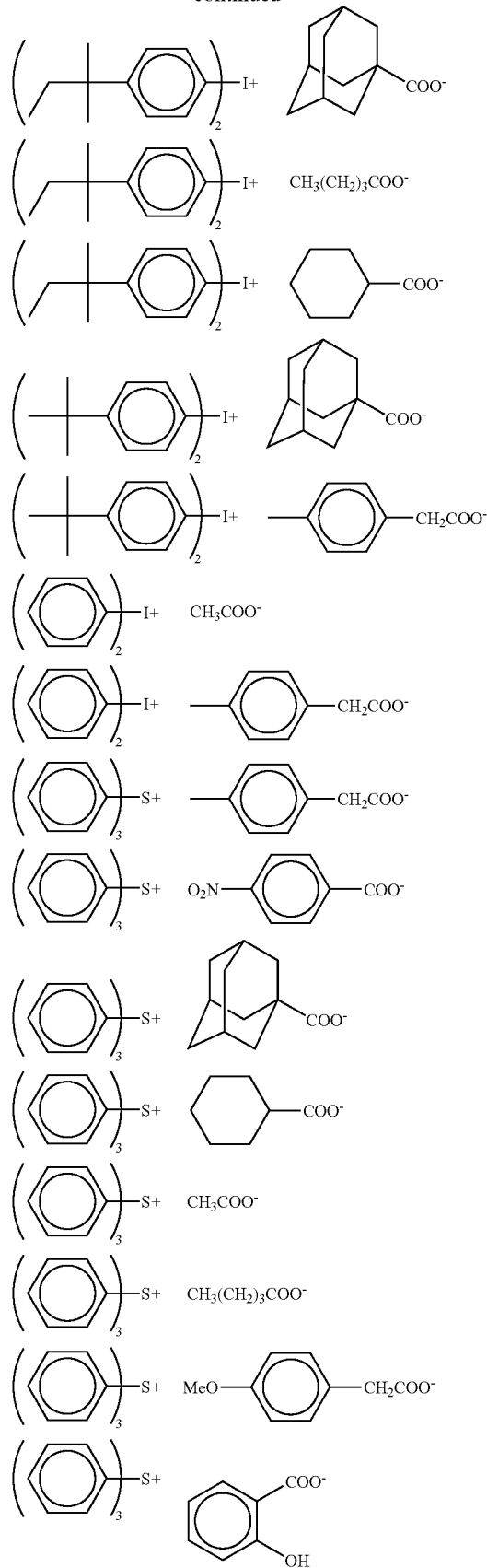

-continued
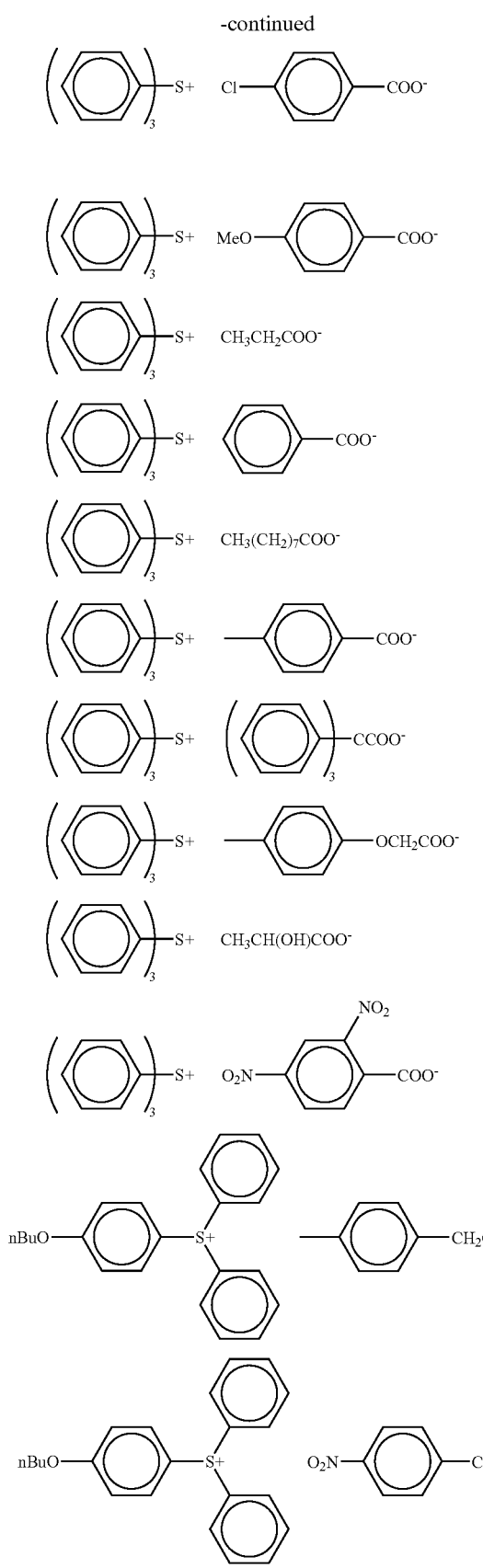
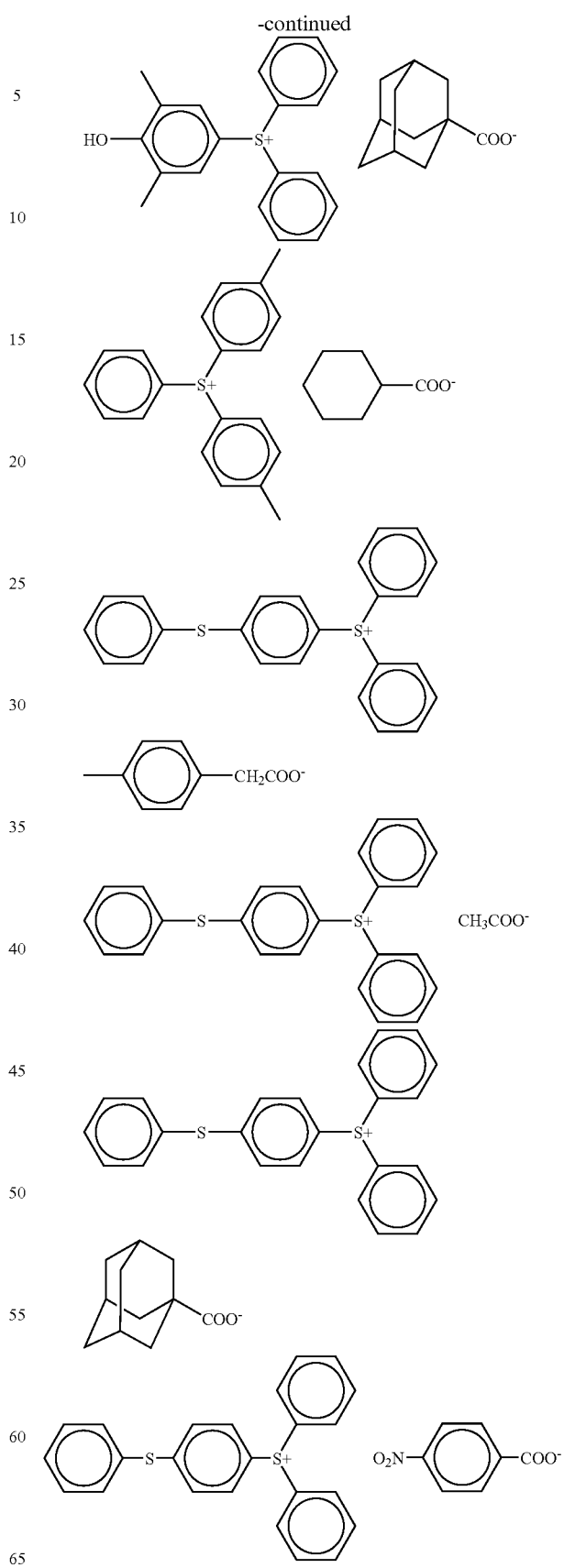

-continued
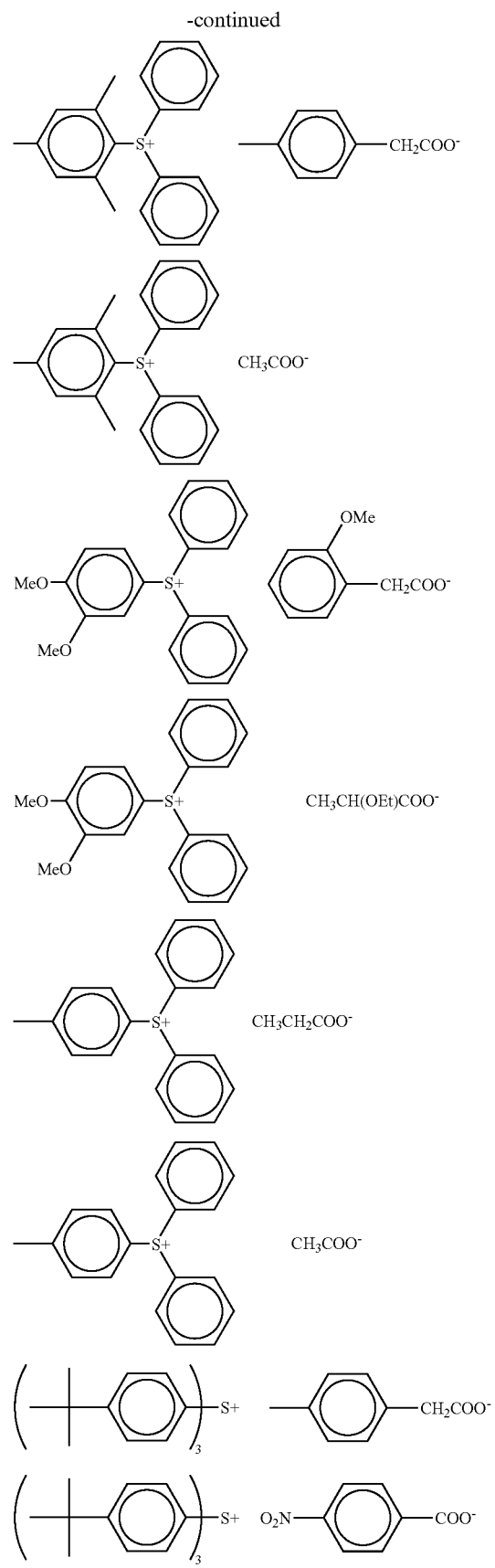
-continued
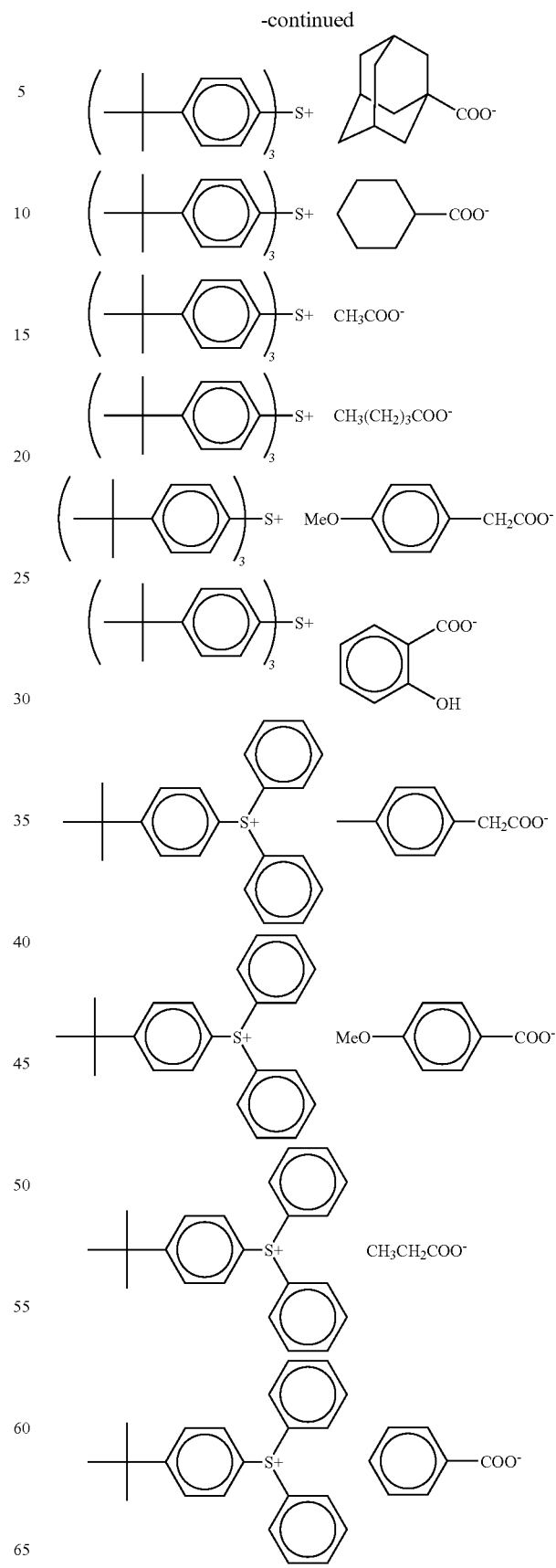

-continued
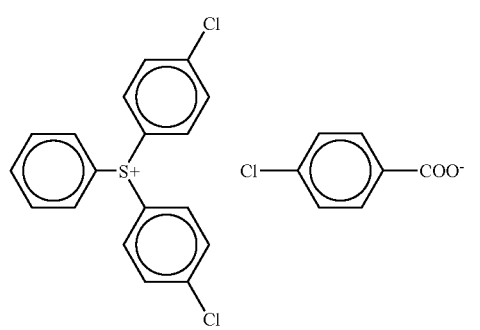
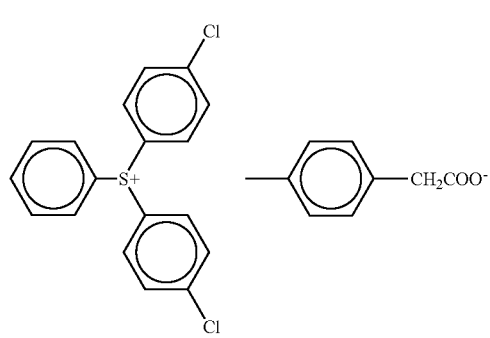
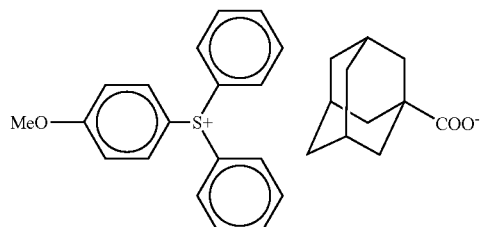
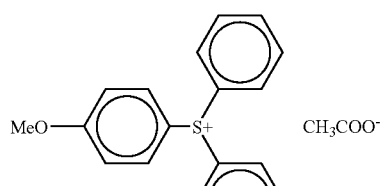
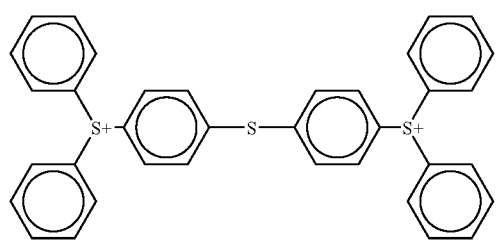
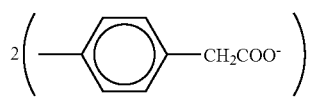
-continued
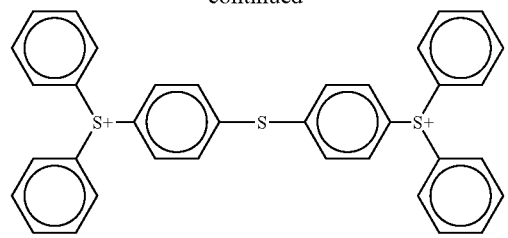
2 CH$_3$COO$^-$
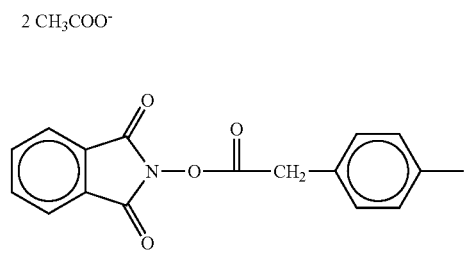
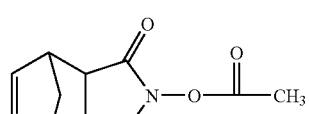
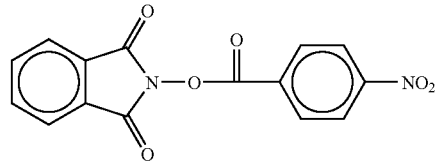
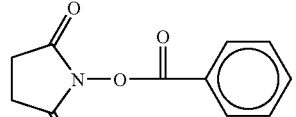
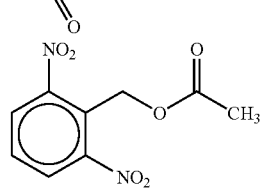
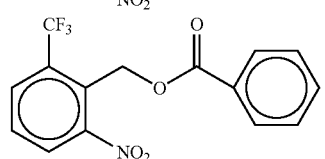
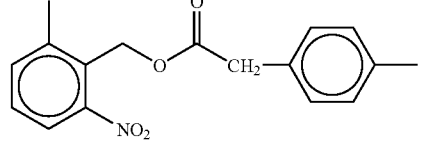
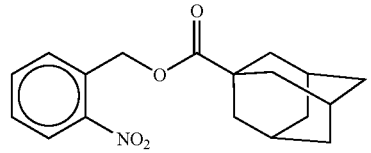

As the compound of Component (B4), a phenacylsulfonium salt having as a counter anion, a carboxylic anion that does not contain a fluorine atom can be used besides the compounds represented by formulae (PAG-B4-1) to (PAG-B4-5).

Specific examples of the phenacylsulfonium salt are set forth below, but the invention should not be construed as being limited thereto.

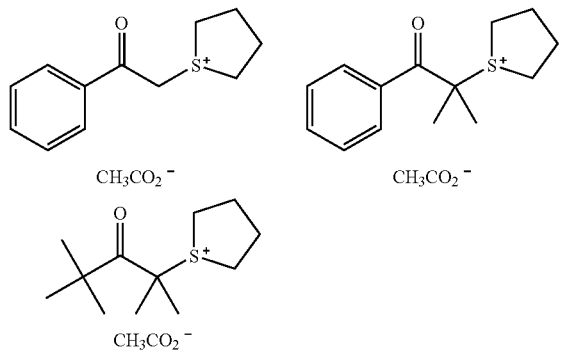

The compounds represented by formulae (PAG-B4-1) to (PAG-B4-3) can be synthesized by using, for example, methods described in U.S. Pat. No. 3,734,928 or methods described in *Macromolecules*, Vol. 10, 1307 (1977), *Journal of Organic Chemistry*, Vol. 55, 4222 (1990) and *J. Radiat. Curing*, Vol. 5(1), 2 (1978), and then exchanging the counter anion. The compounds represented by formulae (PAG-B4-4) to (PAG-B4-5) can be synthesized by reacting an N-hydroxyimide compound with a carboxylic acid chloride under a basic condition, or by reacting nitrobenzyl alcohol with a carboxylic acid chloride under a basic condition.

The total amount of the compounds of Component (B) in the positive resist composition of the invention is ordinarily in a range of from 0.5 to 20% by weight, preferably from 0.75 to 15% by weight, and more preferably from 1 to 10% by weight, based on the total solid content of the resist composition.

[3] (C) Fluorine-based and/or Silicon-Based Surfactant

The positive resist composition of the invention preferably contains one or more of the fluorine-based and/or silicon-based surfactants (C) (including a fluorine atom-containing surfactant, a silicon atom-containing surfactant and a surfactant containing both a fluorine atom and a silicon atom.).

By incorporating the surfactant (C) into the positive resist composition of the invention, a resist patter of favorable adhesion and less development defect can be provided with good sensitivity and resolution, when the positive resist composition is exposed using an exposure light source having a wavelength of 250 nm or shorter, particularly 220 nm or shorter.

Examples of the surfactant (C) include those described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,296,143, 5,294,511 and 5,824,451. Commercially available surfactants described below can also be used as they are.

Examples of the commercially available surfactant, which can be used, include fluorine-based or silicon-based surfactants, e.g., Eftop EF301 and EF303 (manufactured by Shin-Akita Kasei Co., Ltd.), Florad FC430 and 431 (manufactured by Sumitomo 3M Ltd.), Megafac F171, F173, F176, F189 and R08 (manufactured by Dainippon Ink and Chemicals, Inc.), Surflon S-382, SC101, SC102, SC103, SC104, SC105 and SC106 (manufactured by Asahi Glass Co., Ltd.) and Troysol S-366 (manufactured by Troy Chemical Corp.). A polysiloxane polymer KP-341 (manufactured by Shin-Etsu Chemical Co., Ltd.) is also used as the silicon-based surfactant.

Besides the above described known surfactants, a surfactant comprising a polymer including a fluoroaliphatic group derived from a fluoroaliphatic compound produced by a telomerization method (also referred to as a telomer method) or an oligomerization method (also referred to as an oligomer method) can be used as the surfactant. The fluoroaliphatic compound can be synthesized according to methods described in JP-A-2002-90991.

As the polymer including a fluoroaliphatic group, a copolymer of a monomer having a fluoroaliphatic group with (poly(oxyalkylene)) acrylate and/or (poly(oxyalkylene)) methacrylate is preferred. The copolymer may be a random copolymer or a block copolymer. The poly(oxyalkylene) group includes, for example, a poly(oxyethylene) group, a poly(oxypropylene) group and a poly(oxybutylene) group. Also, a unit containing alkylenes having different chain lengths in the chain thereof, for example, poly(oxyethylene-oxypropylene-oxyethylene block connecting group) or poly(oxyethylene-oxypropylene block connecting group) may be used. Further, the copolymer of a monomer having a fluoroaliphatic group with a (poly(oxyalkylene)) acrylate (or methacrylate) may be not only a binary copolymer but also a ternary or more component-containing copolymer obtained by copolymerizing simultaneously two or more different monomers having a fluoroaliphatic group with two or more different (poly(oxyalkylene)) acrylates (or methacrylates).

Examples of the polymer including a fluoroaliphatic group include commercially available surfactants, for example, Megafac F178, F-470, F-473, F-475, F-476 and F-472 (manufactured by Dainippon Ink and Chemicals, Inc.). Also, copolymers of acrylate (or methacrylate) having a $C_6F_{13}$ group and (poly(oxyalkylene)) acrylate (or methacrylate), copolymers of acrylate (or methacrylate) having a $C_6F_{13}$ group, (poly(oxyethylene)) acrylate (or methacrylate) and (poly(oxypropylene)) acrylate (or methacrylate), copolymers of acrylate (or methacrylate) having a $C_8F_{17}$ group and (poly(oxyalkylene)) acrylate (or methacrylate), copolymers of acrylate (or methacrylate) having a $C_8F_{17}$ group, (poly(oxyethylene)) acrylate (or methacrylate) and (poly(oxypropylene)) acrylate (or methacrylate) are exemplified.

The amount of the surfactant (C) used is preferably from 0.0001 to 2% by weight, and more preferably from 0.001 to 1% by weight, based on the total amount of the positive resist composition (excluding a solvent).

[4] Acid Diffusion Preventing Agent (D)

It is preferred that the positive resist composition of the invention contains an acid diffusion preventing agent for the purpose of preventing fluctuations in performances (for example, formation of T-top shaped pattern, fluctuation in sensitivity or fluctuation in linewidth of pattern) with the lapse of time between the irradiation of an active ray or radiation and a heat treatment, fluctuations in performances with the lapse of time after coating, or excessive diffusion of acid at the heat treatment after the irradiation of an active ray or radiation, which results in deterioration of the resolution. AS the acid diffusion preventing agent, an organic basic compound, for example, an organic basic compound containing a basic nitrogen atom, and preferably a compound exhibiting pKa of a conjugated acid of not less than 4 is used.

Specifically, compounds having a structure represented by any one of formulae (A) to (E) shown below are used.

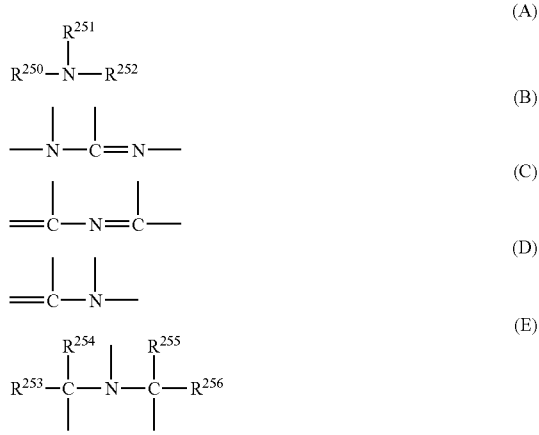

In the above formulae, $R^{250}$, $R^{251}$ and $R^{252}$, which may be the same or different, each represent a hydrogen atom, an alkyl group having from 1 to 20 carbon atoms or a substituted or unsubstituted aryl group having from 6 to 20 carbon atoms, or $R^{251}$ and $R^{252}$ may be combined with each other to form a ring.

The alkyl group may be unsubstituted or may have a substituent, and the alkyl group having a substituent preferably includes an aminoalkyl group having from 1 to 6 carbon atoms and a hydroxyalkyl group having from 1 to 6 carbon atoms.

$R^{253}$, $R^{254}$, $R^{255}$ and $R^{256}$ which may be the same or different, each represent an alkyl group having from 1 to 6 carbon atoms.

More preferred compounds are nitrogen-containing basic compounds having two or more nitrogen atoms having different chemical circumstances per molecule, and particularly preferred compounds are compounds having both a substituted or unsubstituted amino group and a cyclic structure containing a nitrogen atom and compounds having an alkylamino group.

Preferred examples of the organic basic compound include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted imidazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines and substituted or unsubstituted aminoalkylmorpholines. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Particularly preferred examples of the organic basic compound include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aininopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine. However, the organic basic compounds for use in the invention should not be construed as being limited to these compounds.

The organic basic compounds may be used individually or as a mixture of two or more thereof.

A ratio of the acid generator to the organic basic compound (acid generator)/(organic basic compound) by mole used in the positive resist composition is preferably from 2.5 to 300. When the molar ratio is 2.5 or more, the sensitivity increases. On the other hand, when it is 300 or less, increase in pattern size of resist is restrained and resolution is improved. The molar ratio of (acid generator)/(organic basic compound) is preferably from 5.0 to 200, and more preferably from 7.0 to 150.

[5] Other Components

[Solvent]

The positive resist composition of the invention is used by dissolving the above-described components in a solvent that can dissolve the components, and coating the resulting solution on a substrate. Examples of the solvent used include 1-methoxy-2-propanol acetate (propylene glycol monomethyl ether acetate), 1-methoxy-2-propanol (propylene glycol monomethyl ether), ethylene dichloride, cyclohexanone, cyclopentanone, 2-heptanone, y-butyrolactone, methyl ethyl ketone, ethylene glycol monomethyl ether, ethylene glycol monoethyl ether, 2-methoxyethyl acetate, ethylene glycol monoethyl ether acetate, propylene glycol monoethyl ether, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. 1-Methoxy-2-propanol acetate and 1-methoxy-2-propanol are particularly preferred. The solvents may be used individually or as a mixture of two or more thereof. When the solvents are used as a mixture, those containing 1-methoxy-2-propanol acetate and those containing 1-methoxy-2-propanol are preferred.

[6] Non-polymer Dissolution Inhibiting Agent (X)

The positive resist composition of the invention preferably contains a non-polymer dissolution inhibiting agent. The term "non-polymer dissolution inhibiting agent" as used herein means a compound that has a molecular weight of not more than 3,000 and at least two acid-decomposable groups and increases solubility in an alkali developing solution by the action of an acid. Particularly, a compound having a fluorine atom substituted in the mother nucleus is preferred in view of transparency.

The amount of the non-polymer dissolution inhibiting agent added is preferably from 3 to 50% by weight, more preferably from 5 to 40% by weight, and still more from 7 to 30% by weight, based on the resin (A) in the resist composition. By incorporating Component (X) into the resist composition, sensitivity and contrast are more improved.

Specific examples of the compound of Component (X) are set forth below, but the invention should not be construed as being limited thereto.

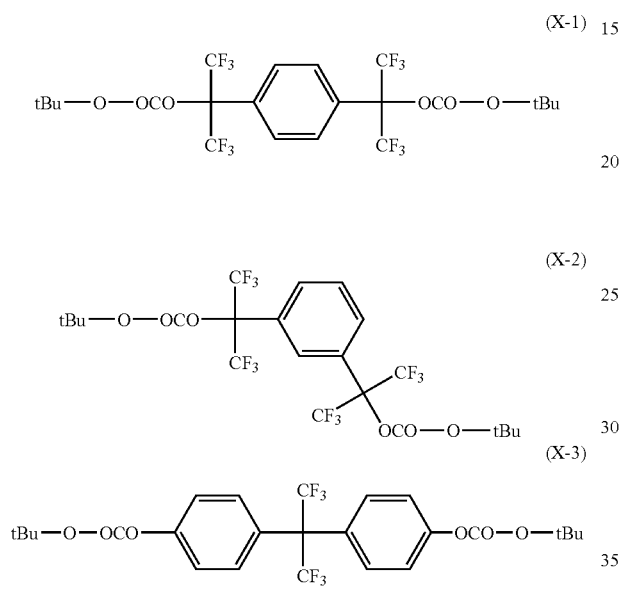

The steps of pattern formation on a resist film, for example, in the production of precise integrated circuit devices, comprises applying the positive resist composition of the invention to a substrate (for example, silicon/silicon dioxide coating, a transparent substrate, e.g., glass substrate or ITO substrate), irradiating the resist film using an actinic ray or radiation drawing apparatus, followed by heating, developing, rinsing and drying. Thus, good resist patterns are obtained.

The alkali developing solution, which can be used for the positive resist composition of the invention, is an aqueous solution of alkali, for example, an inorganic alkali, e.g., sodium hydroxide, potassium hydroxide, sodium carbonate, sodium silicate, sodium metasilicate or aqueous ammonia; a primary amine, e.g., ethylamine or n-propylamine; a secondary amine, e.g., diethylamine or di-n-butylamine; a tertiary amine, e.g., triethylamine or methyldiethylamine; an alcohol amine, e.g., dimethylethanolamine or triethanolamine; a quaternary ammonium salt, e.g., tetramethylammonium hydroxide, tetraethylammonium hydroxide or choline; and a cyclic amine, e.g., pyrrole or piperidine. A developing solution prepared by adding an appropriate amount of an alcohol, for example, isopropyl alcohol or a surfactant, for example, a nonionic surfactant, to the above-described aqueous solution of alkali is also used.

Of the alkali developing solutions, those containing a quaternary ammonium salt are preferred and, those containing tetramethylammonium hydroxide or choline are more preferred.

The alkali concentration of the alkali developing solution is ordinarily from 0.1 to 20% by weight, preferably from 0.2 to 15% by weight, and more preferably from 0.5 to 10% by weight.

The pH of the alkali developing solution is ordinarily from 10.0 to 15.0, preferably from 10.5 to 14.5, and more preferably from 11.0 to 14.0.

The present invention will be described in more detail with reference to the following examples, but the invention should not be construed as being limited thereto.

(1) Synthesis of Intermediate (M-1)

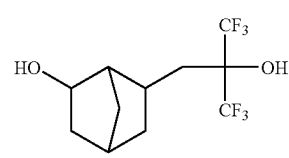

In 150 g of tetrahydrofuran was dissolved by stirring 154.65 g (0.564 mol) of 5-[2,2-bis(trifluoromethyl)-2-hydroxyethyl]bicyclo[2.2.1]hept-2-ene and to the solution was added dropwise 750 ml of borane-tetrahydrofuran complex (1.0 M solution) under cooling over a period of one hour. After the completion of the dropwise addition, the mixture was further stirred for 2 hours, and 282 g of sodium hydroxide solution (40% by weight) was added thereto and then 241.2 g of hydrogen peroxide (30% by weight aqueous solution) was added dropwise over a period of one hour. After the completion of the dropwise addition, the mixture was further stirred for 3 hours. The resulting mixture was neutralized with aqueous hydrochloric acid solution and 600 g of ethyl acetate was added thereto to conduct separation procedure. The organic layer was dehydrated with 50 q of magnesium sulfate, and the solvent was distilled off. The product was purified by silica gel chromatography to obtain 70.87 g (yield: 43%) of Intermediate (M-1).

(2) Synthesis of Intermediate (M-2)

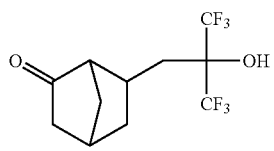

In 450 ml of N,N-dimethylformamide was dissolved by stirring 99.25 g (0.264 mol) of pyridinium dichlomate (PDC) and to the solution was added dropwise 300 ml of a solution of N,N-dimethylformamide containing 70 g of Intermediate (M-1) under cooling. After the completion of the dropwise addition, the mixture was further stirred for 2 hours. The resulting mixture was subjected to separation procedure with ethyl acetate/water. The organic layer was dehydrated with 70 g of magnesium sulfate, and the solvent was distilled off. The product was purified by silica gel chromatography to obtain 46.57 g (yield: 67%) of Intermediate (M-2).

(3) Synthesis of Intermediate (M-3)

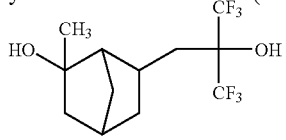

In 200 ml of dehydrated tetrahydrofuran was dissolved by stirring 45 g (0.155 mol) of Intermediate (M-2) and to the solution was added dropwise 450 ml a tetrahydrofuran solution (1.0 M) of methyl magnesium bromide over a period of 2 hours. After the completion of the dropwise addition, the mixture was further stirred at 0° C. for 4 hours. The resulting mixture was neutralized with aqueous hydrochloric acid solution and then subjected to separation procedure with ethyl acetate/water. The organic layer was dehydrated with 50 g of magnesium sulfate, and the solvent was distilled off. The product was purified by silica gel chromatography to obtain 37.53 g (yield: 79%) of Intermediate (M-3).

(4) Synthesis of Intermediate (M-4)

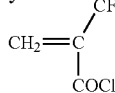

A mixture of 140.1 g (1.0 mol) α-trifluoromethylacrylic acid and 304.5 g (1.5 mol) of phthalic acid dichloride were heated at 90° C. and stirred for 3 hours. Then, the mixture was distilled under a reduced pressure of 140 to 120 mmHg and a fraction of 50±4° C. was collected to obtain 107.8 g (yield: 68%) of Intermediate (M-4).

(5) Synthesis of Monomer (A)

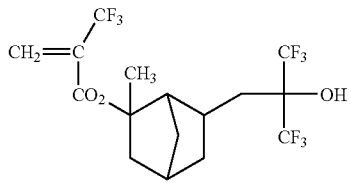

In 150 ml of dehydrated tetrahydrofuran were dissolved 35 g (0.114 mol) of Intermediate (M-3) and 9.94 g (0.126 mol) of pyridine and to the solution was added dropwise 70 ml of a dehydrated tetrahydrofuran solution containing 19.92 g (0.126 mol) of Intermediate (M-4) over a period of one hour under cooling. After the completion of the dropwise addition, the mixture was further stirred at 0° C. for 3 hours. The resulting mixture was neutralized with aqueous sodium hydrogen carbonate solution and then subjected to separation procedure with ethyl acetate/water. The organic layer was dehydrated with 15 g of magnesium sulfate, and the solvent was distilled off. The product was purified by silica gel chromatography to obtain 31.8 g (yield: 65%) of Monomer (A).

(6) Synthesis of Resin (A-1)

Monomer (A) (25.70 g) (0.06 mol) and 10.97 g (0.04 mol) of 5-[2,2-bis(trifluoromethyl)-2-hydroxyethyl]bicyclo [2.2.1]hept-2-ene were put in a reaction vessel. After nitrogen substitution in a reaction system, 0.248 g (0.001 mol) of a polymerization initiator (V-65, manufactured by Wako Pure Chemical Industries, Ltd.) was added and the mixture was heated at 65° C. with stirring while flowing nitrogen gas in the reaction system. Further, 0.248 g of V-65 was each added after 2 hours, 4. hours, 6 hours and 8 hours and the heating with stirring was conducted for 20 hours in total. Then, the reaction solution was cooled to room temperature and added dropwise to 2 liters of hexane. The powder deposited was collected by filtration and dried at 50° C. under a reduced pressure to obtain 15.77 g (yield: 43%) of powder. The weight average molecular weight of the powder measured by gel permeation chromatography (GPC) was 13,800, and the degree of dispersion thereof was 1.47. A composition ratio of Monomer (A)/5-[2,2-bis(trifluoromethyl)-2-hydroxyethyl]bicyclo[2.2.1]hept-2-ene according to 1H-NMR, 13C-NMR and 19F-NMR analysis was 62/38.

Resins (A-2) to (A-14) and Comparative Resin (1) were obtained in the same manner as described above except for changing the monomers used, respectively.

TABLE 1

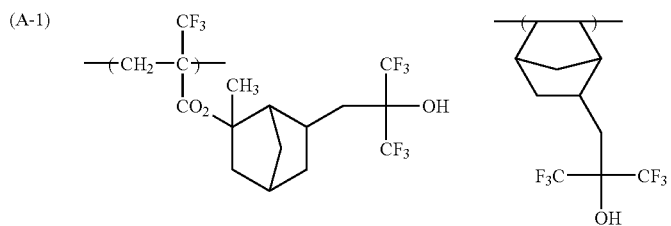

(A-1)

TABLE 1-continued
(A-2) 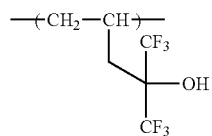 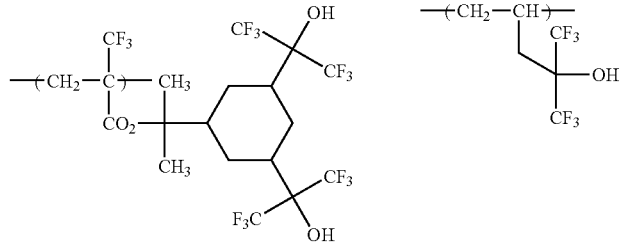
(A-3) 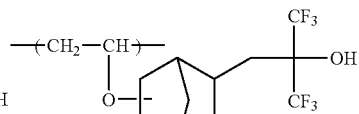 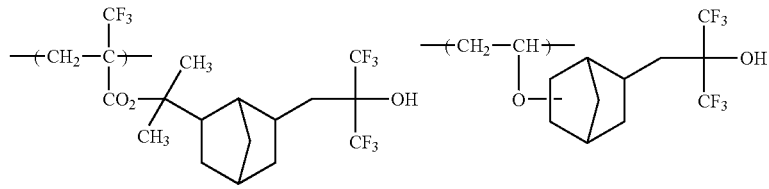
(A-4)  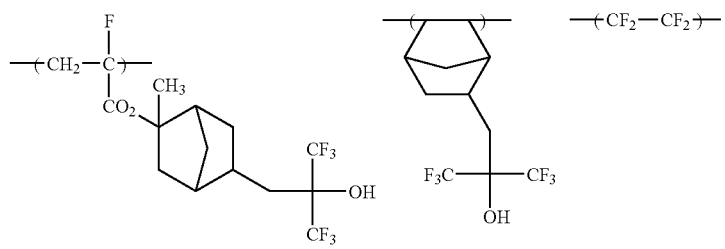 
(A-5)  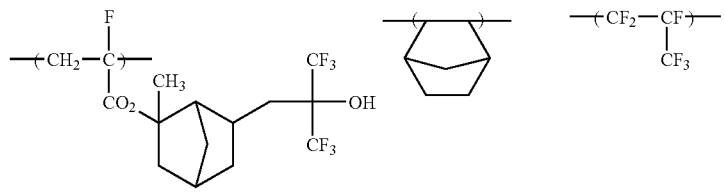 
(A-6) 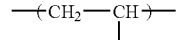 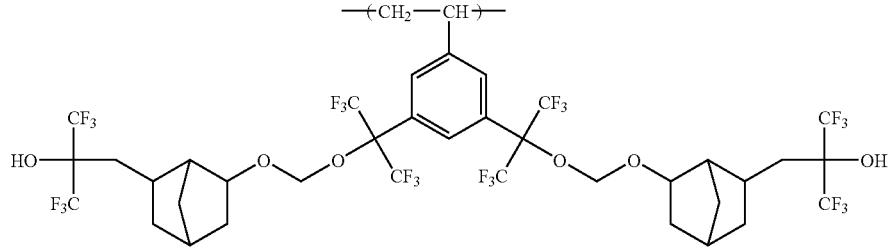 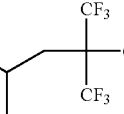
(A-7) 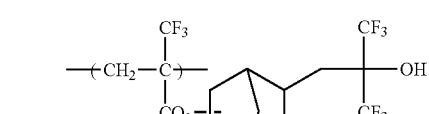 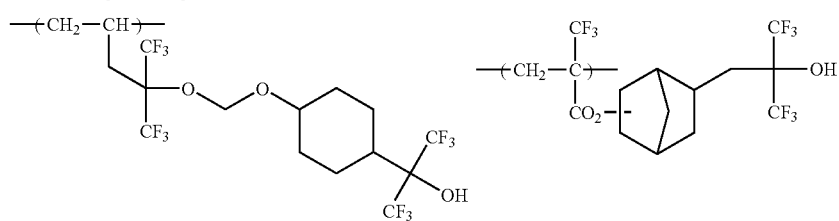 

TABLE 1-continued
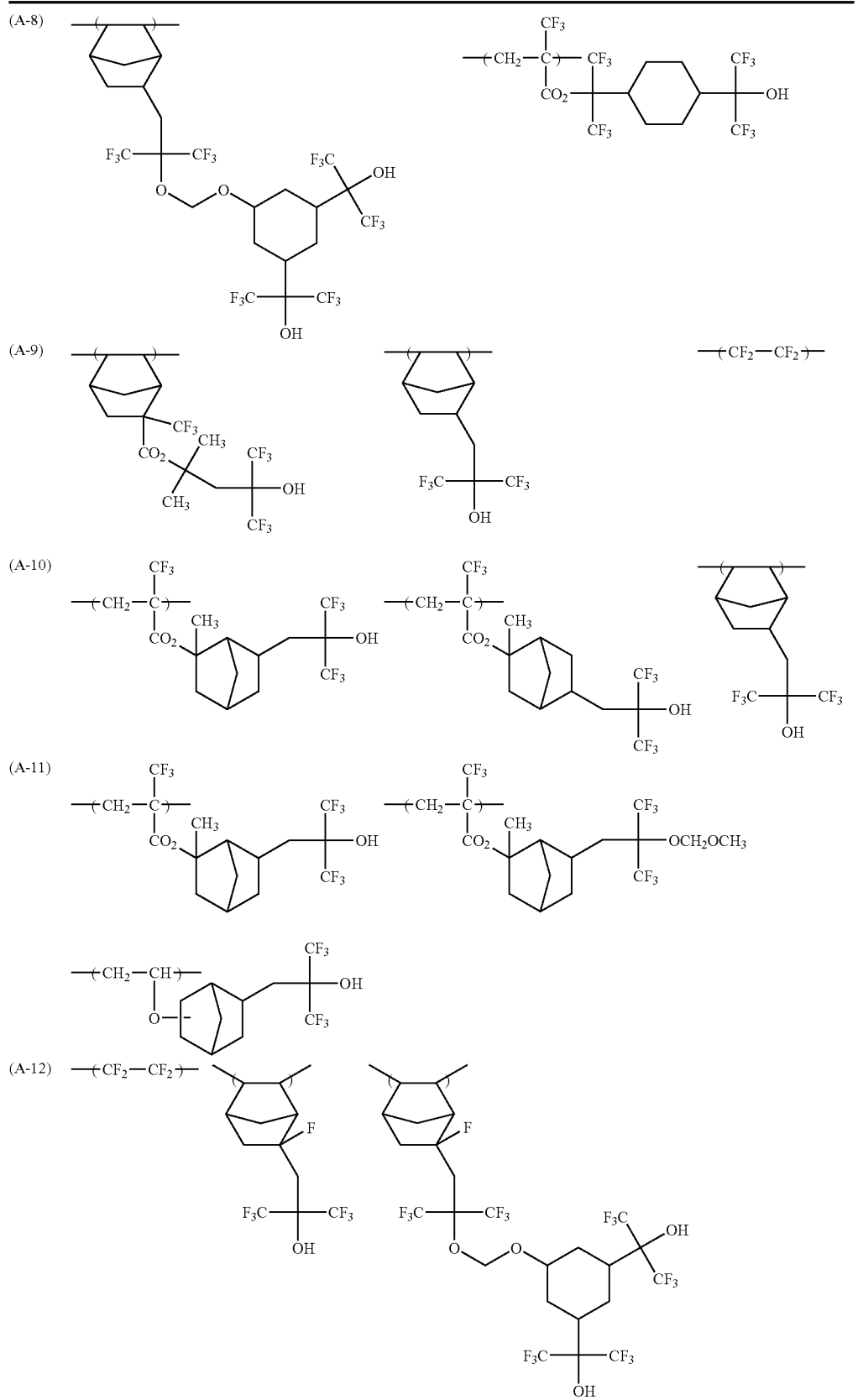

TABLE 1-continued

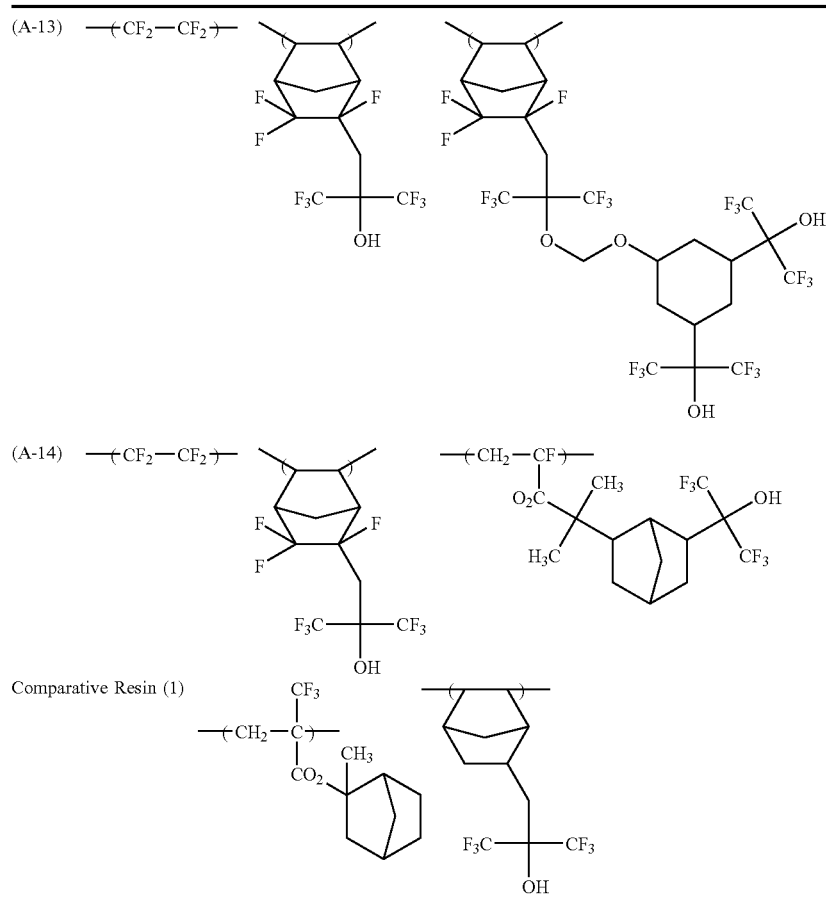

| | Monomer Composition (from left side of structural formula) | | | Molecular | Degree of |
|---|---|---|---|---|---|
| | First Component | Second Component | Third Component | Weight (Mw) | Dispersion (Mw/Mn) |
| Resin (A-1) | 62 | 38 | — | 13,800 | 1.47 |
| Resin (A-2) | 59 | 41 | — | 10,500 | 1.54 |
| Resin (A-3) | 55 | 45 | — | 12,500 | 1.68 |
| Resin (A-4) | 38 | 45 | 17 | 8,900 | 1.45 |
| Resin (A-5) | 31 | 43 | 26 | 10,200 | 1.59 |
| Resin (A-6) | 43 | 57 | — | 21,000 | 1.40 |
| Resin (A-7) | 41 | 59 | — | 15,100 | 1.43 |
| Resin (A-8) | 42 | 58 | — | 11,000 | 1.52 |
| Resin (A-9) | 33 | 37 | 30 | 8,500 | 1.44 |
| Resin (A-10) | 49 | 12 | 40 | 12,000 | 1.50 |
| Resin (A-11) | 33 | 32 | 45 | 16,300 | 1.55 |
| Resin (A-12) | 48 | 22 | 30 | 8,600 | 1.40 |
| Resin (A-13) | 51 | 20 | 29 | 9,500 | 1.38 |
| Resin (A-14) | 30 | 40 | 30 | 10,500 | 1.41 |
| Comparative Resin (1) | 58 | 42 | — | 9,200 | 1.41 |

EXAMPLES 1 TO 14 AND COMPARATIVE EXAMPLES 1 TO 2, 5 TO 6 AND 10 TO 11

[Preparation of Resist Solution]

Resin (A); 1.2 g; Acid Generator-1: 0.12 mmol; Acid Generator-2: 8 µmol; Surfactant (C): 100 ppm of the resulting solution; Basic Compound (D): 10 µmol per the resulting solution in case of adding no Acid-Generator (B-b) or 1 µmol per the resulting solution in case of adding Acid-Generator (B-b); and Non-Polymer Dissolution Inhibiting Agent (X); 0.24 g were dissolved in 19.6 g of a solvent as shown in Table 2 below, and the resulting solution was filtered through a Teflon filter having a pore size of 0.1 µm to prepare a positive resist solution.

[Exposure Evaluation]

On a silicon wafer which had been coated a anti-reflective coating (DUV30J, manufactured by Brewer Science, Inc.), the positive resist solution described above was uniformly coated by a spin coater and dried by heating at 120° C. for 90 seconds to form a resist film having a thickness of 0.1 µm. The resist film was subjected to pattern exposure using an F2 laser microstepper through a line and space mask and immediately after the exposure, it was heated at 130° C. for 90 seconds on a hot plate. Then, the resist film was developed with a 2.38% by weight aqueous solution of tetramethylammonium hydroxide at 23° C. for 60 seconds, rinsed with pure water for 30 seconds and dried. With the pattern on the silicon wafer thus-obtained, resist performances were evaluated in the manner shown below. The results obtained are shown in Table 2 below.

[Number of Development Defect]

A number of development defect occurred on the whole surface of 6-inch wafer pattern-formed as above was measured by an apparatus (KLA-2112 manufactured by KlA Tencor Corp.). The primary datum value was designated as the number of development defect.

[Evaluation of Development Residue (Scum)]

A line and space (1:1) pattern of mask linewidth of 0.10 µm on the above-described wafer was observed using a critical dimension scanning electron microscope (S-9220, manufactured by Hitachi, Ltd.) and degree of the development residue was evaluated according to the following criteria:

○: Development residue was not observed.
Δ: Development residue was somewhat observed.
X: Substantial amount of development residue was observed.

[Evaluation of DOF (Defocus Latitude)]

A width of focus (µm) capable of reproducing line pattern of 0.20 µm in an exposure amount necessary for reproducing 0.20-µm line and space (1/1) pattern in the above-described wafer was observed using a critical dimension scanning electron microscope (S-9220, manufactured by Hitachi, Ltd.) to determine the defocus latitude (DOF).

The abbreviations of the acid generators described in Table 2 indicate the following compounds, respectively.

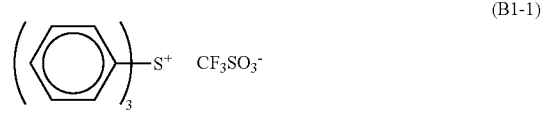

(B1-1)

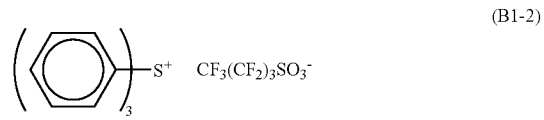

(B1-2)

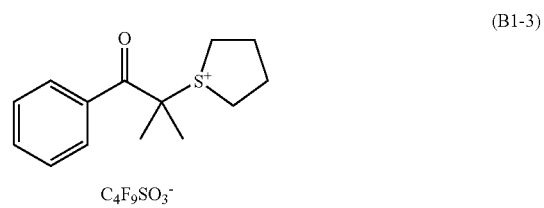

(B1-3)

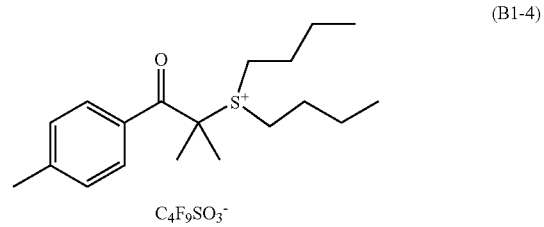

(B1-4)

TABLE 2

| | Resin [A] | Acid Generator-1 | Acid Generator-2 | Solvent [weight ratio] | [C] Surfactant | [D] Basic Compound | [X] Dissolution Inhibiting Agent | Development Defect | Scum | DOF [µm] |
|---|---|---|---|---|---|---|---|---|---|---|
| Example 1 | A-1 | B1-2 | B3-2 | S-2 | D-1 | — | — | 40 | ○ | 0.8 |
| Example 2 | A-2 | B1-4 | B3-1 | S-2/S-3 (80/20) | D-2 | — | — | 30 | ○ | 0.8 |
| Example 3 | A-3 | B1-2 | B4-1 | S-2 | D-2 | — | — | 40 | ○ | 0.8 |
| Example 4 | A-4 | B1-2 | B4-4 | S-2/S-1 (80/20) | D-1 | N-2 | — | 50 | ○ | 0.8 |
| Example 5 | A-5 | B1-1 | B4-2 | S-2 | D-2 | N-3 | X-1 | 40 | ○ | 0.8 |
| Example 6 | A-6 | B2-2 | B4-3 | S-2 | D-2 | — | X-2 | 40 | ○ | 0.9 |
| Example 7 | A-7 | B2-1 | B4-4 | S-2 | D-2 | — | — | 20 | ○ | 0.8 |
| Example 8 | A-8 | B2-3 | B4-1 | S-2 | D-1 | — | — | 40 | ○ | 0.8 |
| Example 9 | A-9 | B1-3 | B3-2 | S-2/S-3 (80/20) | D-1 | N-2 | X-3 | 50 | ○ | 0.7 |
| Example 10 | A-10 | B1-2 | B3-3 | S-2 | D-1 | — | — | 20 | ○ | 0.8 |
| Example 11 | A-11 | B1-2 | B4-1 | S-2 | D-2 | — | — | 50 | ○ | 0.8 |
| Example 12 | A-12 | B1-2 | B4-4 | S-2 | D-1 | — | — | 37 | ○ | 0.8 |
| Example 13 | A-13 | B2-3 | B3-2 | S-2/S-1 (80/20) | D-1 | N-2 | — | 31 | ○ | 0.8 |
| Example 14 | A-14 | B1-3 | B3-1 | S-2 | D-2 | — | — | 36 | ○ | 0.8 |
| Comparative Example 1 | Comparative Resin [1] | B1-2 | — | S-2 | D-1 | N-2 | — | 16,000 | X | 0.2 |
| Comparative Example 2 | Comparative Resin [1] | B1-2 | B4-1 | S-2 | D-1 | N-2 | — | 15,500 | X | 0.2 |
| Comparative Example 5 | A-3 | B1-2 | — | S-2 | D-2 | N-1 | — | 250 | Δ | 0.4 |
| Comparative Example 6 | A-4 | B1-2 | — | S-2/S-1 (80/20) | D-1 | N-2 | — | 300 | Δ | 0.5 |
| Comparative Example 9 | A-7 | B2-1 | — | S-2 | D-2 | N-2 | — | 450 | Δ | 0.4 |
| Comparative Example 10 | A-8 | B2-3 | — | S-2 | D-1 | N-3 | — | 400 | Δ | 0.4 |

-continued (B2-1)
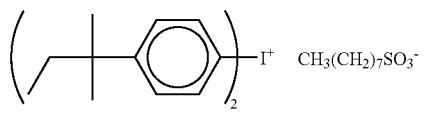

(B2-2)
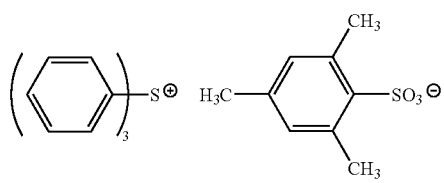

(B2-3)
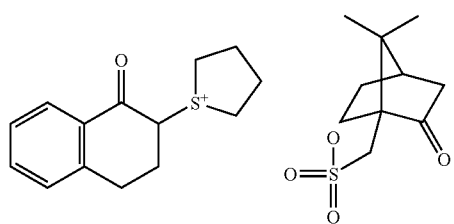

(B3-1)
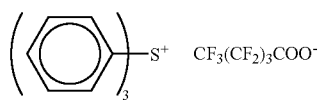

(B3-2)
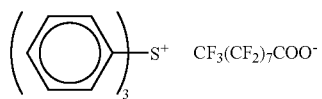

(B3-3)
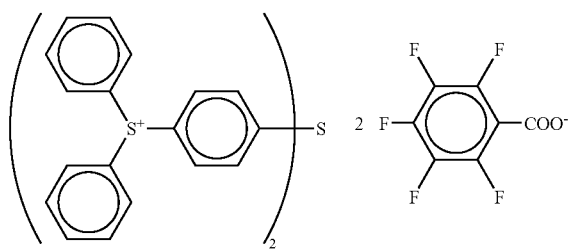

(B4-1)
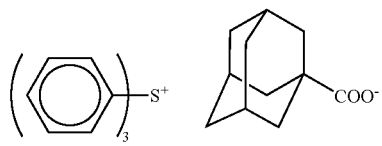

(B4-2)
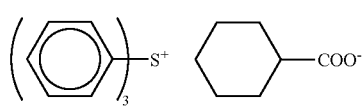

(B4-3)
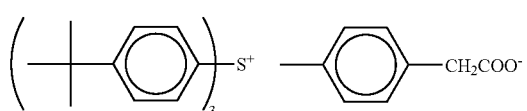

-continued (B4-4)
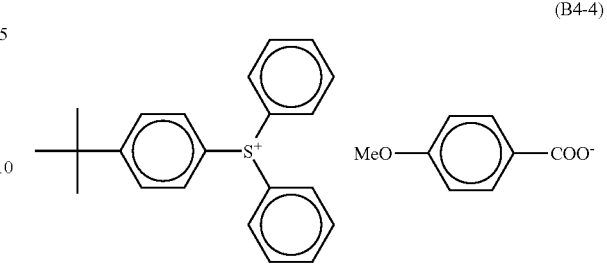

In Table 2 above, the abbreviations of other components indicate the following compounds, respectively.
D-1: Megafac F176 (manufactured by Dainippon Ink and Chemicals, Inc.) (fluorine-based)
D-2: Megafac R08 (manufactured by Dainippon Ink and Chemicals, Inc.) (fluorine- and silicon-based)
S-1: Methyl lactate
S-2: Propylene glycol monomethyl ether acetate
S-3: Propylene glycol monomethyl ether
N-1: Hexamethylenetetramine
N-2: 1,5-Diazabicyclo[4,3.0]-5-nonene
N-3: 1,8-Diazabicyclo[5.4.0]-7-undecene From the results shown in Table 2, it can be seen that the positive resist composition of the present invention exhibits the reduced development defect and scum and the wide defocus latitude.

The positive resist composition of the present invention is suitably used in microlithography processes, for example, in the production of VLSI or high capacity microchips, or in other photofabrication processes. Particularly, it can form a highly precise pattern using a vacuum ultraviolet ray of not longer than 200 nm as a light source for exposure.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A positive resist composition comprising (A) a resin containing at least one group that is decomposed by the action of an acid to generate an alkali-soluble group and (B) at least two compounds selected from (B1) a compound that generates an aliphatic or aromatic sulfonic acid substituted with at least one fluorine atom, (B2) a compound that generates an aliphatic or aromatic sulfonic acid that does not contain a fluorine atom, (B3) a compound that generates an aliphatic or aromatic carboxylic acid substituted with at least one fluorine atom and (B4) a compound that generates an aliphatic or aromatic carboxylic acid that does not contain a fluorine atom, as (B) a compound that generates an acid upon irradiation of an actinic ray or radiation, wherein the group that is decomposed by the action of an acid contained in the resin (A) includes a group represented by the following formula (Y):

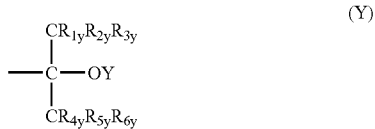

wherein $R_{1y}$ to $R_{6y}$ each independently represents a hydrogen atom, a fluorine atom, an alkyl group or a cycloalkyl group, provided that at least one of $R_{1y}$ to $R_{6y}$ represents a fluorine atom, an alkyl group substituted with a fluorine atom or a cycloalkyl group substituted with a fluorine atom; and Y represents a hydrogen atom or an organic group.

2. The positive resist composition as claimed in claim 1, wherein the component of (B) contains at least one compound of (B1) and at least one compound selected from (B2) to (B4).

3. The positive resist composition as claimed in claim 1, wherein the group that is decomposed by the action of an acid to generate an alkali-soluble group is a group represented by any one of groups represented by the following formulae (Z1) to (Z5):

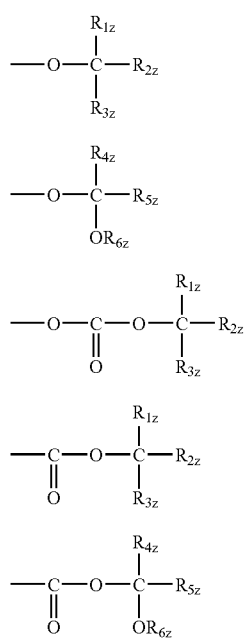

wherein $R_{1z}$ to $R_{3z}$ each independently represents an alkyl group, a cycloalkyl group, an alkenyl group, an aralkyl group or an aryl group; $R_{4z}$ and $R_{5z}$ each independently represents a hydrogen atom or an alkyl group; $R_{6z}$ represents an alkyl group, a cycloalkyl group, an alkenyl group, an aralkyl group or an aryl group; two of $R_{1z}$, $R_{2z}$, and $R_{3z}$ or two of $R_{4z}$, $R_{5z}$ and $R_{6z}$ may be combined with each other to form a cyclic structure; and at least one of $R_{1z}$, $R_{2z}$ and $R_{3z}$ or at least one of $R_{4z}$, $R_{5z}$ and $R_{6z}$ least one of the groups represented by Y as a substituent.

4. The positive resist composition as claimed in claim 3, wherein a carbon atom in the resin, to which the group represented by any one of formulae (Z1) to (Z5) is directly connected, is substituted with a fluorine atom, an alkyl group substituted with a fluorine atom or a cycloalkyl group substituted with a fluorine atom.

5. The positive resist composition as claimed in claim 3, wherein at least one of $R_{1z}$, $R_{2z}$ and $R_{3z}$ in any one of formulae (Z1), (Z3) and (Z4) or at least one of $R_{4z}$, $R_{5z}$, and $R_{6z}$ in any one of formulae (Z2) and (Z5) is a cycloalkyl group.

6. The positive resist composition as claimed in claim 3, wherein two of $R_{1z}$, $R_{2z}$, and $R_{3z}$ in any one of formulae (Z1), (Z3) and (Z4) or two of $R_{4z}$, $R_{5z}$ and $R_{6z}$ in any one of formulae (Z2) and (Z5) are connected with each other to form a cyclic structure.

7. The positive resist composition as claimed in claim 5, wherein the cycloalkyl group represented by any one of $R_{1z}$ to $R_{6z}$ or the cyclic structure formed by connecting two of $R_{1z}$, $R_{2z}$ and $R_{3z}$ in any one of formulae (Z1), (Z3) and (Z4) or two of $R_{4z}$, $R_{5z}$ and $R_{6z}$ in any one of formulae (Z2) and (Z5) is a cyclohexane structure, a bicyclo[2.2.1]heptane structure or a bicyclo[2.2.2]octane structure.

8. The positive resist composition as claimed in claim 3, wherein a repeating unit containing the group represented by any one of formulae (Z1) to (Z5) is a repeating unit represented by the following formula (Za), (Zb), (Zc), (Zd) or (Ze):

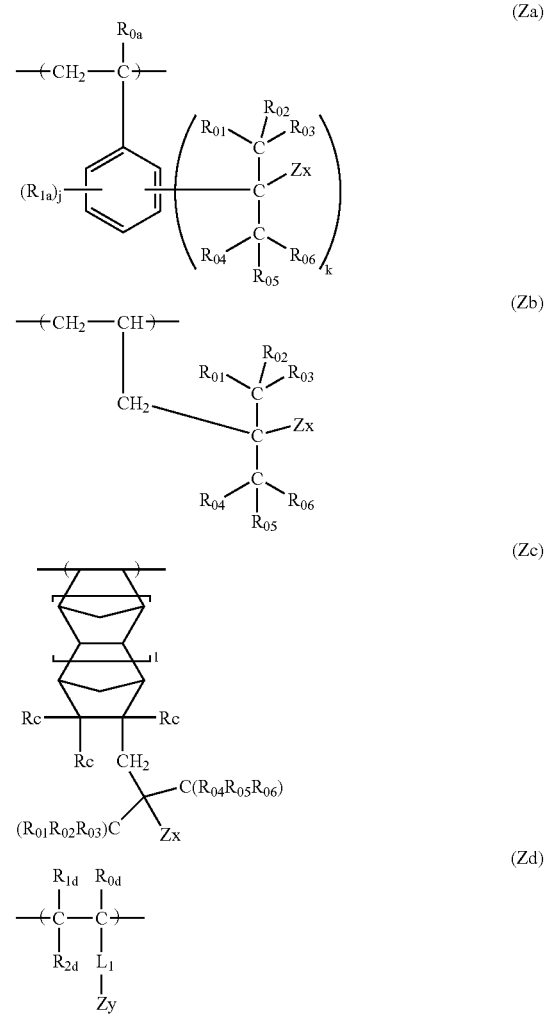

-continued

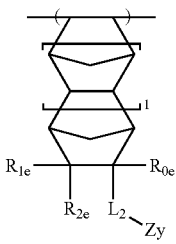
(Ze)

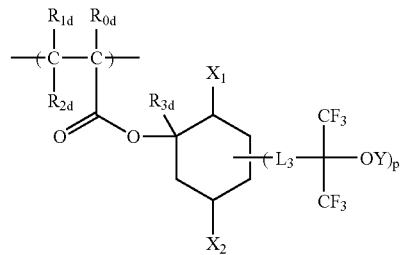
(Zd1)

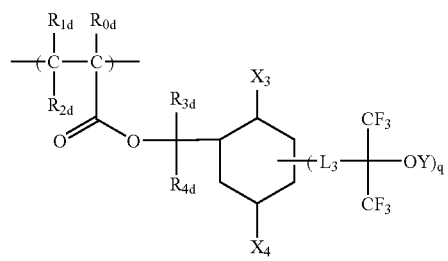
(Zd2)

wherein Zx represents a group represented by any one of formulae (Z1) to (Z3); Zy represents a group represented by any one of formulae (Z4) to (Z5);

in formula (Za), $R_{0a}$ represents a hydrogen atom, a halogen atom, a cyano group, an alkyl group or a cycloalkyl group; $R_{01}$ to $R_{06}$ each independently represents a hydrogen atom, a fluorine atom, an alkyl group or a cycloalkyl group, provided that at least one of $R_{01}$ to $R_{06}$ represents a fluorine atom, an alkyl group substituted with a fluorine atom or a cycloalkyl group substituted with a fluorine atom; $R_{1a}$ represents a hydroxy group, a halogen atom, a cyano group, an alkoxy group, an acyl group, an alkyl group, a cycloalkyl group, an alkenyl group, an aralkyl group or an aryl group; j represents an integer of from 0 to 4; k represents an integer of from 1 to 5, provided that the sum total of j and k is 1 to 5;

in formula (Zb), $R_{01}$ to $R_{06}$ have the same meanings as $R_{01}$ to $R_{06}$ in formula (Za) respectively;

in formula (Zc), $R_{01}$ to $R_{06}$ have the same meanings as $R_{01}$ to $R_{06}$ in formula (Za) respectively; l represents 0 or 1; $R_c$s each independently represents a hydrogen atom, a halogen atom, a cyano group, an alkyl group or a cycloalkyl group;

in formula (Zd), $R_{0d}$ to $R_{2d}$ each independently represents a hydrogen atom, a fluorine atom, a chlorine atom, a cyano group, an alkyl group substituted with a fluorine atom or a cycloalkyl group substituted with a fluorine atom; $L_1$ represents a single bond or a divalent connecting group; and in formula (Ze), $R_{0e}$ to $R_{2e}$ each independently represents a hydrogen atom, a halogen atom, a cyano group, an alkyl group or a cycloalkyl group; $L_2$ represents a single bond or a divalent connecting group; and l represents 0 or 1.

9. The positive resist composition as claimed in claim 3, wherein a repeating unit containing the group represented by formulae (Z4) or (Z5) is a repeating unit represented by the following formula (Zd1) or (Zd2):

wherein $R_{0d}$ to $R_{2d}$ each independently represents a hydrogen atom, a fluorine atom, a chlorine atom, a cyano group, an alkyl group substituted with a fluorine atom or a cycloalkyl group substituted with a fluorine atom; $R_{3d}$ and $R_{4d}$ each independently represents an alkyl group, a cycloalkyl group, an alkenyl group, an aralkyl group or an aryl group; Y represents a hydrogen atom or an organic group; $L_3$ represents a single bond or a divalent connecting group; $X_1$ and $X_2$ each independently represents a hydrogen atom, a halogen atom, a hydroxy group, an alkoxy group, a cyano group, an alkyl group or a cycloalkyl group; or $X_1$ and $X_2$ may be combined with each other to form —$CH_2$—, —$C_2H_4$— or —O—; $X_3$ and $X_4$ each independently represents a hydrogen atom, a halogen atom, a hydroxy group, an alkoxy group, a cyano group, an alkyl group or a cycloalkyl group; or $X_3$ and $X_4$ may be combined with each other to form —$CH_2$—, —$C_2H_4$— or —O—; and p and q each represents an integer of from 1 to 3.

10. The positive resist composition as claimed in claim 9, wherein $X_1$ and $X_2$ in formula (Zd1) or $X_3$ and $X_4$ in formula (Zd2) are combined with each other to form —$CH_2$—.

11. The positive resist composition as claimed in claim 1, which further comprises (E) an organic basic compound.

* * * * *